United States Patent [19]
Ichikawa

[11] Patent Number: 5,978,827
[45] Date of Patent: *Nov. 2, 1999

[54] ARITHMETIC PROCESSING

[75] Inventor: Takeshi Ichikawa, Hachioji, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/630,742

[22] Filed: Apr. 10, 1996

[51] Int. Cl.[6] ...................................... G06F 7/50
[52] U.S. Cl. ........................ 708/709; 708/626; 708/210
[58] Field of Search ............................... 364/786.04, 758, 364/715.09; 708/709, 626, 210

[56] References Cited

U.S. PATENT DOCUMENTS

| | | | |
|---|---|---|---|
| 3,524,977 | 8/1970 | Wang | 364/758 |
| 3,535,502 | 10/1970 | Clapper | 364/786.04 |
| 3,603,776 | 9/1971 | Weinberger | 364/715.09 |
| 3,636,334 | 1/1972 | Svoboda | 364/786.04 |
| 3,675,001 | 7/1972 | Singh | 364/786.04 |
| 3,723,715 | 3/1973 | Chen et al. | 364/786.04 |
| 3,795,880 | 3/1974 | Singh et al. | 364/758 |
| 3,950,636 | 4/1976 | Dao | 364/758 |
| 4,839,850 | 6/1989 | Noll et al. | 364/786.04 |
| 5,095,457 | 3/1992 | Jeony | 364/758 |

FOREIGN PATENT DOCUMENTS

| | | |
|---|---|---|
| 0020185 | 12/1980 | European Pat. Off. . |
| 0179568 | 4/1986 | European Pat. Off. . |
| 0442356 | 8/1991 | European Pat. Off. . |
| 2536922 | 6/1984 | France . |
| 2599526 | 12/1987 | France . |
| 2189630 | 10/1987 | United Kingdom . |
| 2244572 | 12/1991 | United Kingdom . |
| 9412928 | 6/1994 | WIPO . |

OTHER PUBLICATIONS

Alta Frequenza, vol. 45, No. 10, Oct. 1976, Milano IT, pp. 349–356, XP002007107, L. Dadda: "Some Schemes for Parallel Multipliers".

IEEE Transactions on Computers, vol. 26, No. 10, 1977, New York US, pp. 948–957, XP002007108, W. Stenzel, et al., "A Compact High–Speed Parallel Multiplication Scheme".

IBM Technical Disclosure Bulletin, vol. 24, No. 3, Aug. 1981, New York US, pp. 1713–1716, XP002007109, R. Hitchcock, Sr.: "Fast Multiply Circuit".

Proceedings of the 7th IEEE Symposium on Computer Arithmetic, Jun. 4–6, 1985, IEEE Computer Society Press, Loss Alamitos CA US, pp. 16–19, XP002007110, H. Kobayashi: "A Multioperand Two's Complement Addition Algorithm".

Rubinfield, L., IEEE Trans. on Computers, C24, 10, 1975, pp. 1014–1015, "Proof of the Modified Booth's Algorithm for Multiplication".

Hanyu et al. Proc. IEEE Int. Symp. on MVL, May 1994, pp. 19–26, "Multiple–Valued Current–Mode MOS Integrated Circuits Based on Dual–Rail Source–Coupled Logic".

Wallace, C., IEEE Trans. on Elec. Computers, EC–13, 1, 1964, pp. 14–17, "A Suggestion for a Fast Multiplier".

Primary Examiner—David H. Malzahn
Attorney, Agent, or Firm—Fitzpatrick, Cella, Harper & Scinto

[57] ABSTRACT

In a processor for performing operations including an addition of a plurality of multiple bit data, values on common places of a plurality of multiple bit data are entered in parallel into number detectors set for respective places, the number of the high signals in the input values is output in the binary notation, and outputs from a plurality of NDs are added by full adders to execute a high speed operation without carries. In addition, values with no common places are integrated into single data before being added.

44 Claims, 42 Drawing Sheets

A(B+C)(D+E)+C(B+E)(A+D)+E(A+B)(C+D)

FIG. 41A PRIOR ART
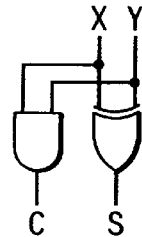
FIG. 41B PRIOR ART
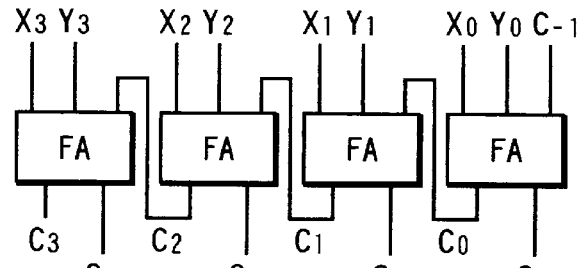
(FA : FULL ADDER)
FIG. 41C PRIOR ART
| INPUT | | | OUTPUT | |
|---|---|---|---|---|
| X | Y | $C_{i-1}$ | S | $C_i$ |
| 0 | 0 | 0 | 0 | 0 |
| 0 | 1 | 0 | 1 | 0 |
| 1 | 0 | 0 | 1 | 0 |
| 1 | 1 | 0 | 0 | 1 |
| 0 | 0 | 1 | 1 | 0 |
| 0 | 1 | 1 | 0 | 1 |
| 1 | 0 | 1 | 0 | 1 |
| 1 | 1 | 1 | 1 | 1 |
$S = C_{i-1} \oplus (X \oplus Y)$
$C_i = X * Y + Y * C_{i-1} + C_{i-1}$
FIG. 41D PRIOR ART
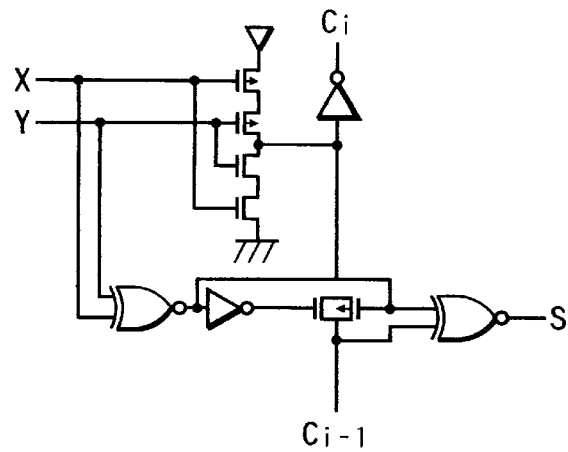

$X_i Y_j = P_{ij}$

ARITHMETIC PROCESSING

BACKGROUND OF THE INVENTION

1. Field of the Invention

The present invention relates to a processor such as a semiconductor device for executing operations of addition and multiplication, its operation method used in the device, and a data processor in which the processor is used.

2. Related Background Art

In recent years, operation speeds of adders or multipliers are significantly increased with remarkable developments of semiconductor manufacturing technology due to micronization and semiconductor circuit technology including algorithms. Their arithmetic processing is used for every kind of semiconductor devices including a field of a central processing unit (CPU) or a digital signal processor (DSP). More the technologies develop, however, this arithmetic processing is required to have a higher performance, that is, a higher speed.

Particularly in fields requiring image processing in a multi-media age and a tremendous amount of calculations such as matrix operations, high-speed processing is required; in particular, the processing of an adder or a multiplier is one of the most important processing for determining its performance and it is required to be performed in higher speed.

As an example of an adder in the present operation method, an explanation is given below for an adder described in "Design of CMOS VLSI" (Supervised by Takuo Sugano, Baifukan).

For an addition of two binary numbers, assuming that X and Y indicate the binary numbers, S indicates a sum of X and Y, and C indicates a carry, there are the following four types of calculations if X and Y each have a single place:
When X=0 and Y=0, S=0 and C=0.
When X=0 and Y=1, S=1 and C=0.
When X=1 and Y=0, S=1 and C=0.
When X=1 and Y=1, S=0 and C=1.

If the sum S and the carry C are expressed by logical expressions considering the above as a truth table, expressions S=X+Y and C=X Y are obtained. They can be achieved in a two-input two-output circuit based on a single exclusive OR and a single AND as shown in FIG. 41A. A circuit having this function is called a half adder.

If the binary numbers each have multiple places, in other words, if they have a bit width of two or more bits each, it is required to perform processing of a carry signal from a lower place. Accordingly, the processing needs a circuit in which three binary numbers, $X_i$, $Y_i$, and $C_{i-1}$ can be added for a place. This three-input two-output circuit is called a full adder. FIG. 41C shows a truth table and a logical expression representing its operation. A circuit for performing an addition of any number of places can be obtained by arranging the required number of full adders and connecting them so that a carry signal of a lower adder is entered into an upper adders. It is called a ripple carry adder. An example formed as a four-bit adder is illustrated in FIG. 41B. Although there are a variety of circuitry for a single-bit full adder which correctly reflect the action of the truth table in FIG. 41C, there is a point for designing with a purpose of a high-speed operation not in creating a sum signal, but in transmitting a carry signal entered from a lower place to an upper place as speedily as possible. FIG. 41D shows an example of full adders designed from this viewpoint.

If the number of the places is increased to, for example, 16 bits, there is a limitation on speed-up achieved by an improvement in an individual full adder and therefore, the speed-up must be achieved by the entire 16-bit adder. Since the operation speed of the adder is regulated by a carry transmission speed as mentioned above, the speed-up can be achieved if a carry signal of the adder itself can be determined without awaiting a carry signal from a lower adder.

A carry signal for all places can be created only from an input value of the own place and a carry signal of the lowest place. It is called carry look ahead (CLA). An example of a circuit to which this method is applied (CLA circuit) is shown in FIG. 42A. In FIG. 42A, HA indicates a half adder in FIG. 42B, and a part enclosed by a dotted line is achieved by a CMOS circuit in FIG. 42C.

At the actual implementation in the circuit, mostly the carry signal for all places is not created in CLA taking into consideration the hardware amount or an efficiency, but the carry signal is transmitted by using CLA for each block such as, for example, a block consisting of 4 bits and the carry signal is transmitted by using a ripple within each block (block CLA). An example of a 16-bit adder in this method is illustrated in FIG. 43.

A subtraction is achieved by adding a 2's complement of a subtracter to a minuend by using the adder.

Also in the above methods, however, it is not easy to achieve further speedy operations against an increase of operands since both the number of elements and the operation time are increased significantly with an increase of the number of the operands.

For example, parallel six stages of add operations can be performed as shown in FIG. 44 for a speedy operation when 63 pieces of data are totally added, but 62 full adders are required. On the other hand, the operation can be performed only by a single full adder as shown in FIG. 45 if the number of the elements are decreased, but addition must be performed 62 times sequentially.

Then, a parallel multiplier is briefly described below as an example of a multiplier in the present operation method.

In a multiplication of (n×n) bits, a partial product is obtained as follows:

$$\sum_{i=0}^{n-1} 2^{i+j} P_{ij} \quad (J = 0, 1, \dots, n-1)$$

where the partial product is a result of multiplying the following multiplicand by a single bit $2_j Y_j$ (J=0, 1, ..., n-1) of a multiplicator Y:

$$X = \sum_{i=0}^{n-1} 2^i X_i$$

Since there are only 0s and 1s in binary numbers, $P_{ij}$ is always 0 when $Y_j$ is 0, and each bit of $P_{ij}$ equals each bit of $X_i$ when $Y_j$ is 1. Accordingly, the partial product can be obtained by taking AND between each bit of the multiplicand and a bit of the multiplicator. By adjusting the places of the created partial products according to weights of multiplicator bits and adding them each other, the following multiplication result can be obtained:

$$\sum_{j=0}^{n-1}\sum_{i=0}^{n-1} 2^{i+j} P_{ij}$$

The most fundamental parallel multiplier can be achieved by arranging hardware (AND gate) for creating partial products in the above and a circuit for adding partial products in an array and connecting them. A parallel multiplier of 8 bits×8 bits is shown as an example in FIG. 46. As shown in this drawing, the parallel multiplier includes a full adder 301, a half adder 302, and an AND gate 303.

As shown in this example, in a multiplication for (n×n) bits, the partial products are easily and speedily calculated in $n^2$ AND gates and an addition step for adding the partial products regulates the operation speed. Therefore, increasing the speed of the addition step for the partial products is a key to the speed-up of a multiplier.

As improvement methods, there are a carry save adder method in which it is possible to remove the need of transmitting a carry signal in the own stage by transmitting a carry signal of an addition stage for the partial products to an adder in the next addition stage, a Wallace-tree method (Wallace, C., IEEE Trans. on Electronic Computers, EC-13, 1, 1964, pp.14–17) for performing an addition step in the same place in parallel, and a method in which a Booth algorithm (Rubinifield, L., IEEE Trans. on Computers, C24, 10, 1975, pp.1014–1015) is used to decrease the number of the created partial products, to increase the speed of the operation.

In the above methods, however, both the number of the elements and the operation time are significantly increased with an increase of the number of the bits and it is not easy to further increase the speed against the tendency of increasing the bits. Accordingly, a multiplier to which a multivalued logic is applied is reported recently (T. Hanyu et al. Proc. IEEE Int. Symp. on MVL, pp.19–26, May (1994), November 1993). It, however, does not come to be put to practical use in the present conditions.

SUMMARY OF THE INVENTION

It is an object of the present invention to provide a processor which performs high-speed operations with a few elements, its method, and a data processor, solving the above technical problems.

It is another object of the present invention to reduce the number of the required elements and to lower the power consumption in a processor and a data processor with increasing the operation speed.

It is another object of the present invention to increase the operation speed by removing the transmission of carry signals in an addition.

It is still another object of the present invention to reduce the amount of data to be added by reorganization of data to increase the operation speed and to reduce the number of the elements required for operations.

It is another object of the present invention to increase the processing speed by executing operations in parallel.

According to one aspect, the present invention which achieves these objectives relates to a processor for adding a plurality of multiple bit data comprising first addition means for adding data together on common places of the plurality of multiple bit data and second addition means for calculating a sum of the addition results obtained by the first addition means.

According to another aspect, the present invention which achieves these objectives relates to a processor for multiplying a plurality of multiple bit data comprising a partial product creation means for creating partial products of respective single bits of the plurality of multiple bit data, first addition means for adding data together on common places of a plurality of partial products created by the partial product creation means, and second addition means for calculating a sum of the addition results obtained by the first addition means.

According to still another aspect, the present invention which achieves these objectives relates to an operation method for adding a plurality of multiple bit data comprising a first addition step for adding respective places independently and a second addition step for calculating a sum of the addition results obtained by the first addition step.

According to yet another aspect, the present invention which achieves these objectives relates to an operation method for multiply a plurality of multiple bit data comprising a partial product creation step for creating a partial product of respective single bits of the plurality of multiple bit data, a first addition step for adding data together on common places of a plurality of partial products created by the partial product creation step, and a second addition step for calculating a sum of the addition results obtained by the first addition step.

According to another aspect, the present invention which achieves these objectives relates to input means for entering data, storing means for storing data, processing means for processing data stored in the storing means and data entered by the input means in a specified processing procedure and output means for outputting processing results of the processing means, wherein the processing means include a first addition means for adding data together on common places of a plurality of multiple bit data and a second addition means for calculating a sum of the addition results obtained by the first addition means and execute an addition of a plurality of multiple bit data.

Other objectives and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIGS. 41A to 41D are drawings for explanation of a conventional adder;

DETAILED DESCRIPTION OF THE PREFERRED EMBODIMENTS

This invention will be described in detail below by using the accompanying drawings.

[1st Embodiment]

According to this embodiment, an addition method of a plurality of multiple bit data will be described by using an operation of adding seven 8-bit data sequences as an example.

Figure 1:
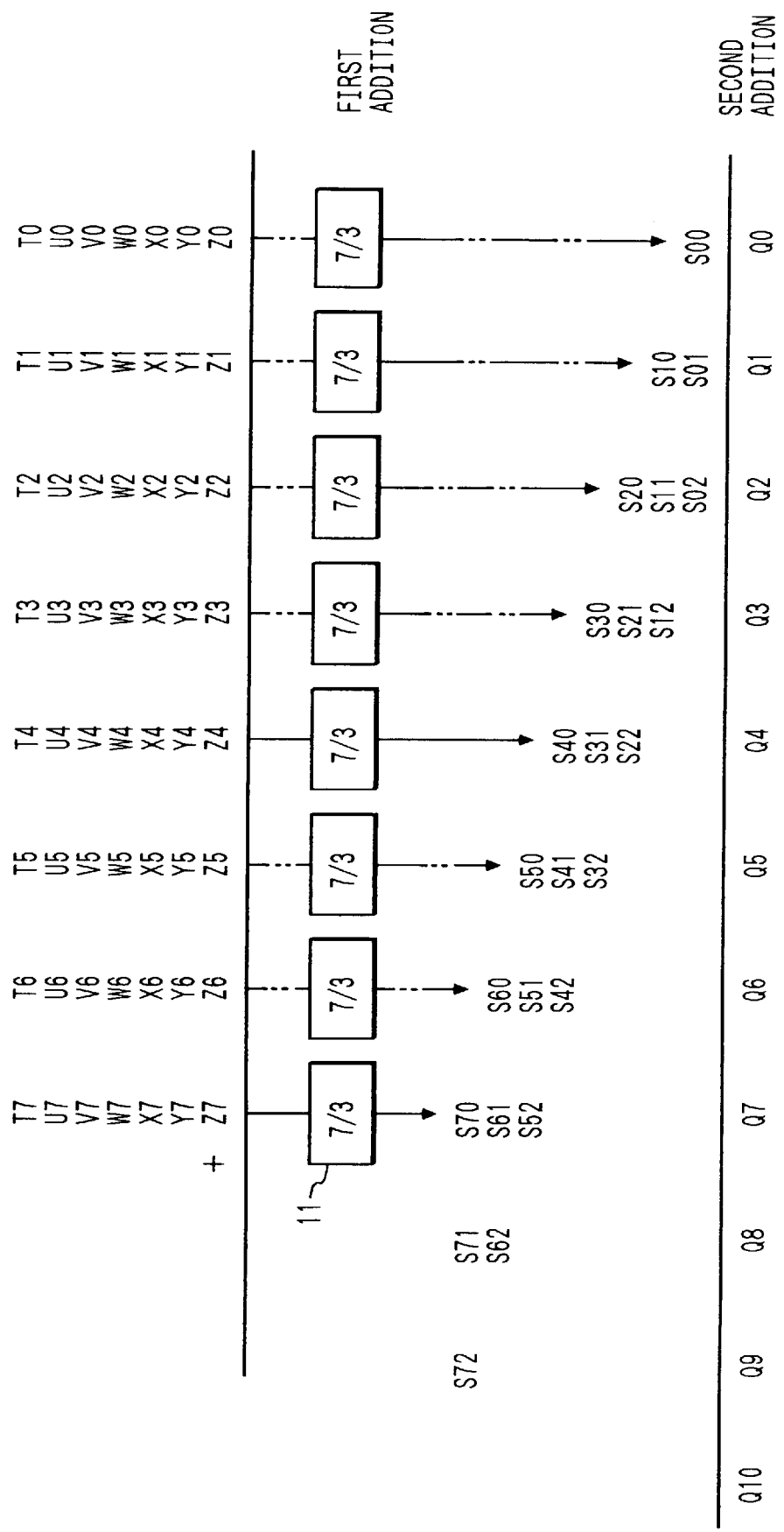
FIG. 1 is a drawing illustrating an adder of the 1st embodiment.

Referring to FIG. 1, this embodiment is shown. To add seven 8-bit data sequences in this embodiment, a first addition step is performed by adding seven 8-bit data sequences on respective places together first. The structure of this addition is described later in detail, and the calculation is made by using block 11 having a function of outputting how many data is high during an n input in a binary mode. (It is indicated by S(pq) in FIG. 1.)(p: Weight of places, q: Weight of places in S).

Hereinafter, block 11 having this function is called Number Detector and abbreviated to ND. In FIG. 1, an ND11 block is represented by a box. The number in each box indicates the number of the inputs (In) and the number of the outputs (Out) in the left and right sides of a slash (/), respectively. The number of the outputs is determined by the number of the inputs and expressed by Out=[$\log_2$(In)], where [a] is a minimum integer Z which is greater than a.

According to this embodiment, an operation speed is determined by a speed of an ND which is the slowest in all NDs for processing the first addition step in parallel. Since the operation speed is always the same here, it is determined by an operation speed of one ND. In this embodiment, a data sequence has 8 bits and eight NDs are used. The maximum seven inputs are made to the NDs here due to an operation of adding seven 8-bit data sequences.

Since a carry occurs in a general operation of an addition, the operation speed is lowered by the carry propagation. This embodiment, however, has a feature of adding data together by performing an addition without a carry in parallel, so that it is possible to increase the operation speed. Although this embodiment shows an example of adding seven 8-bit data sequences only, it is to be understood that the invention is not limited to this example and various numbers of the bits are allowed in the plurality of multiple bit data.

After that, a desired addition result Q can be obtained in a high speed by executing a second addition step for adding all of eight addition results represented in a binary mode.

Figure 2:
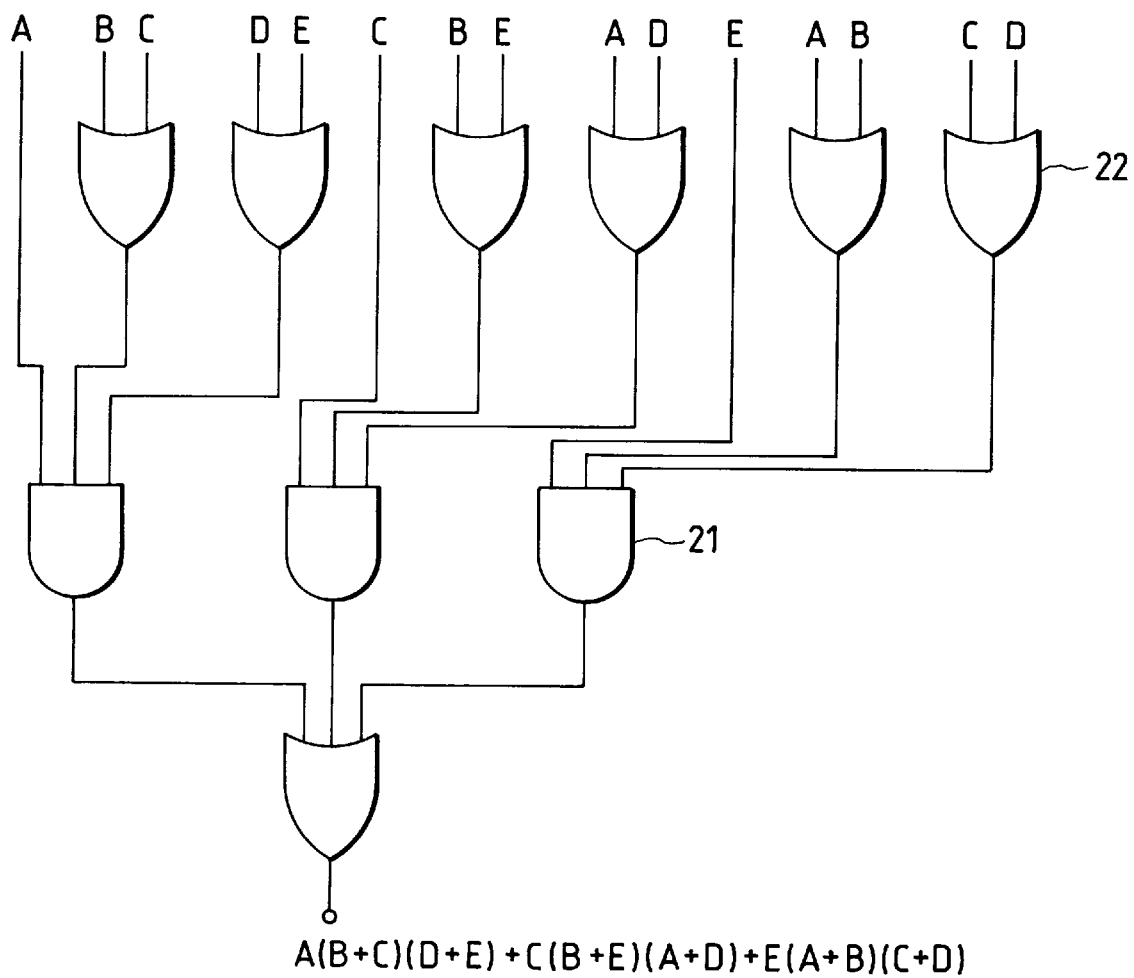
FIG. 2 is a drawing illustrating a majority logic circuit of the 1st embodiment.

The above ND is described below. First, a circuit diagram of a five-input (A, B, C, D, and E) majority logic circuit is shown in FIG. 2. The five-input majority logic circuit has a logic in which High is output when three or more inputs are High in five inputs. In the Boolean Algebra notation, it is represented by A(B+C)(D+E)+C(B+E)(A+D)+E(A+B)(C+D), and it can be easily formed by a CMOS circuit made of AND21 and OR22. Although five inputs are used here, it is apparent that it can be expanded to a general n inputs.

Figure 3A:
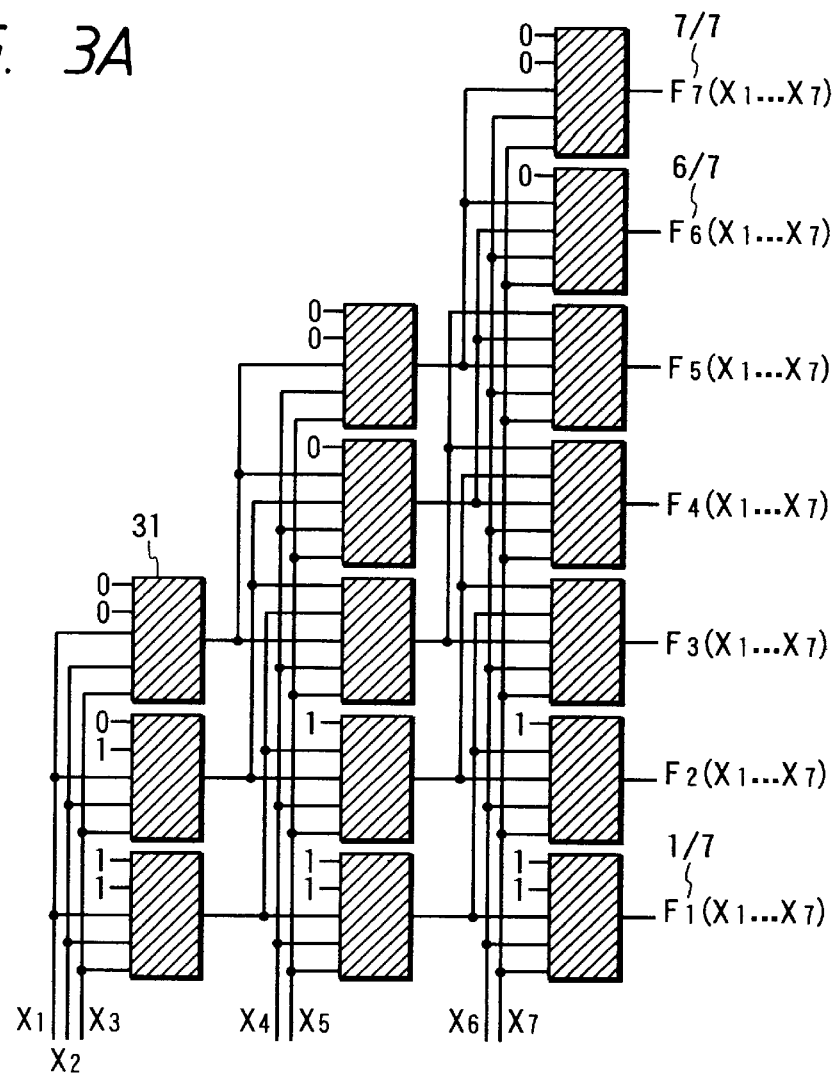
FIGS. 3A and 3B are drawings illustrating an ND.

Referring to FIG. 3A, it shows a circuit for determining whether n bits are true in m bits by using a plurality of five-input majority logic circuits 31, where output $F_j(X_1 \ldots X_7)$ indicates that High is output when the number of the inputs is equal to or greater than i.

Figure 3B:
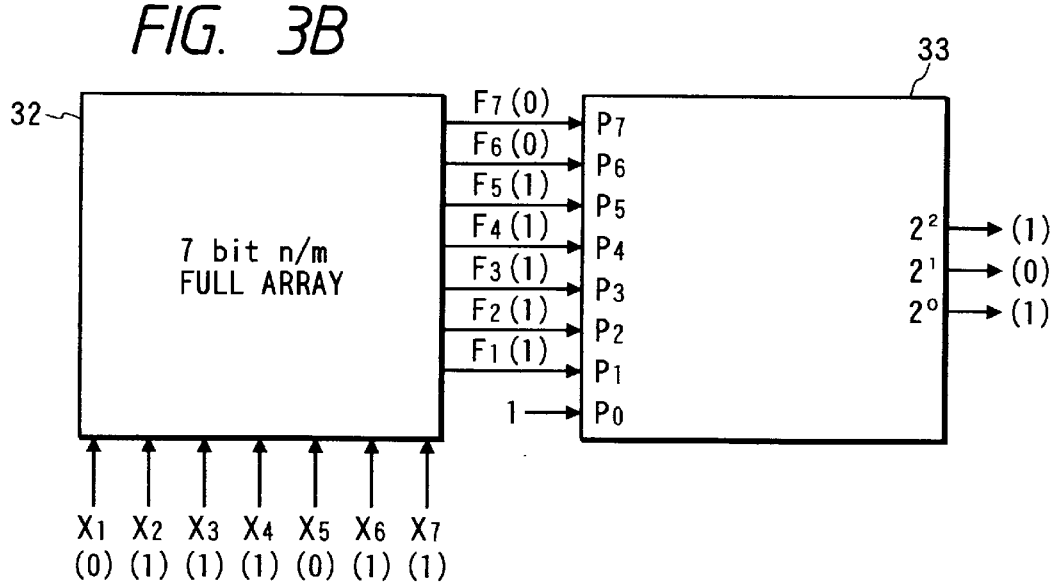

FIG. 3B shows a circuit which serves as an ND by connecting an output of an array 32 corresponding to the circuit in FIG. 3A with a circuit 33 for changing the output data to binary codes of 3-bit binary numbers. In this embodiment, an output example is shown assuming that 5 bits are true in 7 bits. Although an ND containing a CMOS circuit is explained here as an ND example, the invention is not limited to it and a circuit having the above ND function can be used.

[2nd Embodiment]

In this embodiment, there is provided an example of increasing the speed of the second addition step to increase the operation speed of the addition in the first embodiment.

Figure 4:
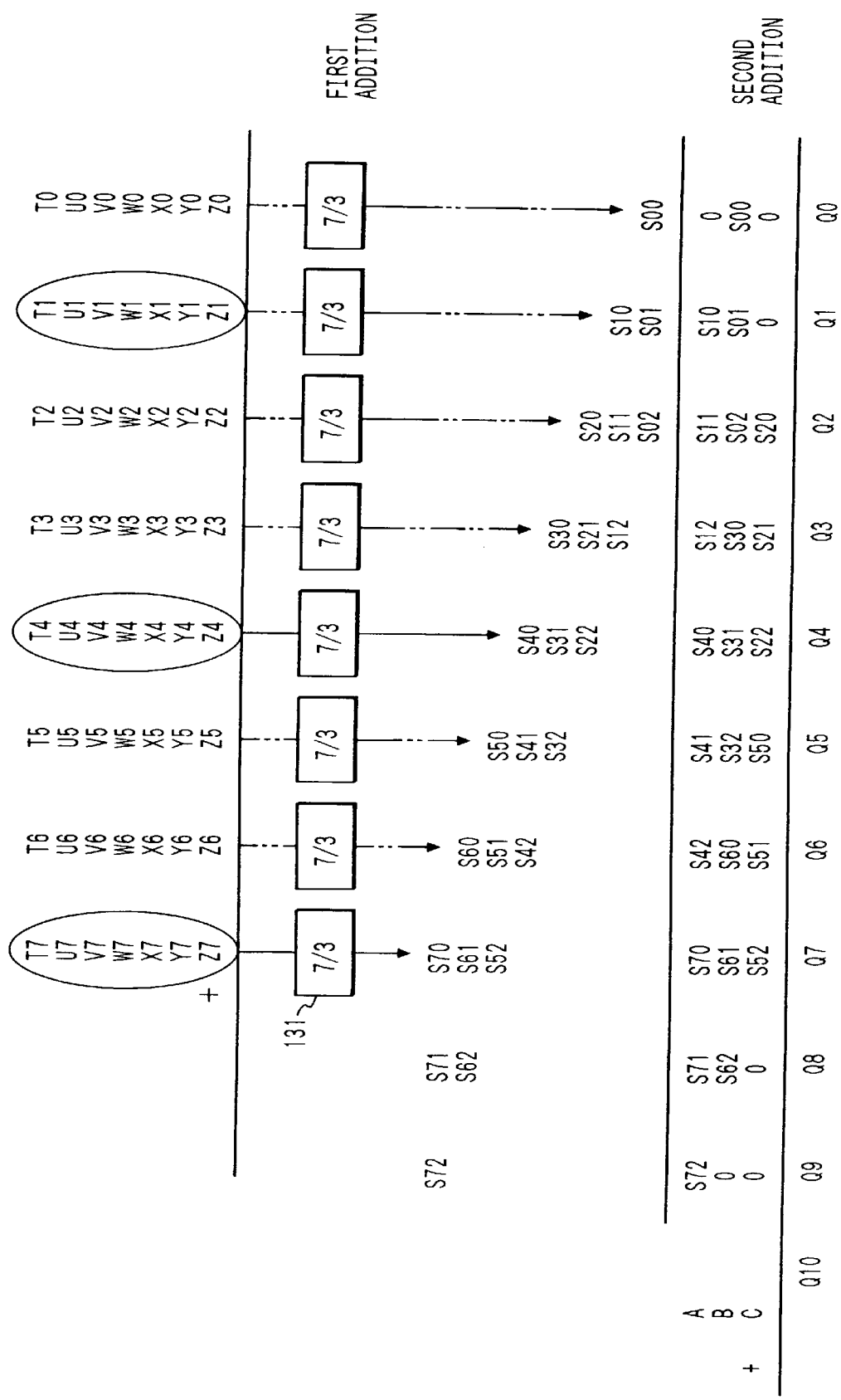
FIG. 4 is a drawing illustrating an adder of the 2nd embodiment.

Referring to FIG. 4, it shows a configuration of an adder of this embodiment. As shown in this drawing, the results of the addition with no common places can be integrated into one 10-bit data sequence out of 3-bit output data obtained by the ND in the first embodiment. It will be described below by using the example in FIG. 4.

In this drawing, the 3-bit output data on places enclosed by an elliptic frame can be integrated into 10-bit data sequence A since they have no common places (There are places which do not have a value when three addition results are integrated, and they are set to 0. In this example, the first place is set to 0.). It is important that no operation is performed in this processing with only wiring as processing in the circuit though it is treated as a step on its algorithm.

Figure 5:
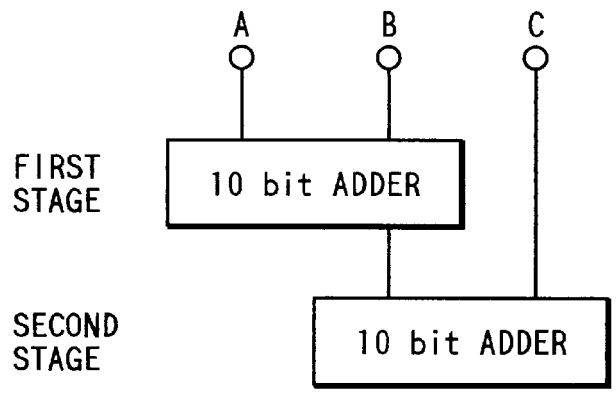
FIG. 5 is a drawing illustrating an adder for performing the second addition step of the 2nd embodiment.

In this step, eight results of the addition can be converted to three 10-bit data sequences. A delay time is so short that it can be ignored in comparison with other steps. In the end, by adding three 10-bit data sequences, a final operation result can be obtained. Since three 10-bit data sequences are used in the example of FIG. 4, a final result of the addition can be obtained by a passage of full adders in only two stages as shown in FIG. 5 and a plurality of multiple bit data can be added at a high speed.

Next, this embodiment is described below for a general operation in which max. n-bit data sequences are added by m pieces. The result of addition output from n NDs has max. $[Log_2 m]$ bits, therefore, it can be converted to max. $[Log_2 m]$ $(n+[Log_2 m])$ bit data sequences. In the end, by adding $[Log_2 m]$ $(n+[Log_2 m])$ bit data sequences, a final operation result can be obtained. The number of full adder passage stages can be expressed by $\lfloor Log_2[Log_2 m] \rfloor$, where $\lfloor a \rfloor$ is a minimum integer Z which is greater than or equal to a. From the above expression, the number of full adder passage stages can be kept to be low even if the number of the multiple bit data sequences becomes higher.

[3rd Embodiment]

In this embodiment, multiplication of multiple bit data will be explained. Although it is described by giving an example of an 8×8 bit multiplier below, it can be expanded to a general m×n bit multiplication.

Assume that X×Y=Q where $X(X_7 X_6 X_5 X_4 X_3 X_2 X_1 X_0)$ is a multiplicand and $Y(Y_7 Y_6 Y_5 Y_4 Y_3 Y_2 Y_1 Y_0)$ is a multiplicator. Since the maximum value is $2^8-1$ in a decimal number for both X and Y, expression $Q<(2^8-1)^2<2^{16}-1$ is obtained and Q is expressed with maximum 16 bits. For m×n bits, expression $Q<(2^m-1)(2^n-1)<2^{m+n}-1$ is obtained and Q is expressed with maximum m+n bits.

Figure 7:
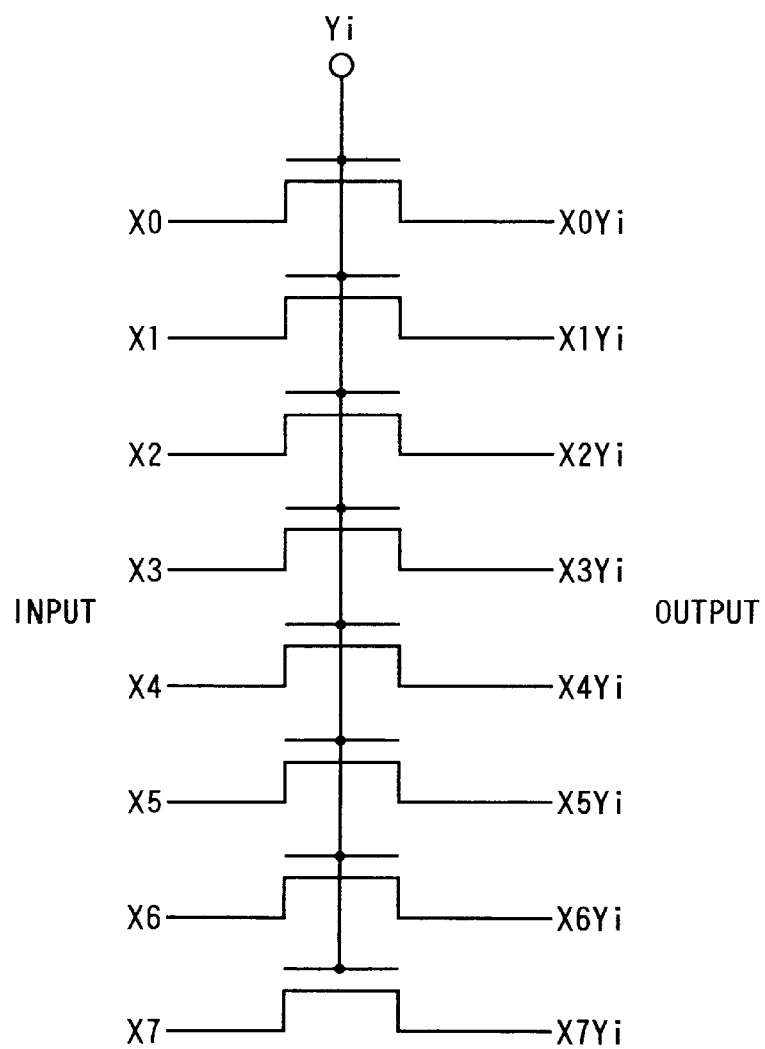
FIG. 7 is a drawing illustrating a partial product creation circuit of the 3rd embodiment.
Figure 6:
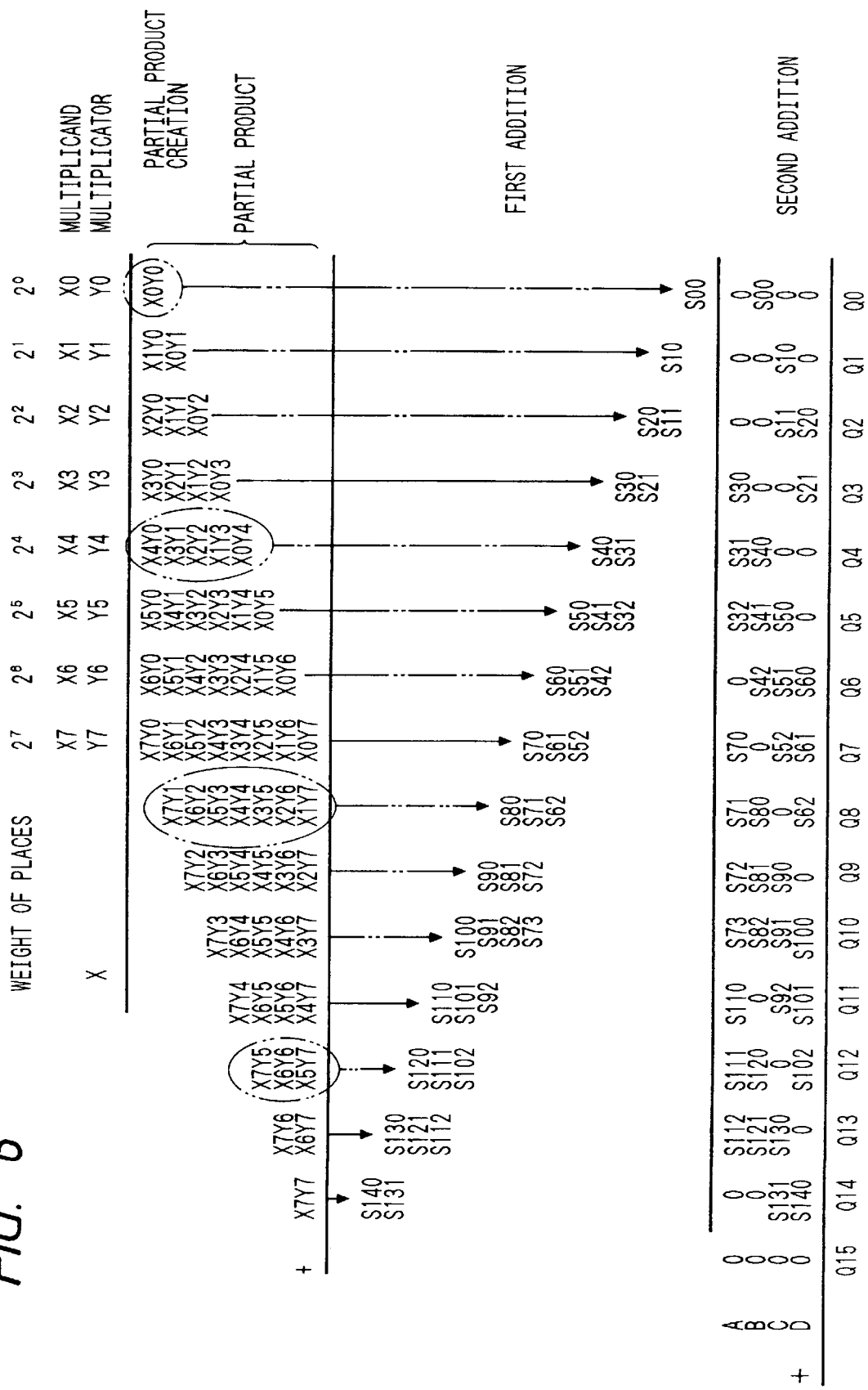
FIG. 6 is drawing illustrating an adder of the 3rd embodiment.

As shown in FIG. 6, a partial product $X \times Y_j$ is created first. Although a partial product can be calculated by taking AND between each bit $X_i$ of a multiplicand X and a multiplicator $Y_j$ like a general CMOS multiplier, just an nMOS transistor having a common gate electrodes is used for a simple explanation as shown in FIG. 7 in this embodiment. In addition, although an nMOS transistor is used as an example, it is apparent that other transmission gate MOS transistors can be used.

Preferably, $X_i$ should be set to Low(0) and $Y_j$ to High(1) in an initial state and all of the outputs should be set to 0. Then, $X_i$ is entered after setting $Y_j$ to a Low state. At an operation, High(1) or Low(0) is entered in $Y_j$ in this state. In other words, when $Y_j$ is set to high, a high signal is entered in a gate electrode and the nMOS transistor is turned on to generate the following 8-bit data sequence:

$X \times Y_j = (X_7 Y_j, X_6 Y_j, X_5 Y_j, X_4 Y_j, X_3 Y_j, X_2 Y_j, X_1 Y_j, X_0 Y_j)$
$= X(X_7, X_6, X_5, X_4, X_3, X_2, X_1, X_0)$.

When $Y_j$ is set to Low(0), a Low signal is entered in the gate electrode, therefore, the nMOS transistor is turned off and an 8-bit data sequence (0, 0, 0, 0, 0, 0, 0, 0) is created in the initial state. This makes it possible to form an AND circuit for X×Y in a size smaller than a general AND circuit. A general AND circuit, however, can be used for it.

Then, data on respective places of partial products in FIG. 6 is added together by an ND for each place. Since the addition is performed in parallel in this step, it is suitable for a high speed operation. (m+n−1) NDs are used in an m×n-bit multiplier circuit. The maximum number of inputs entered to NDs is Min(m,n). As shown in FIG. 6, 15 units of the NDs are used in the example of the 8×8-bit multiplier. Maximum eight inputs are made (Operation $X_7 Y_0 + X_6 Y_1 + X_5 Y_2 + X_4 Y_3 + X_3 Y_4 + X_2 Y_5 + X_1 Y_6 + X_0 Y_7$ is performed).

The number of the NDs is applied when NDs are used for locations where NDs can be replaced by wiring in one-input one-output arrangement. If the replaceable NDs are omitted, (m+n−3) NDs are used. Further, if NDs are used only for three or greater inputs excluding the locations where NDs can be replaced by two-input two-output HAs (although an HA is a kind of an ND, it is distinguished from an ND), (m+n−5) NDs can be used.

Figure 8:
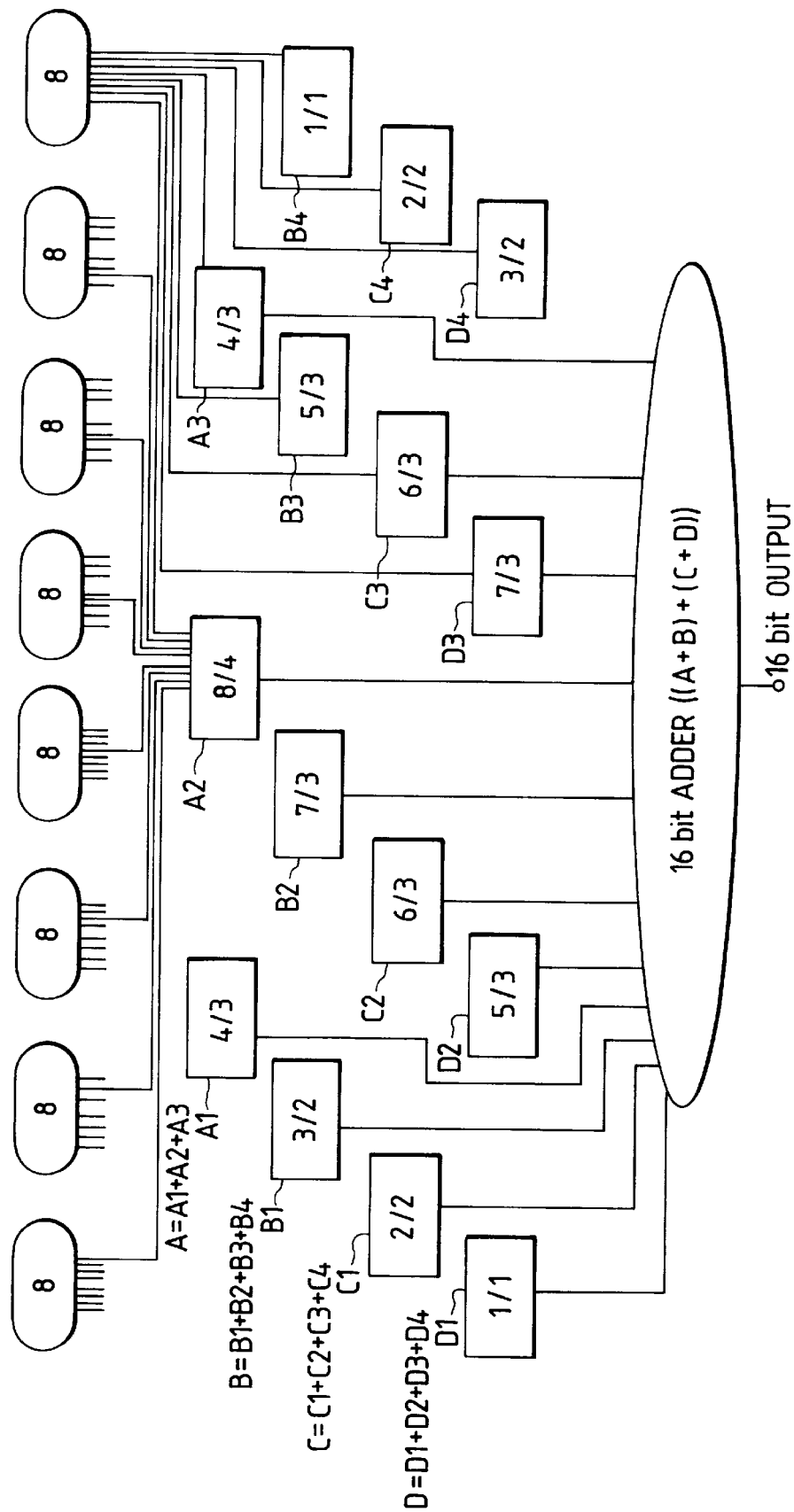
FIG. 8 is a drawing illustrating a multiplier of the 3rd embodiment.

Generally, for three or greater inputs, an additive operation becomes complicated and the operation speed is lowered due to propagation of carries which may occur particularly in this state. Since this embodiment has a feature of performing an operation without carries by adding data together, a high speed operation can be performed. FIG. 8 is a block diagram of a drawing in FIG. 6. For simplification, a partial product formation unit is omitted as an input unit. The partial product formation unit can be replaced by an AND circuit. In this drawing, an ND is represented by a box.

By performing a second addition step for adding all of (m+n−1) addition results indicated in a binary mode after that, desired multiplication result Q is obtained at a high speed.

Further to reduce the number of the additive operations, the next operation method is introduced in the same manner as for the second embodiment.

In other words, the addition results output from (m+n−1) NDs have maximum $[Log_2(Min(m,n))]$ bits, therefore, only a part of places are used in the (m+n) bits of the final multiplication result Q each. In the example of FIG. 6, an output from an MD has maximum four bits and the final multiplication result has 16 bits. Accordingly, addition results with no common places can be integrated into one (m+n)-bit data sequence out of the addition results output from (m+n−1) NDs.

The above operation is explained by using the example in FIG. 6. Since the addition results output from NDs on the places enclosed by ellipses do not have common places, they can be integrated into a 16-bit data sequence, B (If there is no value in a place when four addition results from NDs, zero is set to it. In this example, zero is set to places 2 to 4, 8, 12, 15, and 16.). It is important that no operation is performed in this processing with only wiring as processing in the circuit though it is treated as a step on its algorithm.

In this step, (m+n−1) results of the addition can be converted to $[Log_2(Min(m,n))]$ (m+n)-bit data sequences. A delay time is so short that it can be ignored in comparison with other steps. In the end, by adding $[Log_2(Min(m,n))]$ (m+n)-bit data sequences, a final operation result can be obtained.

Figure 9:
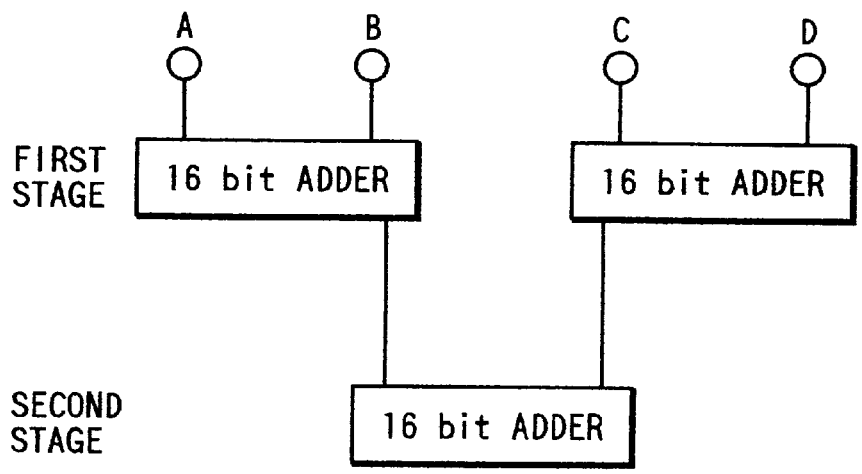
FIG. 9 is a drawing illustrating an adder of the 3rd embodiment.

Since four 16-bit data sequences are used in the examples of FIGS. 6 and 8, a final result of the product can be obtained by a passage of full adders in only two stages as shown in FIG. 9. In general, the number of full adder passage stages can be expressed by $\lfloor log_2[Log_2(Min(m,n))] \rfloor$ by using the same symbol as for the second embodiment.

Figure 10:
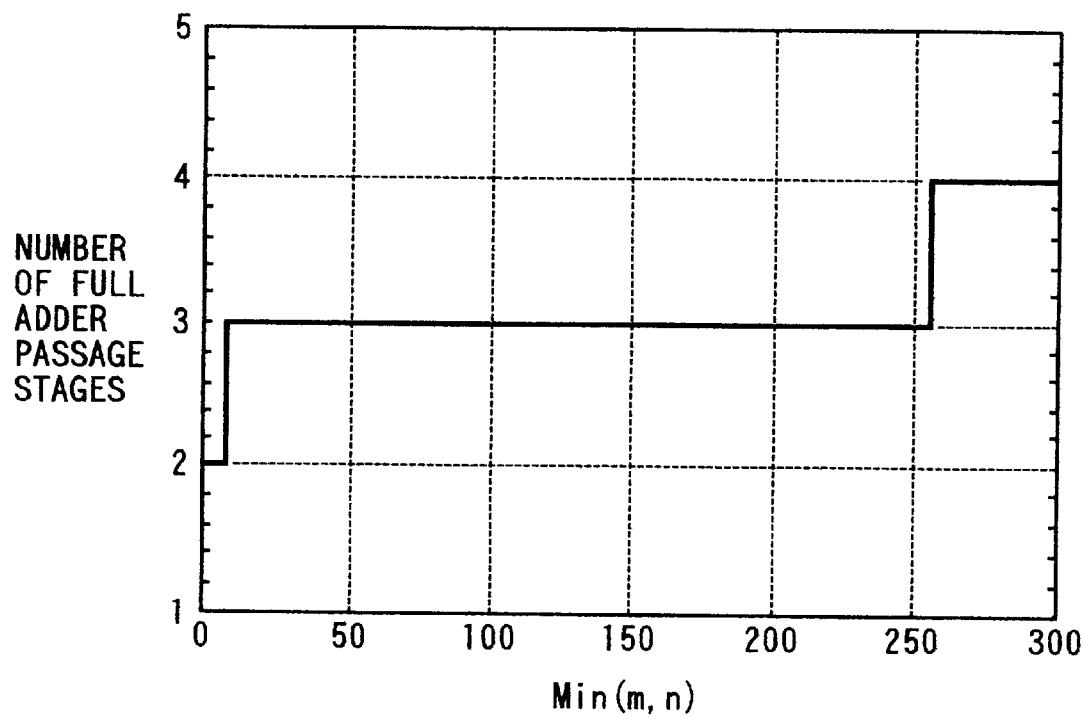
FIG. 10 is a drawing illustrating the number of full adder passage stages of the 3rd embodiment.

Referring to FIG. 10, there is shown a graph with an abscissa of Min(m,n) and an ordinate of the number of full adder passage stages. As shown in this graph, even if m and n are increased, the number of full adder passage stages can be kept to be low since the number of full adder passage stages takes log twice. In other words, the high speed operation is kept even if the number of the bits is increased.

Figure 11:
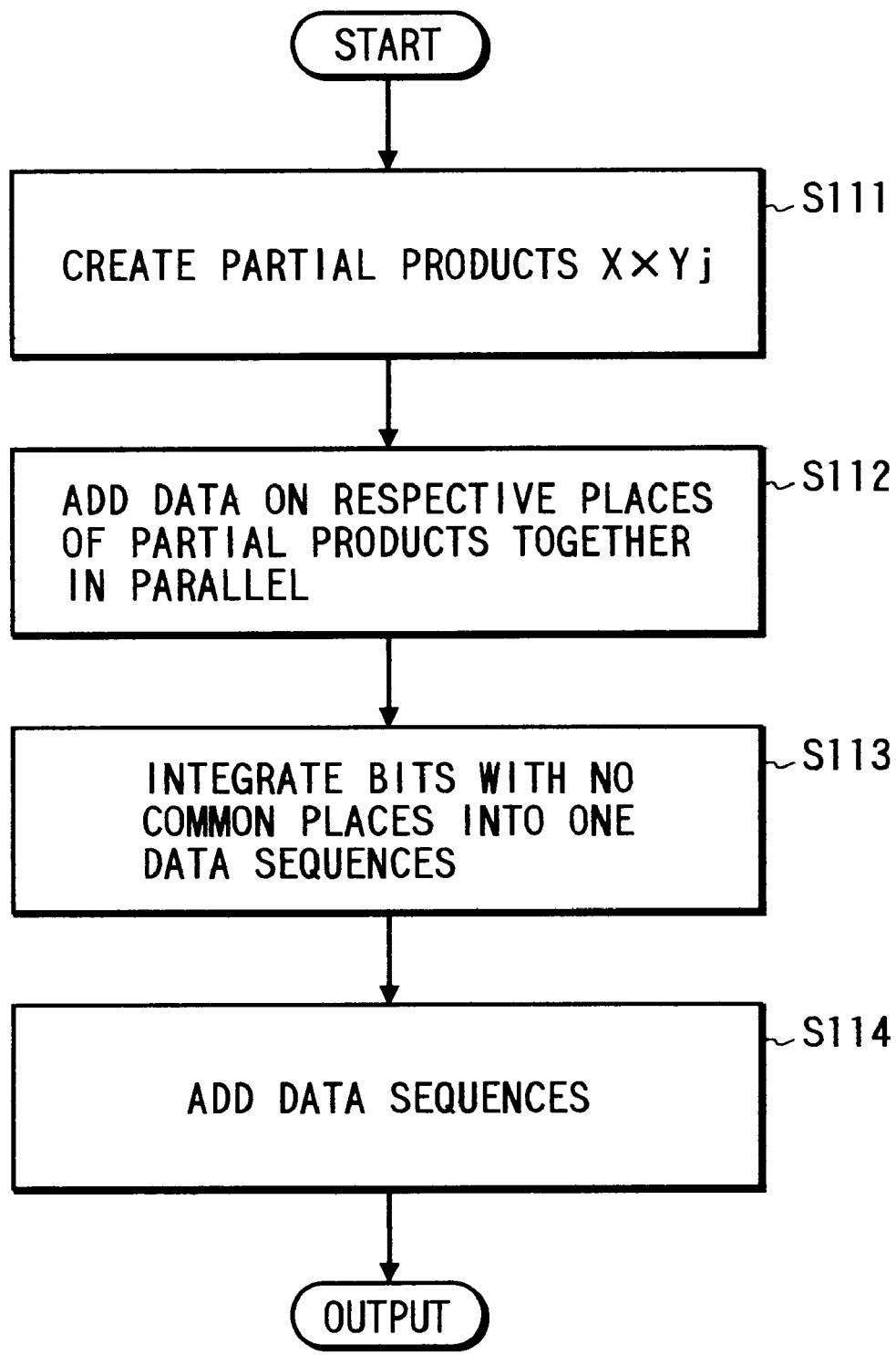
FIG. 11 is a flowchart illustrating a multiplication processing procedure of the 3rd embodiment.

A flowchart of the above operation method is shown in FIG. 11.

In step S111, first, a partial product X×$Y_j$ is created by an AND circuit or a switch. Next, in step S112, data on respective places of the created partial products X×$Y_j$ is added together in parallel by NDs. Subsequently, in step S113, bits with no common places are integrated into one data sequence out of the addition results in step S112. As mentioned above, however, there is no operation of a device corresponding to this step, and just a connection is made between outputs from NDs and inputs to full adders in a rear stage. Finally, in step S114, data integrated in step S113 is added by full adders.

Figure 12:
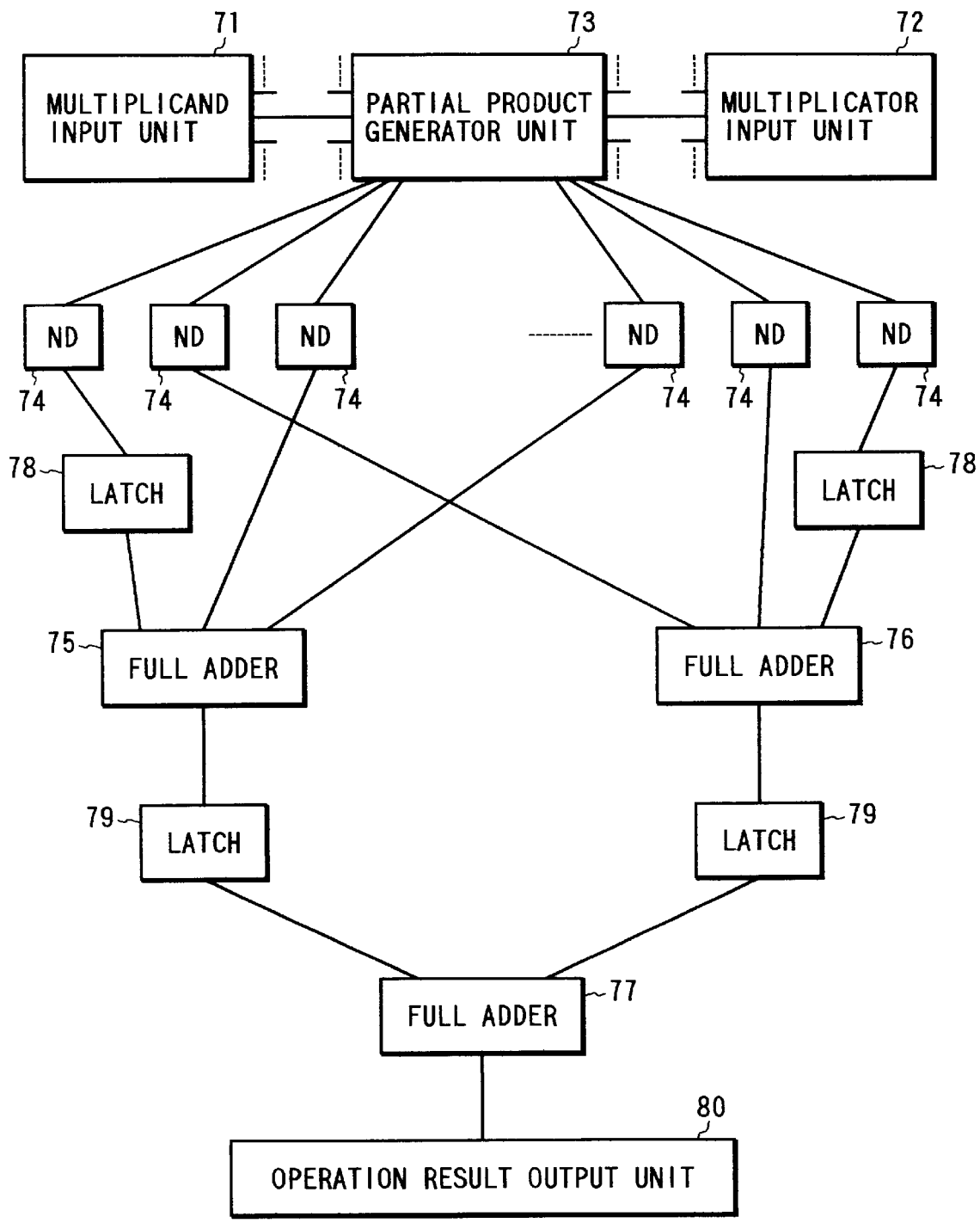
FIG. 12 is a drawing illustrating a multiplication circuit of the 3rd embodiment.

Then, an explanation is made for actual multiplication circuits for executing the above operation method such as the NDs used in this embodiment with referring to FIG. 12. A multiplicand input unit 71 is used to enter a multiplicand X. A multiplicator input unit 72 is used to enter a multiplicator Y. A partial product generator unit 73 is an AND circuit or a switch shown in FIG. 7 to generate partial products. As mentioned above, partial products can be generated by any of circuits having other configurations. An ND74 is used to add data on the same places of a plurality of multiple bit data (respective partial products in this embodiment) together in parallel.

Figure 13:
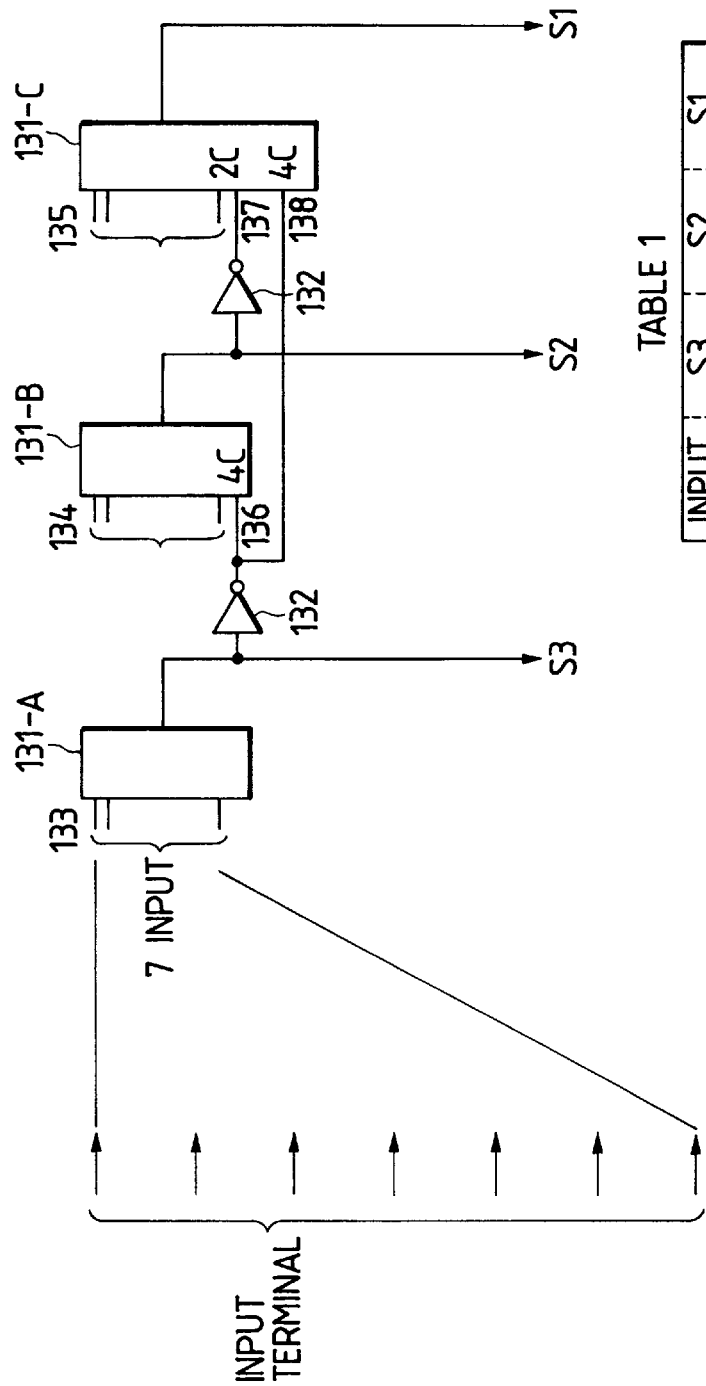
FIG. 13 is a drawing illustrating an ND used in the 3rd embodiment.

Referring to FIG. 13, there is shown a typical diagram illustrating a seven-input ND. NDs used in this embodiment have majority logic circuit block 131-A, 131-B, 131-C, and an inverter 132, whose configuration is different from that of the first embodiment. Signals entered into terminals 134 and 135 are the same as those entered into an input terminal 133. Terminals 136, 137, and 138 are used as destinations for entering output signals from a majority logic circuit block in a front stage. In FIGS. 13, 2C and 4C indicate capacitor values connected correspondingly to the input terminals 136, 137, and 138 assuming that C indicates a capacity connected to a general input terminal. In this drawing, signals are entered to majority logic circuit blocks 131-A, 131-B, and 131-C.

For example, when a signal is entered to the seven-input majority logic circuit block 131-A, HIGH LEVEL is output from the block 131-A if there are a majority of HIGH LEVEL data, or if four or more inputs are HIGH LEVEL in seven inputs. In the same manner, for example, if six or more inputs are HIGH LEVEL in an 11-input majority logic circuit block, and if seven or more inputs are HIGH LEVEL in a 13-input majority logic circuit block, HIGH LEVEL is output. In Table 1, S3 indicates an output value of a seven-input majority logic circuit block for each HIGH LEVEL input count.

Figure 14:
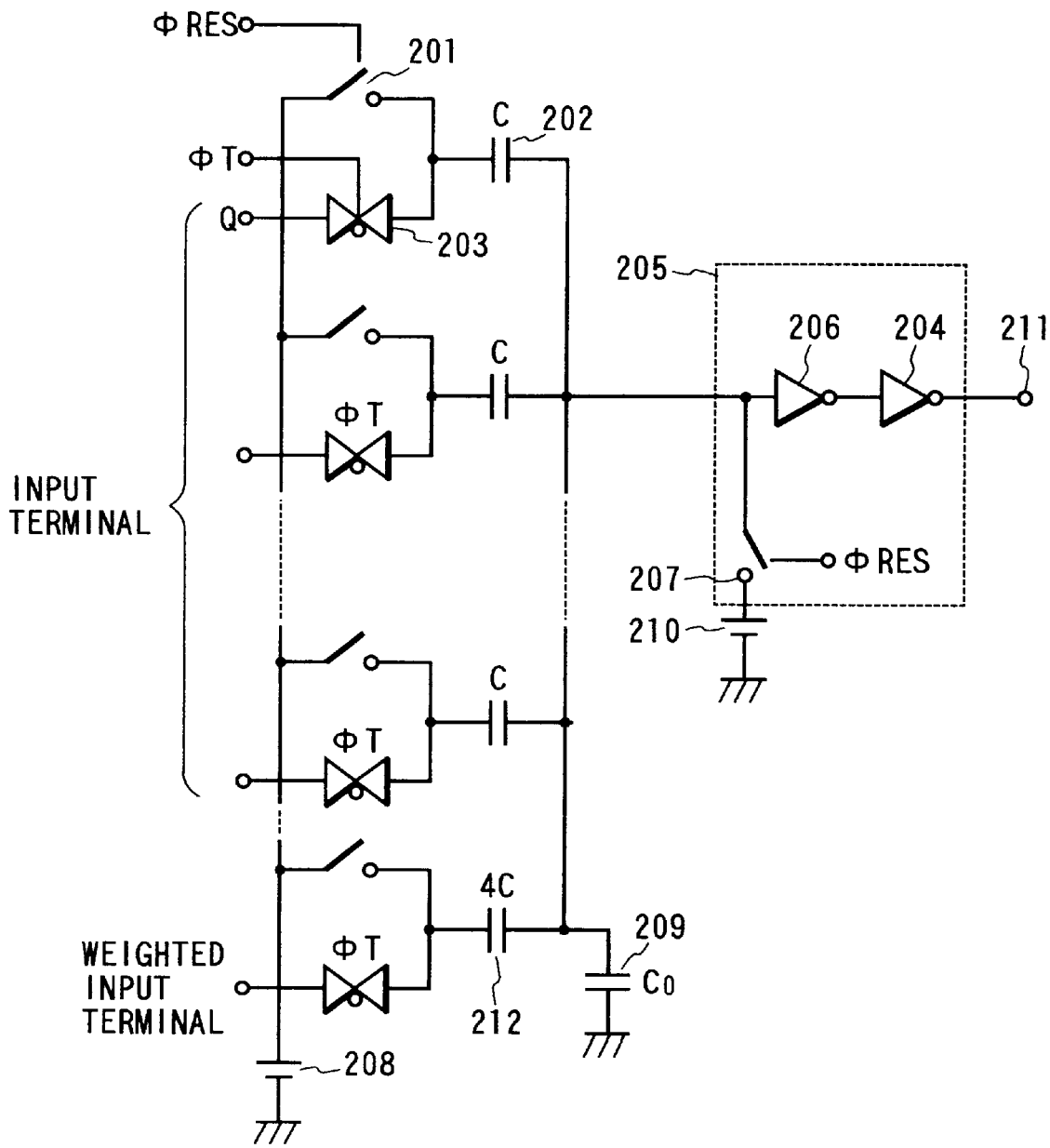
FIG. 14 is a drawing illustrating a majority logic circuit used in the 3rd embodiment.

Subsequently, as shown in FIG. 13, an output of the seven-input majority logic circuit block 131-A is inverted by an inverter and it is entered to the weighted input terminal 136 of the majority logic circuit block 131-B. A circuit configuration of the majority logic circuit block 131-B is shown in FIG. 14. In this drawing, a capacitor 212 has about four times the capacitor value of a capacitor 202 connected to another input terminal path. Assuming that C is a capacitor value connected to an input terminal path, the circuit is an 11-input majority logic circuit having a configuration in which 11 Cs are connected in common and a signal from the weighted input terminal is entered to four Cs out of them and the same signal as that entered to the 131-A block is entered to other seven terminals.

For example, if four or more inputs are HIGH LEVEL in seven inputs, LOW LEVEL is entered to the weighted input terminal as described in the above. If six or more inputs are HIGH LEVEL in seven inputs in signals entered to input terminals other than the weighted input terminal, the 11-input majority logic circuit determines it as a majority in total and outputs HIGH LEVEL. If four or more and five or less inputs are HIGH LEVEL in seven inputs, it is not determined as a majority and LOW LEVEL is output. If three or less inputs are HIGH LEVEL in seven inputs, HIGH LEVEL is entered into the weighted input terminal. If two or more and three or less inputs are HIGH LEVEL in seven inputs, there are four plus two or four plus three, that is, six or more inputs, therefore, it is determined to be a majority and HIGH LEVEL is output. If one or less input is HIGH LEVEL, there are four plus zero or four plus one, that is, five or less inputs and LOW LEVEL is output.

In Table 1, S2 indicates an output value of the majority logic circuit block 131-B for each HIGH LEVEL input count. As for the majority logic circuit block 131-C, outputs as shown in S1 in Table 1 can be obtained by entering an inversion signal for outputs of the majority logic circuits 131-A and 131-B into two weighted terminals having a fourfold capacitor value and two-fold capacitor value before an operation.

According to this circuit configuration, the number of the HIGH LEVEL inputs can be converted to a binary number in three places to be output out of two or more inputs as shown in Table 1.

Figure 15:
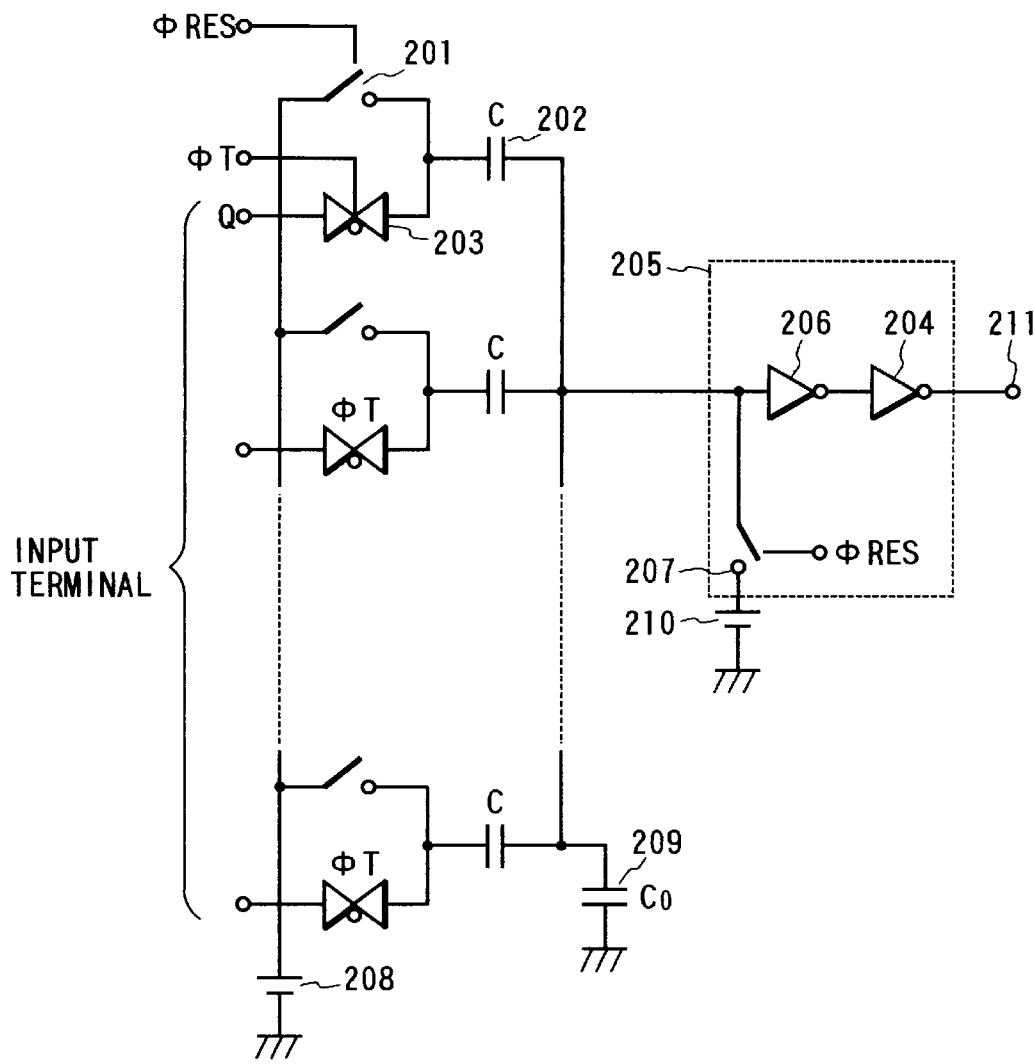
FIG. 15 is a drawing illustrating a majority logic circuit used in the 3rd embodiment.

A typical circuit diagram of a majority logic circuit block is shown in FIG. 15. This majority logic circuit block includes a reset switch 201, a capacitor 202, a signal transfer switch 203, a sense amplifier 205, an inverter 206 in the sense amplifier, a second inverter 204 in the sense amplifier, a second reset switch 207 for resetting the inverter 206, a reset power supply 208, a second reset power supply 210, an output terminal 211, and a parasitic capacitor 209 at an end of the capacitor 202 connected in common. It is typically illustrated in FIG. 15, though the invention is not limited to this configuration.

Figure 16:
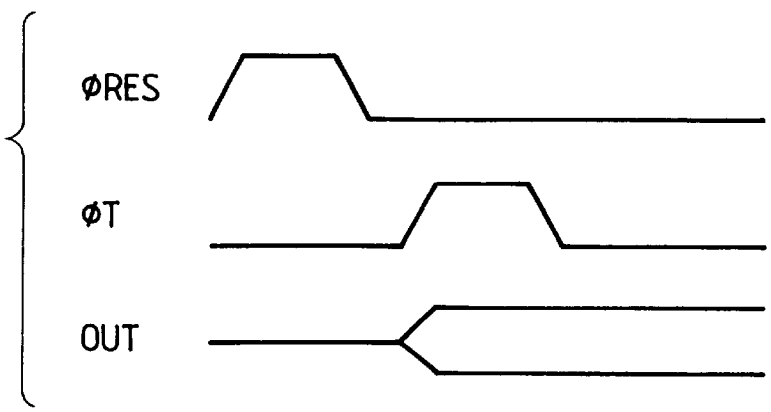
FIG. 16 is a timing diagram of signals used in the 3rd embodiment.

FIG. 16 is an operation timing diagram of the circuit in FIG. 15. Referring to this drawing, the operation is described below. First, a terminal at an end of the capacitor 202 is reset by reset pulse φRES. For a reset voltage, for example, if a supply voltage is 5 V series, 2.5 V which is a half of the voltage is used. The reset voltage, however, is not limited to it, but any of other voltages can be used. Almost simultaneously, an input terminal of the inverter 206 in the sense amplifier is reset by making the reset switch 207 conduct. At this time, a value is selected as the reset voltage which is near a logical inversion voltage for inverting an output of the inverter. If the reset pulse φRES is set off, both terminals of the capacitor 202 are kept to respective reset potentials.

Next, when the transfer switch 203 conducts due to a transfer pulse φT, a signal is transferred to a terminal of the capacitor 202 and a potential at the terminal of the capacitor is changed from, for example, the 2.5 V reset voltage to 0 V equivalent to a low level or 5 V equivalent to a high level. Assuming that C indicates a capacity of the capacitor 202, $C_0$ indicates a capacitor value of the parasitic capacitor, and N units of the capacitors 202 are connected in parallel, terminals connected in common at an end of the capacitors 202 change for an input from a value near the logical inversion voltage of the inverter by $\pm[2.5C/(C_0+CN)]\times|V|$ due to a capacity division.

When an input terminal voltage of the inverter 206 changes from the logical inversion voltage, an output terminal voltage of the inverter 206 is inverted according to it. When respective signals are entered for N inputs, N sums of the capacity division outputs are entered into the input terminal of the inverter 206. If a majority of HIGH LEVEL signals are entered out of N inputs, the input terminal of the inverter 206 shifts the logical inversion voltage to a higher potential and HIGH LEVEL is output to the output terminal 211 of the sense amplifier. If a majority of LOW LEVEL signals are entered, LOW LEVEL is output. By using the above configuration, the circuit in FIG. 15 serves as a majority logic circuit for outputting a logical value which is in the majority of two or more inputs.

Although seven-input NDs are illustrated as an example in FIG. 13, it will be understood that they are not limited to this configuration, but it can be easily expanded to a multiple input configuration. In addition, latch circuits can be flexibly connected between the majority logic circuits for a pipeline processing to make a configuration for a further increase of the operation speed.

The number of the majority logic circuit blocks required by the NDs is expressed by $[Log_2n]$, where n is the number of the inputs to the NDs. As for the number of the inputs to the NDs, a value is applied from 1 to Min(m,n) in an m×n-bit multiplier, and apparently its operation time becomes the longest at an ND whose input count is Min(m,n) which is the maximum number of the inputs. It is because the number of the majority logic circuit stages is increased for the number of the inputs n with $[Log_2n]$. It is apparent, however, that the number of the stages is not increased significantly when the number of the bits is increased since it increases with a log function.

Since the operation is performed in parallel, it terminates with a plurality of NDs 74 at an operation speed of the NDs with the maximum number of the inputs Min(m,n). For NDs which terminate the operation earlier, it is preferable to connect a latch circuit 78 to adjust the timing, though the measures are not limited to it.

This ND configuration leads to a higher operation speed due to a parallel operation and to NDs with lower power consumption due to less elements required, so that the characteristics of the operation methods in the above embodiments can be significantly improved.

There is a step for integrating data output from a plurality of NDs into one data sequence on an algorithm, but no processing is performed in circuits as mentioned above, and therefore, there are no circuits corresponding to this step in FIG. 12. Full adders 75, 76, and 77 are 16 or smaller bit adders in an example of an 8×8 bit multiplication shown in FIG. 6. In FIG. 12, an 8×8 bit multiplier is used, therefore, three adders are required and they are arranged in two stages. Although general carry look ahead (CLA) typed full adders are used as the adders, it will be understood that this invention is not limited to this.

In addition, latch circuits 79 are connected between adders to perform an operation with the first adders during an operation with the adders in the second stage in the so-called pipeline method to achieve a higher operation speed, though the invention is not limited to this method. An operation result output unit 80 outputs an operation result in 16 bits in this example of an 8×8 bit multiplication.

The above multiplier configuration makes it possible to form a high speed multiplier due to a small number of elements, low power consumption, and a parallel operation.

[4th Embodiment]

Other configurations are described below in the ND section for parallel batch additions in the first to third embodiments.

Figure 17:
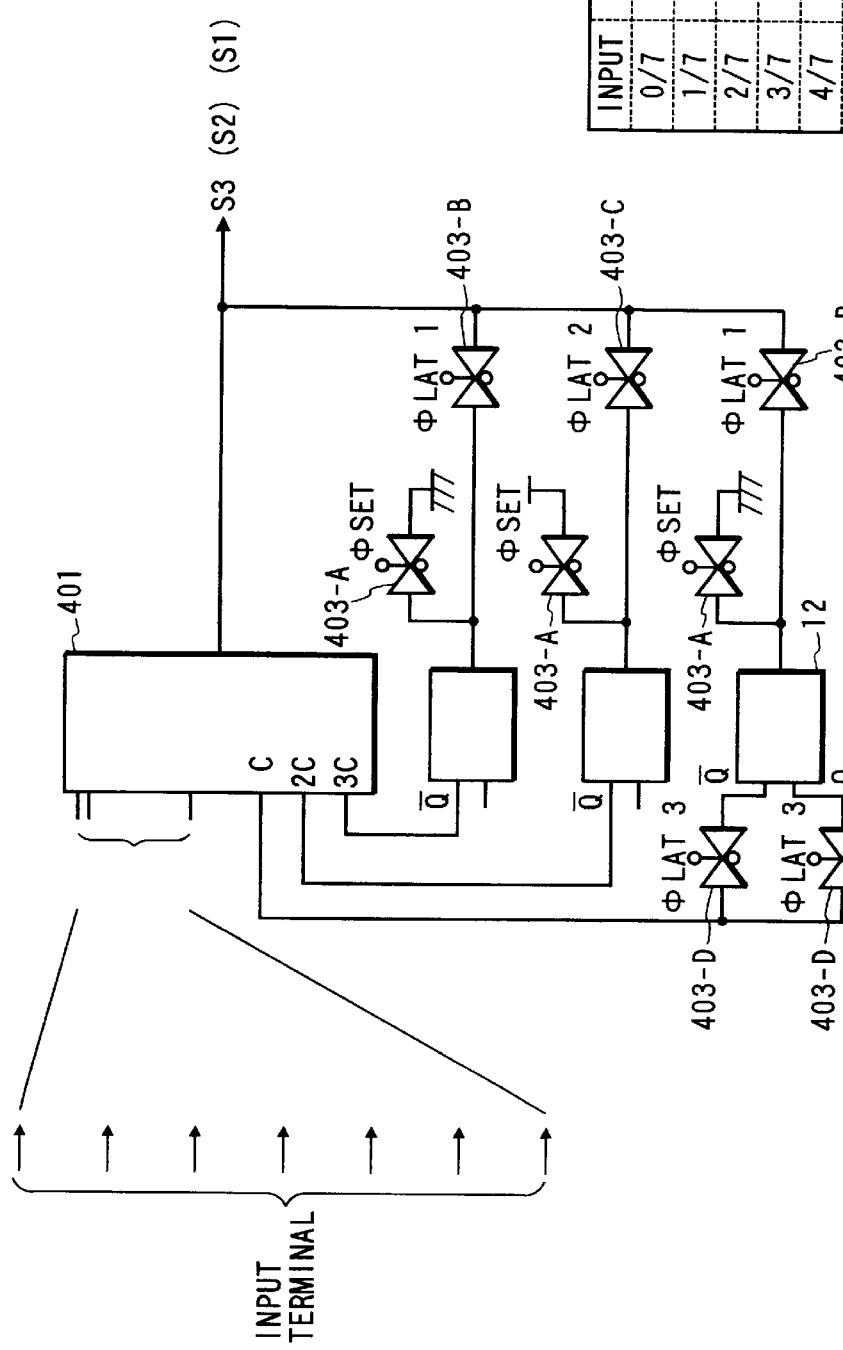
FIG. 17 is a drawing illustrating an ND used in the 4th embodiment.
Figure 18:
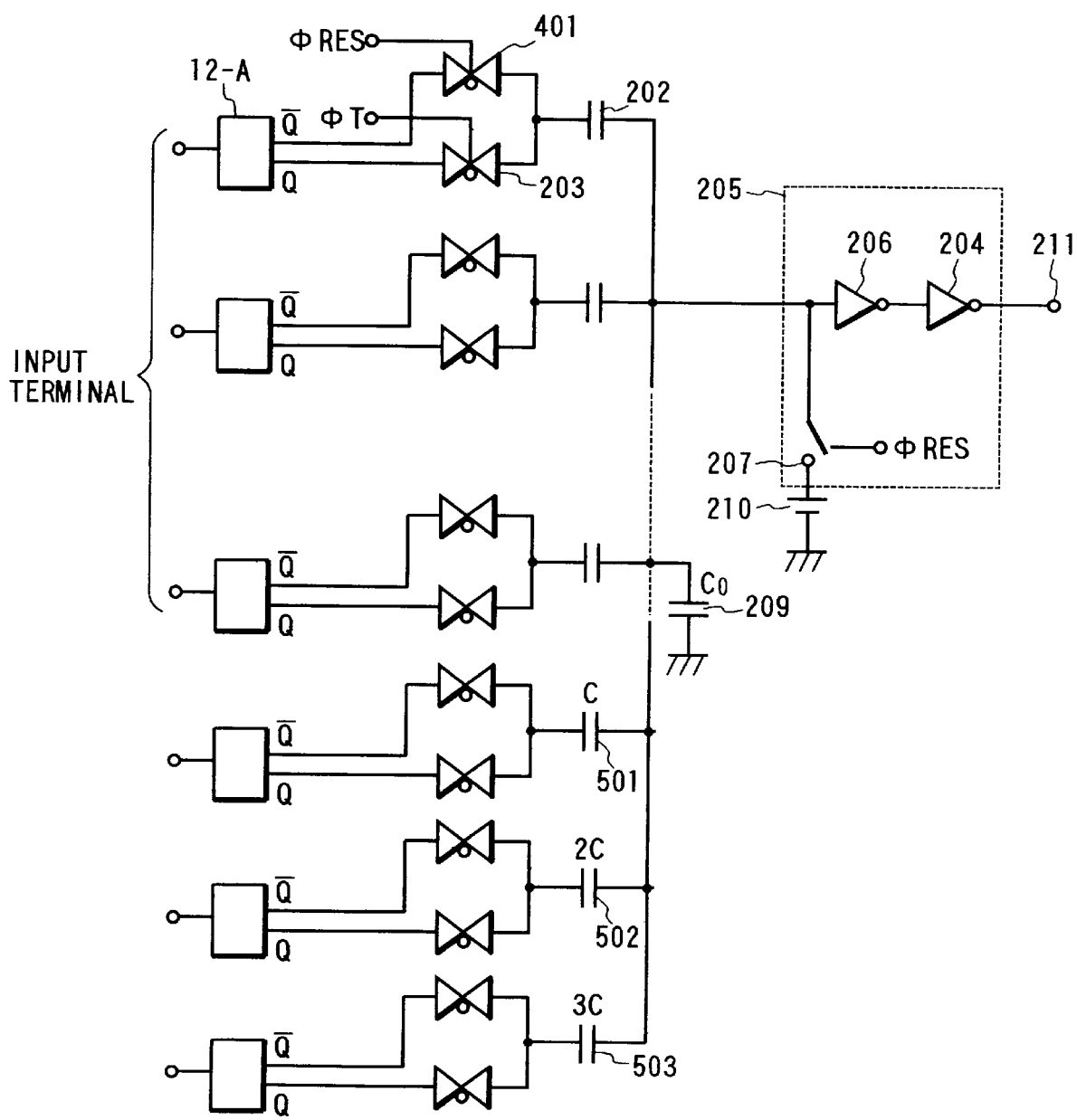
FIG. 18 is a drawing illustrating a majority logic circuit used in the 4th embodiment.
Figure 19:
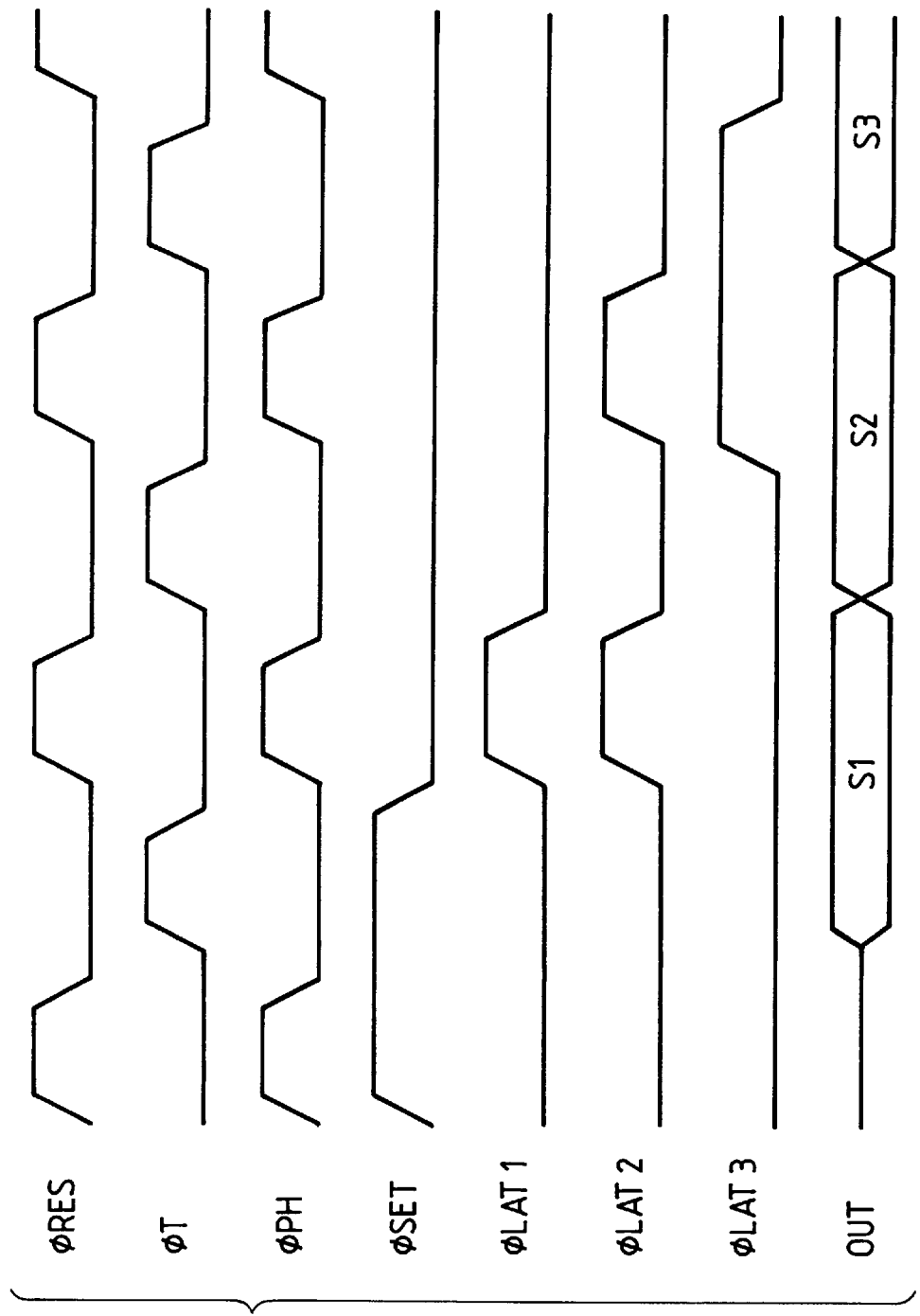
FIG. 19 is a timing diagram of signals used in the 4th embodiment.

FIG. 17 shows a typical drawing of NDs used for this embodiment, including a parallel operation circuit block 401 and latch circuits 12. FIG. 18 shows a circuit diagram of the parallel operation circuit block 401. In this drawing, terminals 501, 502, and 503 are a first weighted input terminal, a second weighted input terminal, and a third weighted input terminal, respectively. Each terminal has a capacitor having almost one-fold, two-fold, or three-fold capacitor value connected to another input terminal path. An operation timing diagram of this embodiment is shown in FIG. 19. A parallel operation circuit block 401 is operated by pulse φRES or φT. The latch circuits 12 are operated by pulse φPH.

First, referring to FIG. 18, a basic operation is explained. An input signal is latched in a latch circuit 12-A. At this time, 0 V equivalent to a low level is applied to the weighted terminals 501 and 502 and 5 V equivalent to a high level is applied to the weighted terminal 503 with a pulse φSET. Next, the voltages across the capacitor 202 are reset to respective reset voltages by a reset pulse φRES.

Then, when the transfer switch 203 conducts with a transfer pulse φT, a signal is transferred to an end of the capacitor 202 and a potential at the end of the capacitor is changed to, for example, a low level or high level. A voltage of an end of the capacitor 202 connected in common changes according to the capacity division for an input. When an input terminal voltage of the inverter 206 changes from the logical inversion voltage, an output terminal voltage of the inverter 206 is inverted in response to it. When each signal is entered in response to N inputs, N sums of capacity division outputs are entered to the input terminals of the inverter 206.

In this embodiment, signals of opposite polarity are entered into the weighted terminal 503 having three-fold capacitor value and the weighted terminals 501 and 502 having one-fold and two-fold capacitor values, therefore, the amounts of voltage changes at an end of capacitors 2 connected in common are offset each other. The capacitors 2 connected at respective input terminals other than the weighted input terminals have almost the same capacitor values. Accordingly, if a majority of high level signals are entered out of N inputs, the input terminals of the inverter 206 shift the logical inversion voltage to higher potentials and HIGH LEVEL is output to the output terminal 211 of the sense amplifier. If a majority of LOW LEVEL signals are entered, LOW LEVEL is output.

By using the above configuration, the circuit in FIG. 18 can serve as a majority logic circuit for outputting a logical value which is in the majority of two or more inputs. FIG. 17 shows a seven-input ND as an example.

In this drawing, signals are entered into the majority logic circuit block 401. Assuming that C is a capacitor value for connection with an input terminal path, the majority logic circuit block 401 can be considered as a 13-input majority logic circuit having a configuration in which high level signals are entered from the weighted input terminal to three Cs out of 13Cs connected in common, low level signals are entered from the weighted input terminal to other three Cs, and signals from 402 are entered into other seven terminals.

Accordingly, when an input value is entered, if the number of the high level signals are in majority, in other words, if there are four or more HIGH LEVEL inputs in seven inputs, HIGH LEVEL is output from the majority logic circuit block. In Table 1, S3 indicates an output value of a 13-input majority logic circuit block for each HIGH LEVEL input count. Subsequently, an output signal is latched in the latch circuit 12 with a pulse φLAT1 and φLAT2. For example, if four or more inputs are HIGH LEVEL in seven inputs, HIGH LEVEL is entered into the weighted input terminal 501 and LOW LEVEL is entered into the weighted input terminals 502 and 503.

If six or more inputs are HIGH LEVEL in seven inputs in signals entered to input terminals other than the weighted input terminal, the 13-input majority logic circuit determines it as a majority in total and outputs HIGH LEVEL. If four or more and five or less inputs are HIGH LEVEL in seven inputs, it is not determined as a majority and LOW LEVEL is output. In the same manner, outputs in Table 1 can be obtained by changing signals to be entered into a weighted terminal with switching a polarity of an output signal or the switch 403.

According to this circuit configuration, the number of the high level input signals can be converted to a binary number in three places to be output out of two or more inputs as shown in Table 1 in an extremely small size of a circuit with lower power consumption. Other description is the same as for the third embodiment, but this configuration makes it possible to reduce the number of the elements further, to reduce power consumption in a small size of a circuit, and to form a high-speed semiconductor device due to a parallel operation.

[5th Embodiment]

Other configuration are described below in the ND section for parallel batch additions in the first to fourth embodiments.

It is an operation method in which two or more NDs are integrated out of the 15 NDs in the third embodiment.

Figure 20:
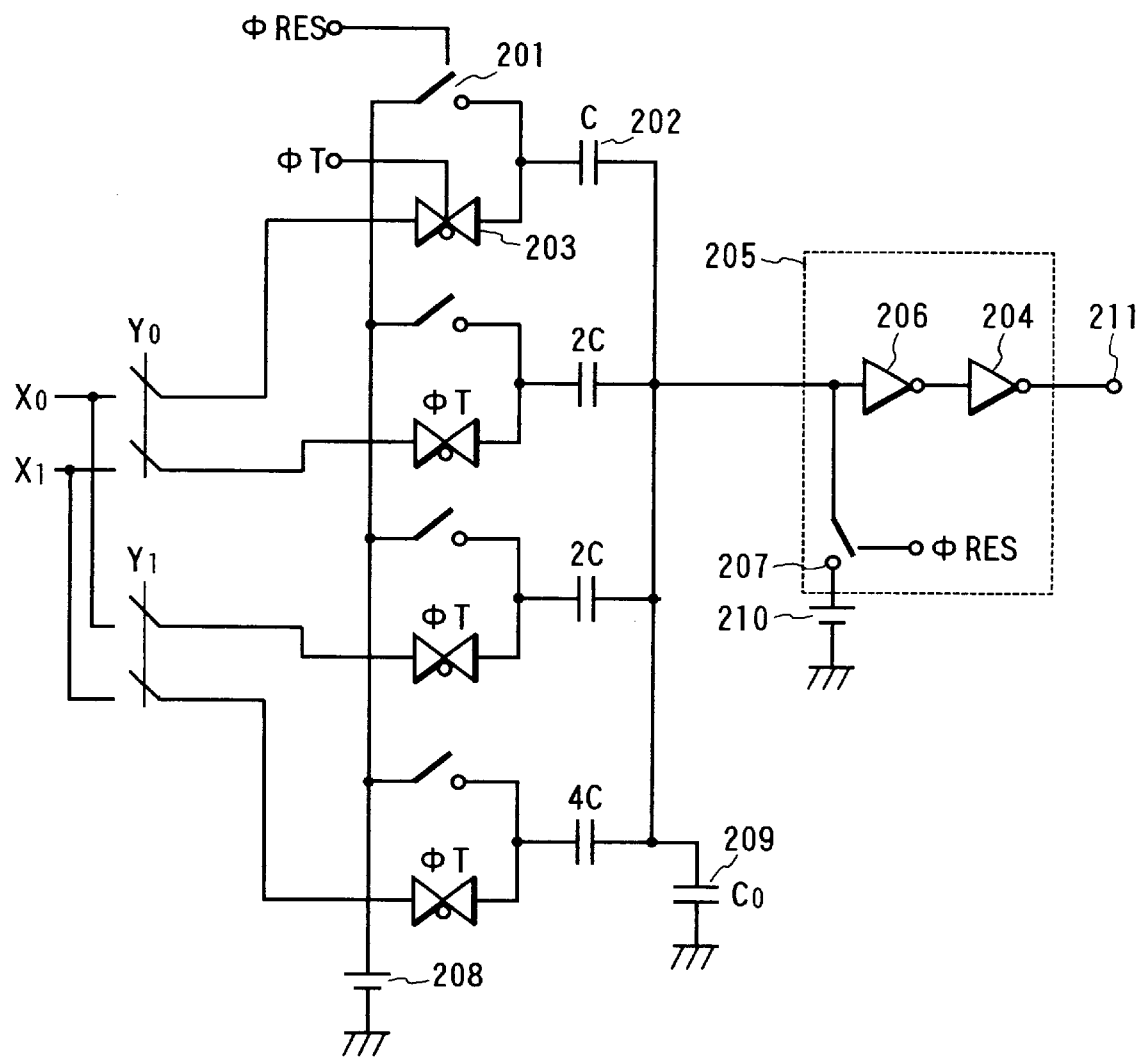
FIG. 20 is a drawing illustrating a majority logic circuit used in the 5th embodiment.

Its example is shown in FIG. 20 on the basis of a 2×2 majority logic circuit applied to a 2×2 multiplier. In other words, it is a majority logic circuit in the first stage in FIG. 13 in the third embodiment. Data on the first place ($x_0 y_0$ in a place of $2^0$) is entered into a unit capacitor C. Two pieces of data on the second place ($x_1 y_0$ and $x_0 y_1$ in a place of $2^1$) are entered into terminals each having two-fold capacity 2C, and therefore, one input is counted two. Further, data on the third place ($x_1 y_1$ in a place of $2^2$) is weighted 22 and one input is counted four.

Other description is the same as for the first to fourth embodiments and up to seven inputs are output in the binary mode with four inputs in each ND. By using this weighting method, the parallel batch addition function can be used more efficiently.

Figure 21:
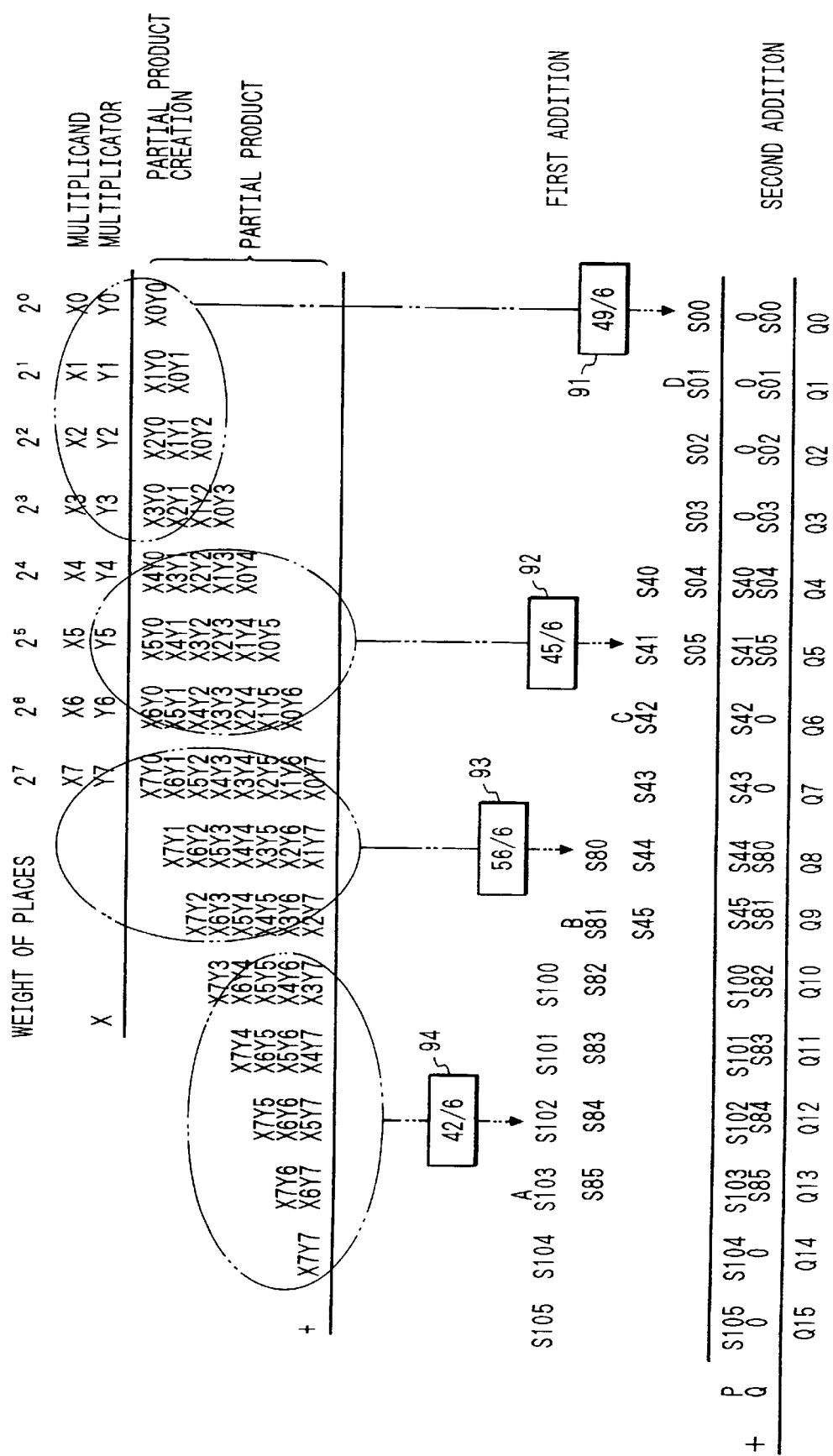
FIG. 21 is a drawing illustrating a multiplier of the 5th embodiment.

For example, in the 8×8 bit multiplier in the third embodiment, the NDs for adding data on places whose weights are 0, 1, 2, and 3 are integrated into an ND91 as shown in FIG. 21, and the areas on places whose weights are (4, 5, 6), (7, 8, 9), (10, 11, 12, 13, 14) are integrated into each area (ND92 to ND94 in FIG. 21).

Although the number of the inputs and that of the outputs are indicated by numbers for NDs in FIG. 21, any ND can be used only if it can count up to 56 inputs. Respective NDs generate 6-bit outputs. Assuming that A, B, C, and D are the 6-bit data sequences having places in an ascending order, A and C can be integrated into a data sequence P and B and D into a data sequence Q in a step for forming new data sequences which is a step S113 in the flowchart in FIG. 11 of the third embodiment.

Accordingly, only an additive operation P+Q should be performed. In other words, in this embodiment, an 8×8 bit multiplication is executed in two steps; a step in which a parallel bath addition is performed in NDs and a step in which a 16-bit addition is performed only once.

Other description is the same as for the third and fourth embodiments, but this configuration of the multiplication circuit makes it possible to reduce the number of the elements further, to reduce power consumption in a small size of a circuit, and to form a higher speed multiplier due to a parallel operation and less addition stages.

Although contiguous places are integrated in the example of general weighting in this embodiment, the invention is not limited to this method, and any of more efficient methods can be flexibly used such as discontinuous weighting (for example, when data on the $2^0$ place and on the $2^2$ place are integrated to be entered) or dividing data on one place to enter it with different weights for different NDs (for example, dividing data on $2^8$ places into two classes and entering them into different NDs).

[6th Embodiment]

Figure 22:
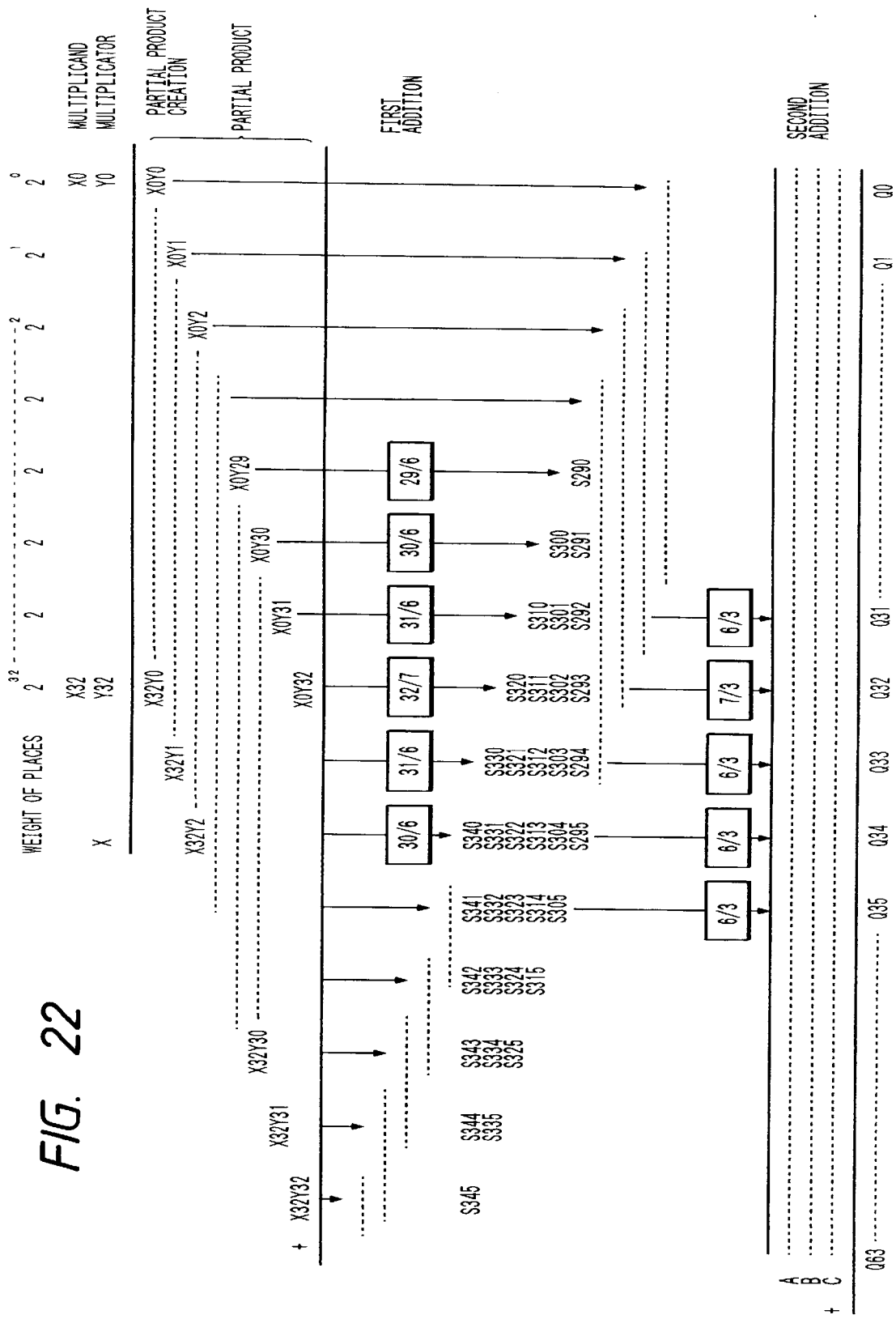
FIG. 22 is a drawing illustrating a multiplier of the 6th embodiment.

Although there are NDs in one stage for adding partial products in parallel and there are full adders in the rear stage in the third to fifth embodiments, NDs can be connected further after the NDs. Referring to FIG. 22, it is explained by giving an example of a 32×32 bit multiplier. It is a drawing around a 32-input ND. In the 32-input ND, 7-bit outputs are made. As for the lower bits, 6-bit outputs are made up to 16–31 input NDs, and these outputs can be considered as partial products which are operation results from the NDs.

Accordingly, 3-bit outputs can be made by using NDs again. In this state, data can be classified to three 64-bit data A, B, and C as data sequences and the operation can be performed only in two full adder stages. This method is effective for an operation with a great number of the bits particularly, though it depends on the performance of adders and NDs. In addition, there is no problem when this method is used in combination with weighted NDs as described in the fifth embodiment.

[7th Embodiment]

Figure 23:
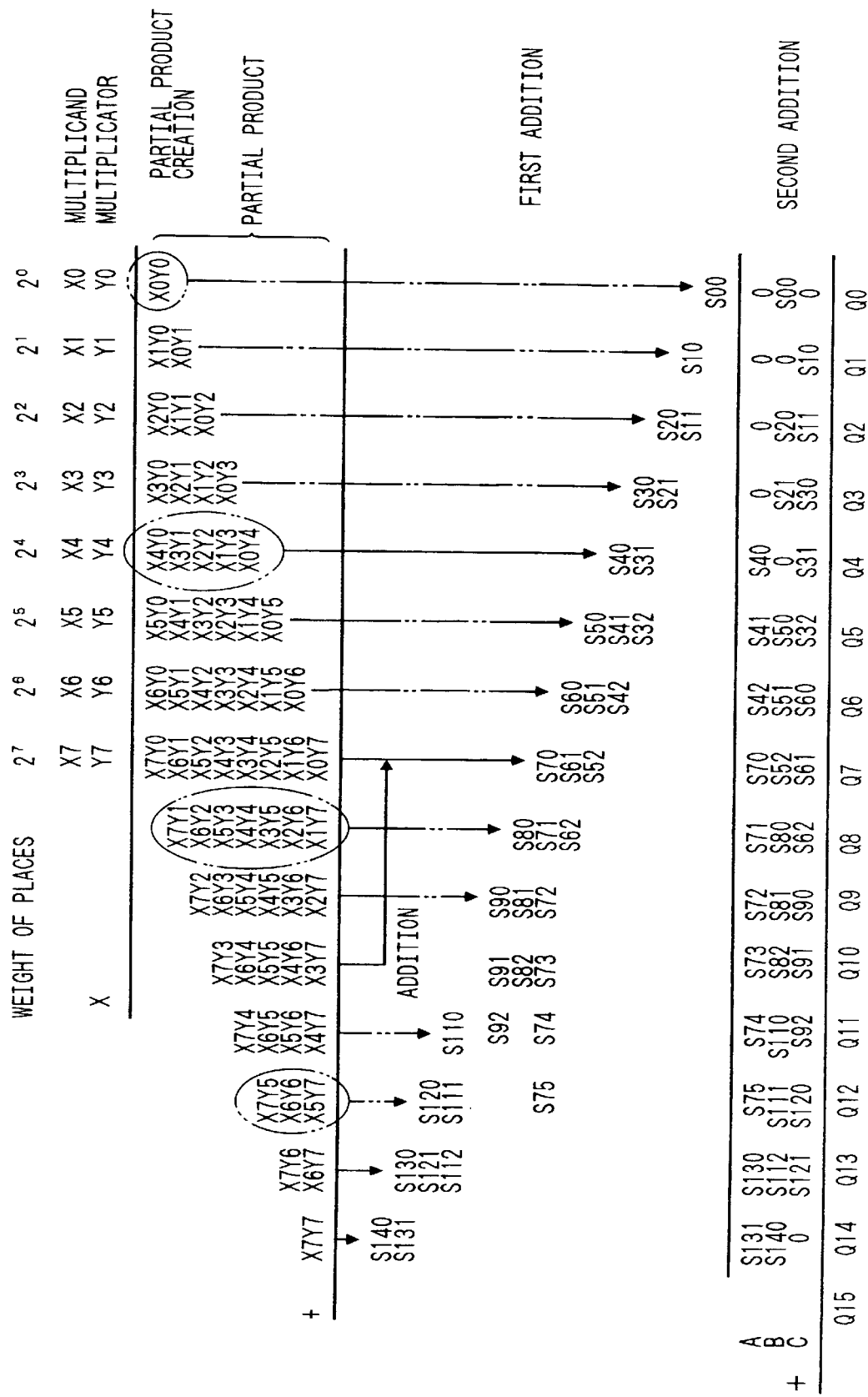
FIG. 23 is a drawing illustrating a multiplier of the 7th embodiment.

A multiplier of this embodiment is illustrated in FIG. 23. In this embodiment, an addition is made for (S73, S72, S71, S70) and (S102, S101, S100) which are outputs from NDs first. Practically, S73 is just added to S102, S101, and S100 with a simple 3-bit adder.

As a result of this step, three 16-bit data sequences A, B, and C are formed in this embodiment, though four 16-bit data sequences are formed in the third embodiment. Accordingly, the elements are reduced further in comparison with the third embodiment.

[8th Embodiment]

A method of multiplying three pieces of data is described in the eighth embodiment. Although it can be explained by using 2-bit data as a simple example, the method can be achieved in the same manner when the number of the bits of each data is not identical in multiple bit data, and the number of the data should not be limited to three pieces and it can be expanded to arbitrary multiple data.

Figure 24:
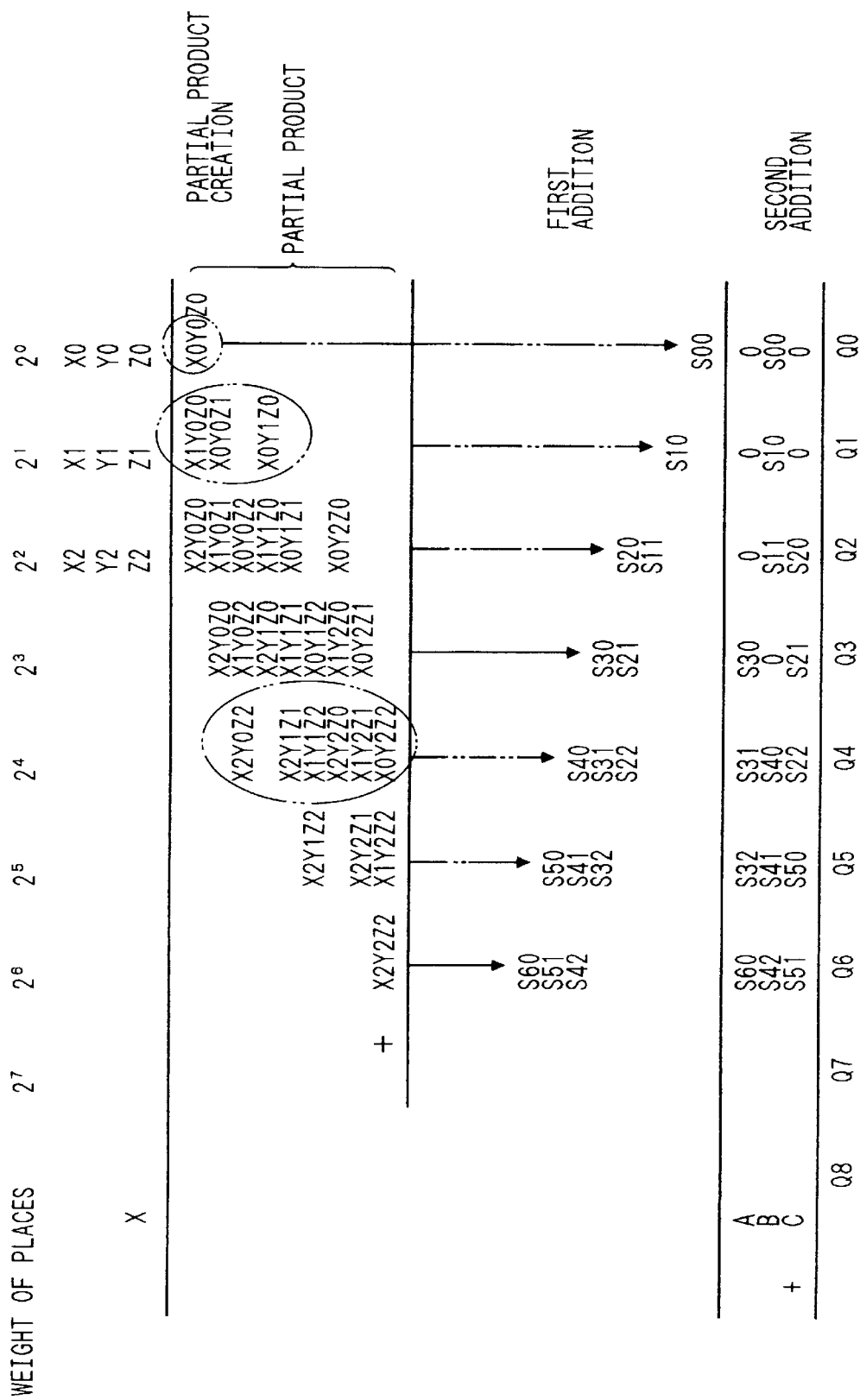
FIG. 24 is a drawing illustrating a multiplier of the 8th embodiment.

The values of a multiplication are assumed to be A(a1 a0), B(b1 b0), and C(d1 c0). In a calculation (A×B×C), a partial product $\Sigma a_i b_j c_k$ is generated as shown in FIG. 24 and a multiplication result Q can be obtained by calculating the sums. To form a partial product $\Sigma a_i b_j c_k$, each AND should be taken in the same manner as for the above embodiments. Even for three or greater number of data, the operation speed for the partial product is high and a partial product can be formed in a parallel processing.

Subsequently, a batch addition is performed for data on the same places in this partial product. Although data on the same places is added together each in the example of FIG. 24, it is apparent that weighting or other steps can be also used as described in the above embodiments. In FIG. 24, the batch addition output results on the places enclosed by elliptic frames are integrated into one data sequence due to no common places, which results in three 7-bit data sequences, and they are added together to obtain a multiplication result Q of three 3-bit data.

More particularly, data on lower two places (20 and 21 places) need not be added in a 7-bit data sequence and S00 and S10 are output results for them, respectively. Therefore, in an addition step which is the second step, three 5-bit data sequences are added, which leads to a higher operation speed.

As apparent from these explanation, also in a multiplication of three or more data sequences, the operation method of this invention is effective, so that a high speed multiplication can be performed with a small number of elements which leads to lower power consumption.

[9th Embodiment]

In this embodiment, an addition method is described for a plurality of multiple bit data including at least one negative value by giving an example of adding 63 7-bit data sequences.

The negative value is represented by a 2's complement. In other words, the most significant bit 0 in the 7 bits indicates a sign; a positive value if it is set to 0 and a negative value if it is set to 1. A data sequence $X=(X_6 X_5 X_4 X_3 X_2 X_1 X_0)$ is expressed by the following:

$$X = (-1) \cdot X_6 2^6 + \sum_{n=0}^{5} X_n 2^n$$

Figure 25:
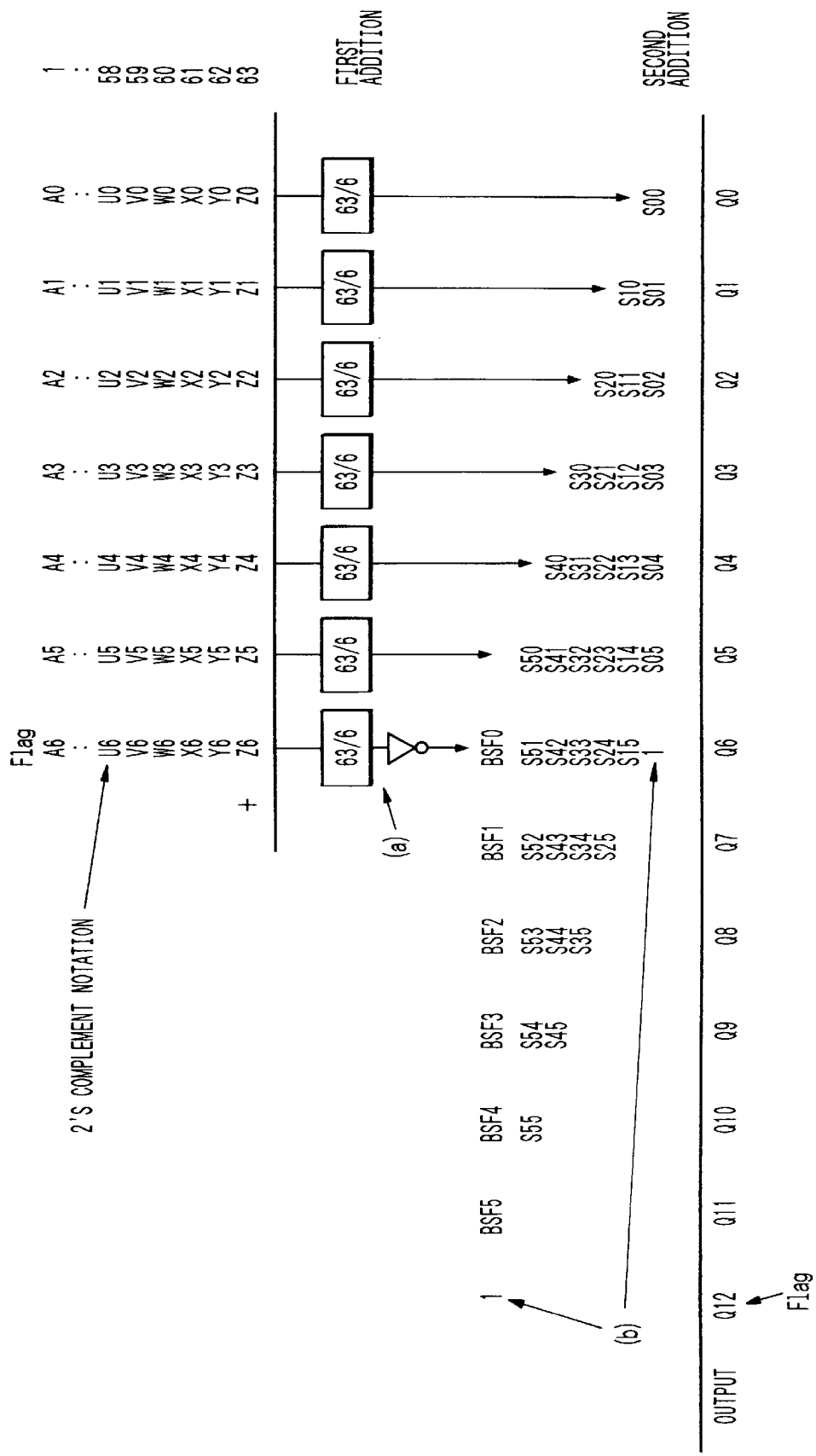
FIG. 25 is a drawing illustrating an adder of the 9th embodiment.

FIG. 25 illustrates this embodiment. In this embodiment, a batch addition is made for data on respective places of seven 8-bit data sequences to them, first. The first addition is performed by using NDs in the same manner as for the above embodiments. Since a data sequence is in 7 bits including a flag in this embodiment, seven NDs are used.

Processing in this addition step is performed in parallel, therefore, the operation speed is determined by a speed of a single ND. Since the operation speeds of all NDs are identical, it is determined by the operation speed of a single ND. In addition, 63 7-bit data sequences are added in this embodiment, therefore, the maximum number of the inputs to the NDs is 63.

Since a carry occurs in a general addition, the operation speed is decreased due to propagation of the carry. In this embodiment, however, a batch addition without carries is performed including a flag in parallel, so that the addition stages can be reduced and a high speed operation is achieved. Although the example is shown only with 63 7-bit data sequences in this embodiment, the invention is not limited to it, and there can be various numbers of the bits in a plurality of multiple bit data including at least one negative value.

Subsequently, a desired addition result Q is obtained at a high speed by performing a second addition step for adding all of the eight addition results represented in a binary mode.

Then, flag bits indicating positive or negative signs are described below.

If a flag bit is set to 1, it indicates $(-1) \cdot 2^6$ in the 2's complement notation. Accordingly, if the number of is is indicated by n in 63 inputs, $-n \cdot 2^6$ indicates the value. The minimum value is obtained when n is equal to 63 and an expression $-63 \cdot 2^6 = -(2^6-1) \cdot 2^6$ holds true in this state without exceeding $2^{12}$ in an absolute value. When $(SF_5, SF_4, SF_3, SF_2, SF_1, SF_0)$ is assumed to be a binary notation of n and $(BSF_6, BSF_5, ---  BSF_0)$ is to be its inversion by using this negative value as a 2's complement and the 13th bit as a flag, the following expressions are obtained:

$$F = -n \cdot 2^6 = -2^6 \sum_{n=0}^{5} SF_n 2^n$$

$$\overline{F} = 2^6 \left( 2^6 + \sum_{n=0}^{5} BSF_n 2^n + 1 \right)$$

Accordingly, F should be added since the following expression holds true:

A−|F|=A+F(|F|+F=0, the 13th bit is set to 0 since 1 plus 1 and the 14th bit is none).

In FIG. 25, flag bits of the operands are converted to binary notation SFs by NDs and BSFs are generated by taking their inversion. Furthermore, F can be generated by adding 1 for 2's complement notation of flag data indicating a negative value to the 7th bit and the 13th bit.

After that, a desired addition result Q can be obtained at a high speed by performing a second addition step for adding all of the seven addition results represented in the binary mode.

As mentioned above, flag bits can be treated in the same manner as for bits representing numerals, and 63 pieces of 7-bit data including at least one negative value are converted to seven pieces of 6-bit data by being passed to the NDs. Values is for the 7th bit and the 13th bit for 2's complement conversion for flags can be incorporated without any operation, for example, as shown by (b) in FIG. 25, by adding each to an Son or BSF data sequence.

In this method, the 13th bit can be used as a flag:

$$\text{out} = (-1)Q_{12} \cdot 2^{12} + \sum_{n=0}^{11} Q_n \cdot 2^n$$

Assuming that $X_{ij}$ indicates the (j+1)th bit of the ith data sequence, the above calculation can be expressed numerically as follows:

$$\text{out} = \sum_{i=1}^{63} \left( (1-X)_{i6} \cdot 2^6 + \sum_{n=0}^{5} X_{in} \cdot 2^n \right)$$

$$= 2^6 \left( -2^6 + \sum_{n=0}^{5} BSF_n 2^n + 1 \right) + \sum_{i=1}^{63} \left( \sum_{n=0}^{5} X_{in} \cdot 2^n \right)$$

Therefore, when out is greater than or equal to 0, the following is obtained from the above expression:

$$\sum_{i=1}^{63}\sum_{n=0}^{5} X_{in} \cdot 2^n + 2^6 \sum_{n=0}^{5} BSF_n 2^n + 1 \geq 2^{12}$$

In other words, 1 is added to the 13th bit to be set to 0. When out is smaller than 0;

$$\sum_{i=1}^{63}\sum_{n=0}^{5} X_{in} \cdot 2^n + 2^6 \sum_{n=0}^{5} BSF_n 2^n + 1 < 2^{12}$$

Therefore, the 13th bit remains to be 1 which is a negative value.

In a general description, the mth bit is a flag bit and an addition (subtraction) can be performed for n operands in use of NDs by setting the m+[$\log_2 n$]th bit to 1 and adding 1 to the mth bit for 2's complement notation since the flag bits can be treated as bits equivalent to other numerical bits other than flag bits, which makes the operation easier.

[10th Embodiment]

This embodiment will be explained below by giving an example in which the operation speed of the second addition step is increased to achieve higher operation speed of the addition in the 9th embodiment.

Figure 26:
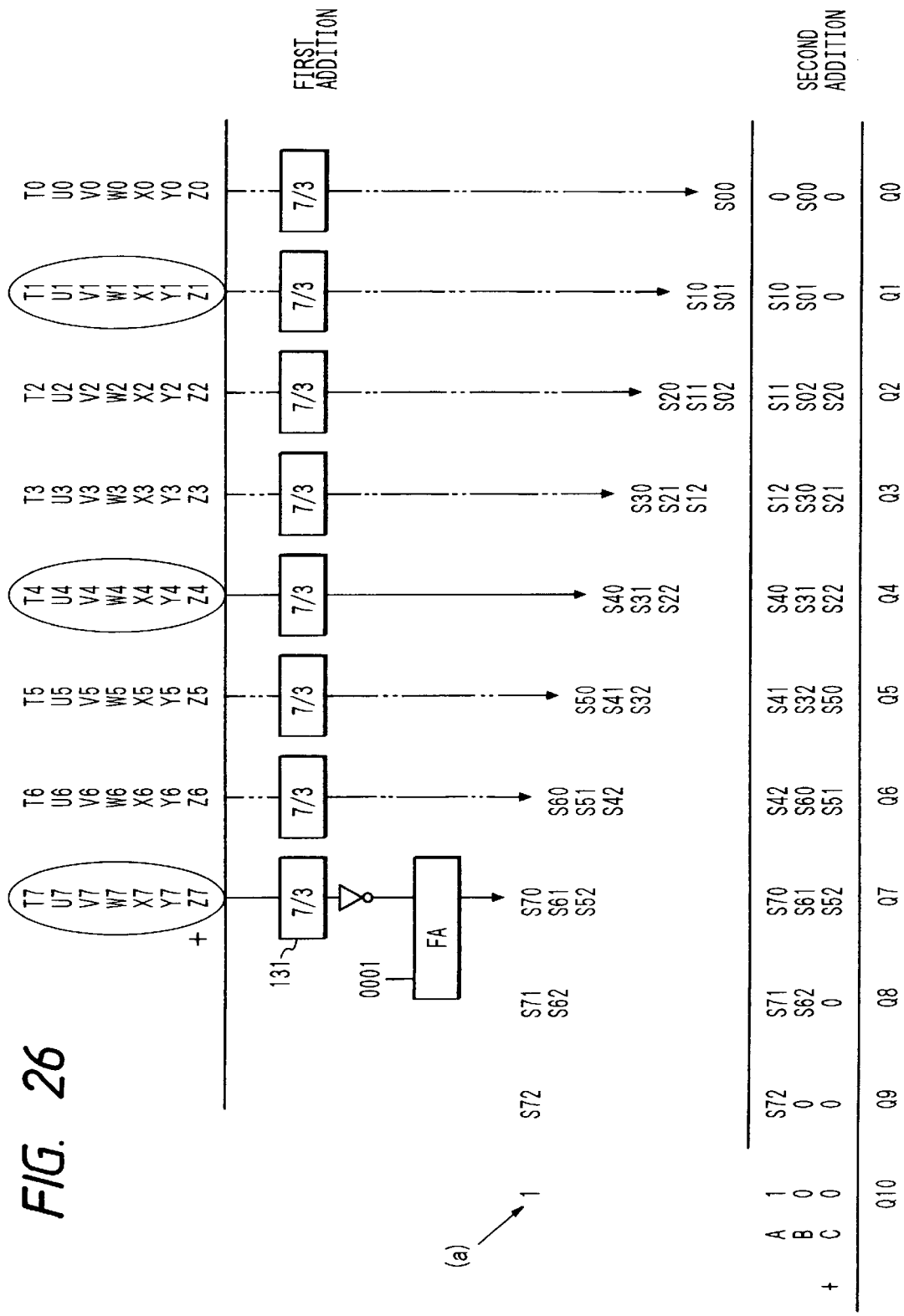
FIG. 26 is a drawing illustrating an adder of the 10th embodiment.

FIG. 26 shows a configuration of an adder of this embodiment. It shows an example of adding seven pieces of 8-bit data including flags, in which addition results with no common places are integrated into one 11-bit data sequence out of 3-bit output data obtained from NDs. This operation is explained by using the example in FIG. 26. As for flag bits, they are considered as 2's complements as described in the ninth embodiment and outputs from NDs are passed through an inverter. Further, 3-bit output data and data represented by 0001 are added by a full adder to add 1, though the invention, however, is not limited to it. In addition, 1 of MSB indicated by (a) is present in the same manner as for the ninth embodiment.

In this drawing, 3-bit or 4-bit output data on the places enclosed by elliptic frames can be integrated into 11-bit data sequence A since they have no common places (There are places which do not have a value when three addition results are integrated, and they are set to 0. In this example, the first place is set to 0.). It is important that no operation is performed in this processing with only wiring as processing in the circuit though it is treated as a step on its algorithm.

In this step, eight results of the addition can be converted to three 11-bit data sequences. A delay time is so short that it can be ignored in comparison with other steps. In the end, by adding three 11-bit data sequences, a final operation result can be obtained. Since three 11-bit data sequences are used in the example of FIG. 26, a final result of the addition can be obtained by a passage of full adders in only two stages as shown in FIG. 5 and a plurality of multiple bit data can be added in a high operation speed.

Next, this embodiment is described below for a general operation in which max. n-bit data sequences are added by m pieces. The result of addition output from n NDs has max. [$\log_2 m$] bits, therefore, it can be converted to max. [$\log_2 m$] (n+[$\log_2 m$]−1) bit data sequences. In the end, by adding [$\log_2 m$] (n+[$\log_2 m$]−1) bit data sequences, a final operation result can be obtained. The number of full adder passage stages can be expressed by $\lfloor \log_2[\log_2 m] \rfloor$. From the above expression, the number of full adder passage stages can be kept to be low even if the number of the multiple bit data sequences becomes higher.

Flag bits are passed through small full adders. If they are arranged in a single stage, $\lfloor \log_2[\log_2 m] \rfloor +1$ is obtained. If the full adders are not connected in the locations, but a flag bit is indicated by 1, there are [$\log_2 m$]+1 data sequences assuming that a data sequence in which only 1 bits are 1s is added last and the number of full adder passage stages can be expressed by ●$\log_2[\log_2 m]]+1$. In any case, even if the number of the bits is increased, the number of full adder passage stages can be kept to be low.

[11th Embodiment]

In this embodiment, an addition method for a plurality of multiple bit data including at least one negative value is described below by giving an example of adding 63 7-bit data sequences.

A negative value is represented by 1's complement in this embodiment. The 1's complement has a merit that preprocessing can be easily simplified since only inversion should be made for a numeric bit.

Figure 27:
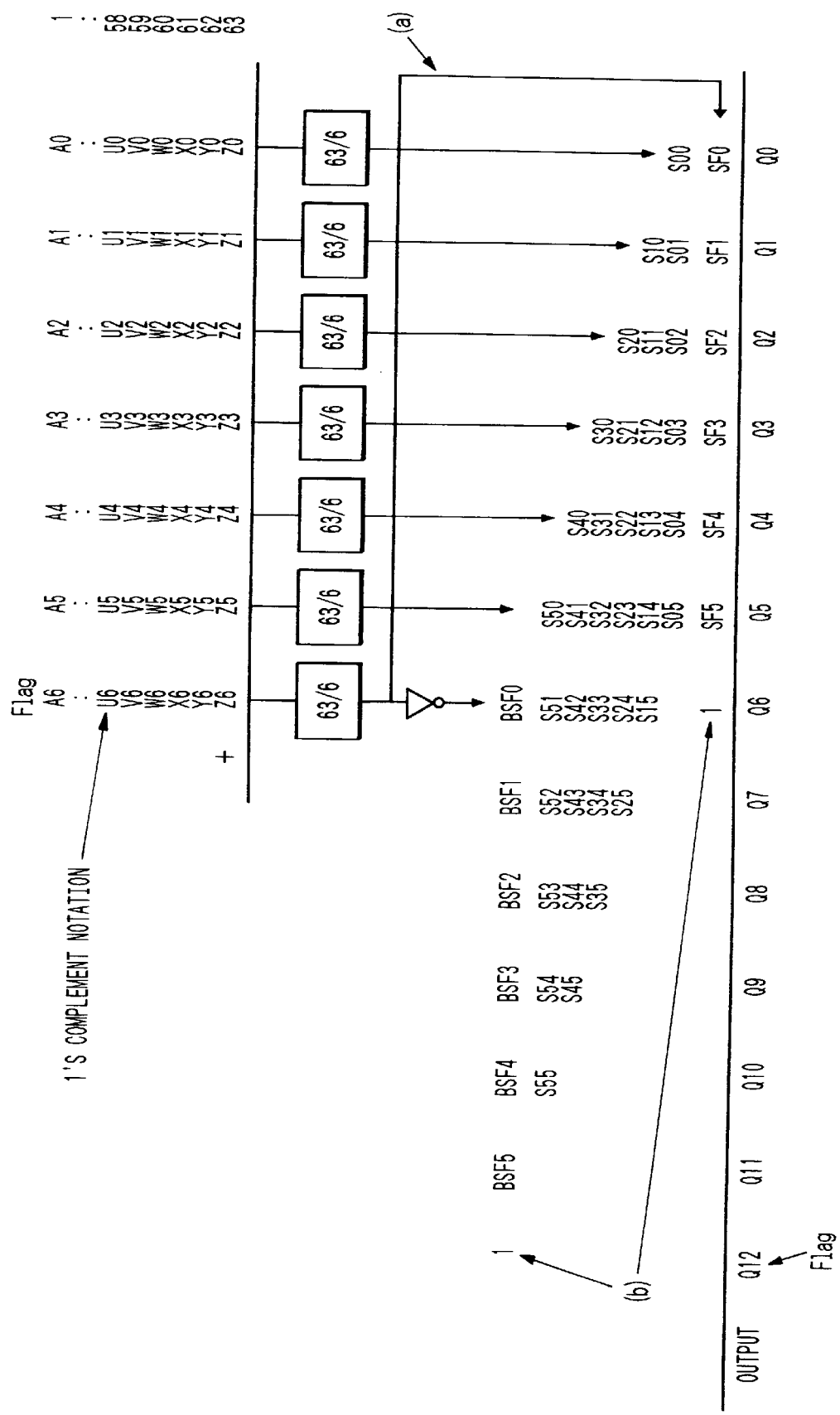
FIG. 27 is a drawing illustrating an adder of the 11th embodiment.

Referring to FIG. 27, this embodiment is illustrated. In this drawing, to add 63 7-bit data sequences, data on respective places are added together. This addition is performed by 63-input six-output NDs.

Processing in the addition step is performed in parallel in this embodiment, therefore, the operation speed is determined by an operation speed of each ND. In this embodiment, seven NDs are used because of 7-bit data sequences. In addition, since 63 7-bit data sequences are added in this operation, the number of the inputs to the NDs is equal to 63.

Since a carry occurs in a general addition, the operation speed is decreased due to propagation of the carry. In this embodiment, however, a batch addition without carries is performed in parallel, so that the addition stages can be reduced and a high speed operation is achieved. Although the example is shown only with 63 7-bit data sequences for the addition in this embodiment, the invention is not limited to it, and there can be various numbers of the bits in a plurality of multiple bit data including at least one negative value.

Subsequently, a desired addition result Q is obtained at a high speed by performing a second addition step for adding all of the eight addition results represented in the binary mode.

Although description of flag bits are the same as for the ninth embodiment, an addition is required by the number of flags (the number of negative data sequences) to convert a 1's complement to a 2's complement. It corresponds to data represented by ($SF_5$, $SF_4$, $SF_3$, $SF_2$, $SF_1$, $SF_0$), which is indicated by (a) in FIG. 27. It is also an output from NDs and its inversion is generated by an inverter to create data sequences BSFs. (b) indicates 1 for 1's complement notation of flag data indicating a minus sign. For its ND, an ND described in FIG. 13 or FIG. 17 can be used.

[12th Embodiment]

Figure 28:
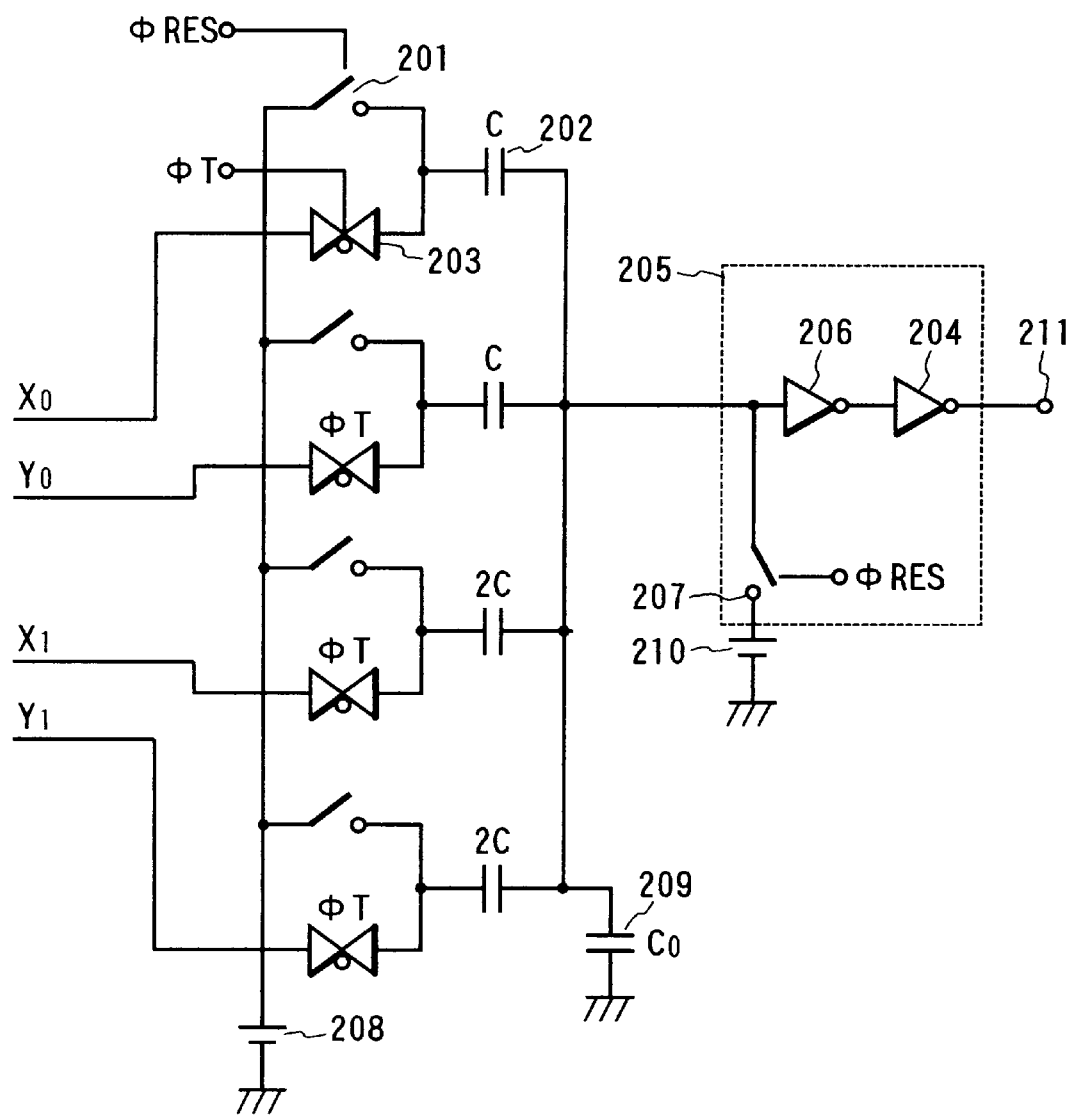
FIG. 28 is a drawing illustrating a 2-bit adder of the 12th embodiment.

In this embodiment, an operation is performed by integrating eight NDs in the 10th embodiment into a plurality of units. In FIG. 28, a majority logic circuit is described below by giving an example of a 2-bit adder of X (represented by $X_1 X_0$)+Y (represented by $Y_1 Y_0$)

Data on the first place $X_0$ and $Y_0$ is entered into a unit capacitor C. Two pieces of data on the second place are entered into terminals each having two-fold capacity 2C, therefore, one input is counted two.

Figure 29:
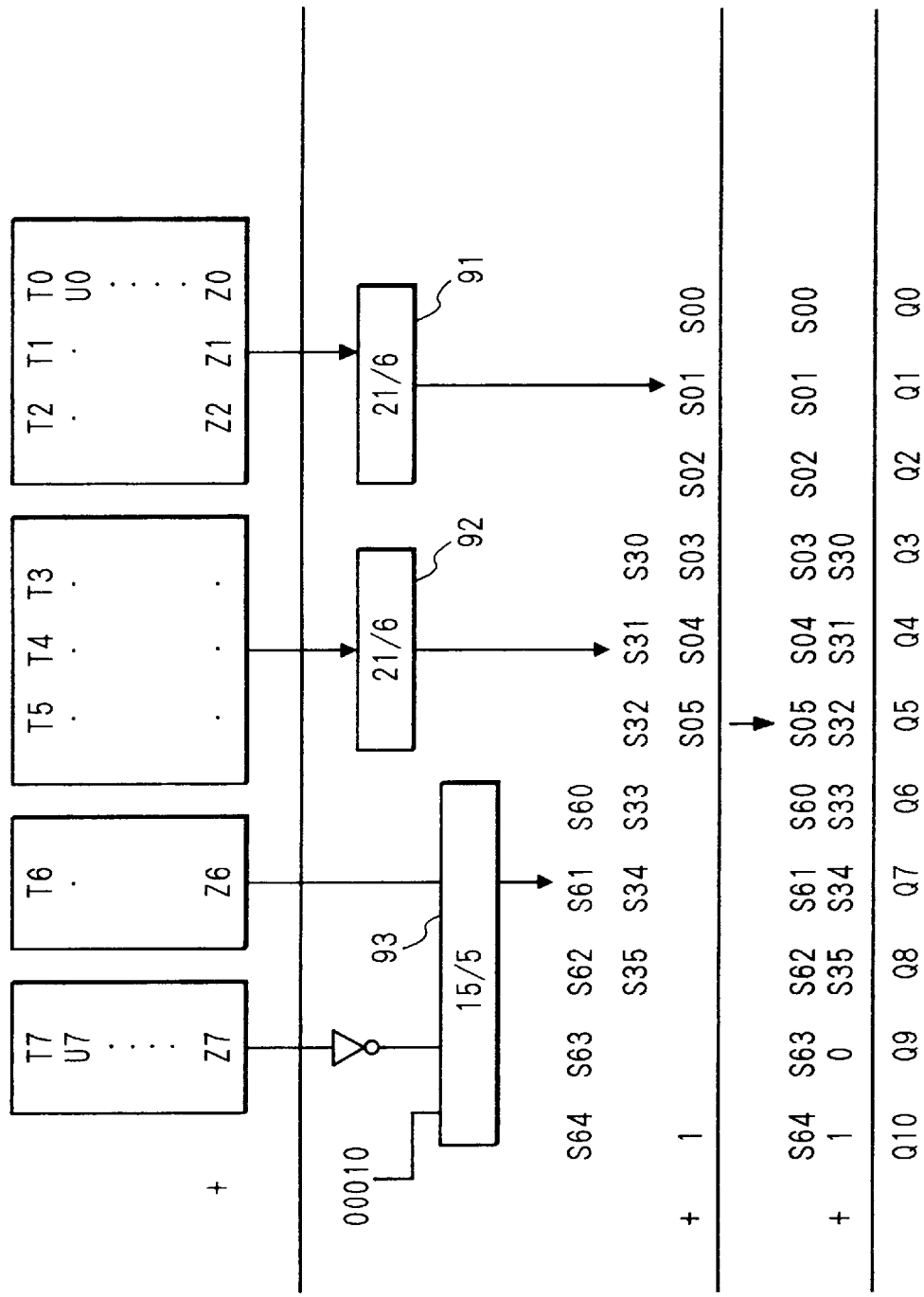
FIG. 29 is a drawing illustrating an adder of the 12th embodiment.

For example, in the 10th embodiment, as shown in FIG. 29, NDs for adding data on places whose weights are 0, 1, and 2 can be integrated into an ND91, and in the same manner, areas on places whose weights are 3, 4, and 5 be integrated into an ND92. Although the number of the inputs and that of the outputs are indicated by numbers for NDs in FIG. 29, any ND can be used only if it can count up to 49 pieces of maximum 21-inputs. Respective NDs generate 6-bit outputs. In the ND91, data on place 0 is entered into the unit capacitor C, data on the first place is entered into a 1C, and data on the second place is entered into a ($2^2$=) 4C.

In addition, a flag bit (the 8th bit) can be combined with a numeric bit (the 7th bit, MSB (most significant bit)). In FIG. 29, the flag bit is entered into an ND93 through an inverter. Although it is passed through the inverter after a passage through the ND for the inversion in the embodiment mentioned above, either of the orders can be applied. According to this embodiment, however, the total capacity of the NDs is assumed to be ($2^n$–1)C (n is an integer).

Further, (00010) for a 2's complement is added to the flag bit to be entered as a weight to the capacitor 2C. The numeric bit is entered to the capacitor C. As shown in FIG. 29, each output is added to 1 on the 11th bit for a 2's complement and two data sequences can be deleted at a time, therefore, only two data sequences should be added. The processing becomes more parallel by using weighting, which contributes to increasing the operation speed and reducing required elements and power consumption.

Although contiguous places are integrated in the example given for description of general weighting in this embodiment, the invention is not limited to this method, and any of more efficient methods can be flexibly used such as discontinuous weighting (for example, when data on the $2^0$ place and on the $2^2$ place are integrated to be entered) or dividing data on one place to enter it with different weights for different NDs.

[13th Embodiment]

In this embodiment, an addition method for a plurality of multiple bit data is described by giving an example of adding seven 8-bit data sequences.

Figure 30:
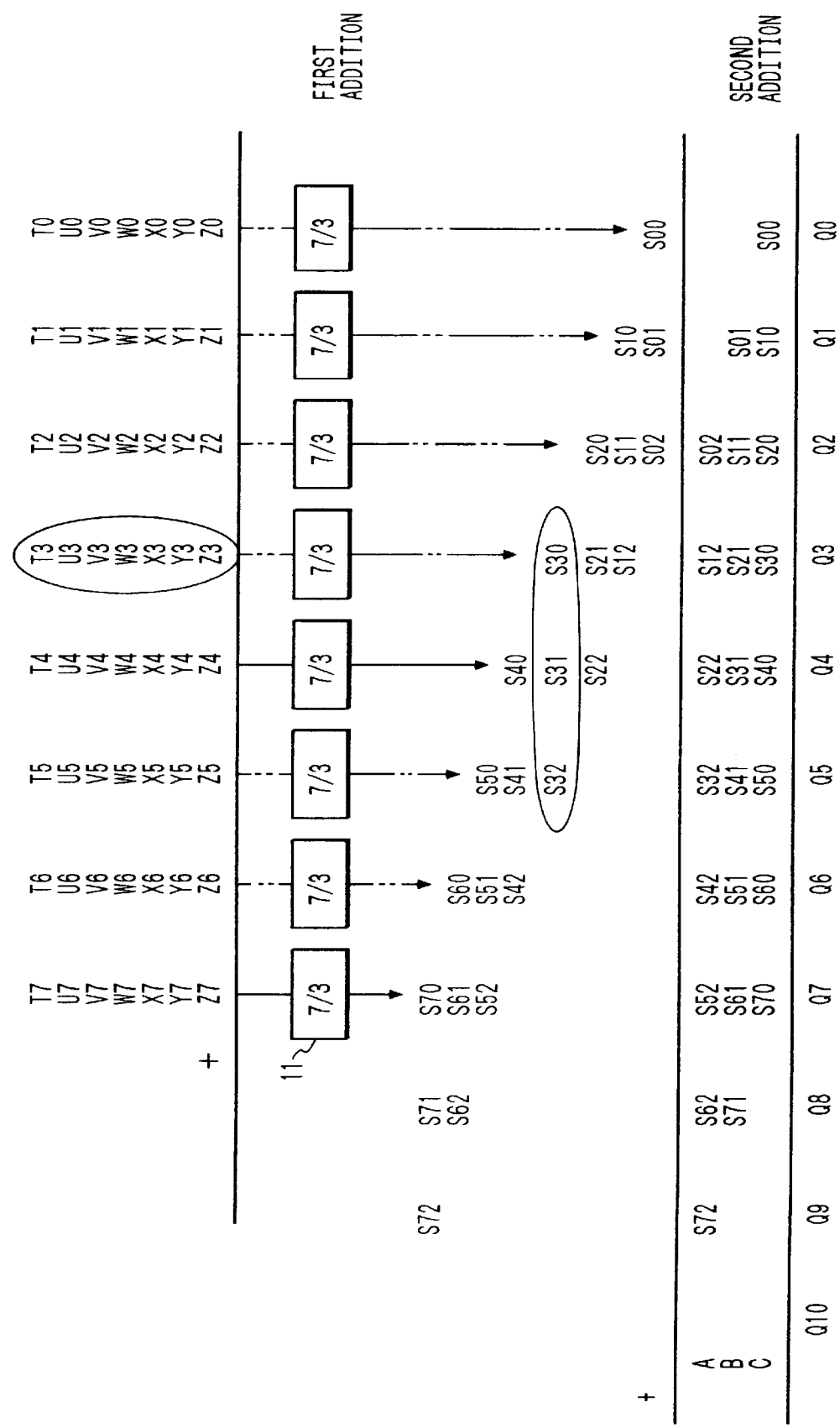
FIG. 30 is a drawing illustrating an adder of the 13th embodiment.

Referring to FIG. 30, this embodiment is illustrated. In this embodiment, a batch addition is made for data on respective places of seven 8-bit data sequences to add them, first. This addition is executed by NDs.

In the same manner as for the second embodiment, the operation speed of this addition step is determined by an operation speed of a single ND, eight NDs are used, and the maximum number of the inputs to the NDs is equal to seven. In addition, it is also the same as for the above embodiments that an addition without carries is performed in parallel which leads to a higher operation speed and that there can be various numbers of the bits of a plurality of multiple bit data.

A desired addition result Q is obtained at a high speed by performing a second addition step for adding all of the eight addition results represented in the binary mode subsequently.

Processing can be more efficient not by adding all data simply, but by integrating a plurality of data into single data in performing this addition step. Paying attention to the batch addition results MSBs in FIG. 30 from this viewpoint, an expression Si2($0 \leq i \leq 7$) is obtained for each and there are no common data, therefore, an expression is obtained for the data sequences as follows:

$$2^2 \sum_{i=0}^{7} Si2 \cdot 2^i$$

Respective data on the subsequent place and LSBs (least significant bit) can be also expressed by a single data sequence in the same manner. No operation is required for a step in which these data sequences are generated.

The above step will be explained in a general description below. A batch addition of I4 (I=T, U, - - - , Z) on the third place generates three pieces of data S30, S31, and S32, and respective places are 3+0, 3+1, and 3+2. A batch addition for the mth place (m$\leq$1) generates data on the (m+n)th place ([$Log_2$(IN)]$\geq$n$\geq$0 (IN: Data count), 2$\geq$n$\geq$0 (IN=7)). A batch addition for the m'th (m'$\neq$m) place generates data on the (m'+n)th place in the same manner. Since m+n$\neq$m'+n, there are no common places in the data. Accordingly, they can be integrated into single data without any operation. With making the operation more efficient like this, data can be integrated into three data A, B, and C in the example shown in FIG. 30. It is the same as for the second embodiment that no operation is performed in this processing with only wiring as processing in the circuit though it is treated as a step on its algorithm.

In this step, eight results of the addition can be converted to three 8-bit data sequences. A delay time is so short that it can be ignored in comparison with other steps. In the end, by adding three 8-bit data sequences, a final operation result can be obtained. Since three 8-bit data sequences are used in the example of FIG. 30, a final result of the addition can be obtained by a passage of full adders in only two stages as shown in FIG. 5 and a plurality of multiple bit data can be added at a high speed.

Next, this embodiment is described below for a general operation in which maximum n-bit data sequences are added by m pieces. The result of addition output from n NDs has maximum [$Log_2$m] bits, therefore, it can be converted to [$Log_2$m] data sequences. In the end, by adding [$Log_2$m] data sequences, a final operation result can be obtained. The number of full adder passage stages can be expressed by $\lfloor log_2[Log_2 m] \rfloor$. From the above expression, the number of full adder passage stages can be kept to be low even if the number of the multiple bit data sequences becomes higher. It is apparent that this efficient method can be applied to two or more pieces of data.

[14th Embodiment]

Figure 31:
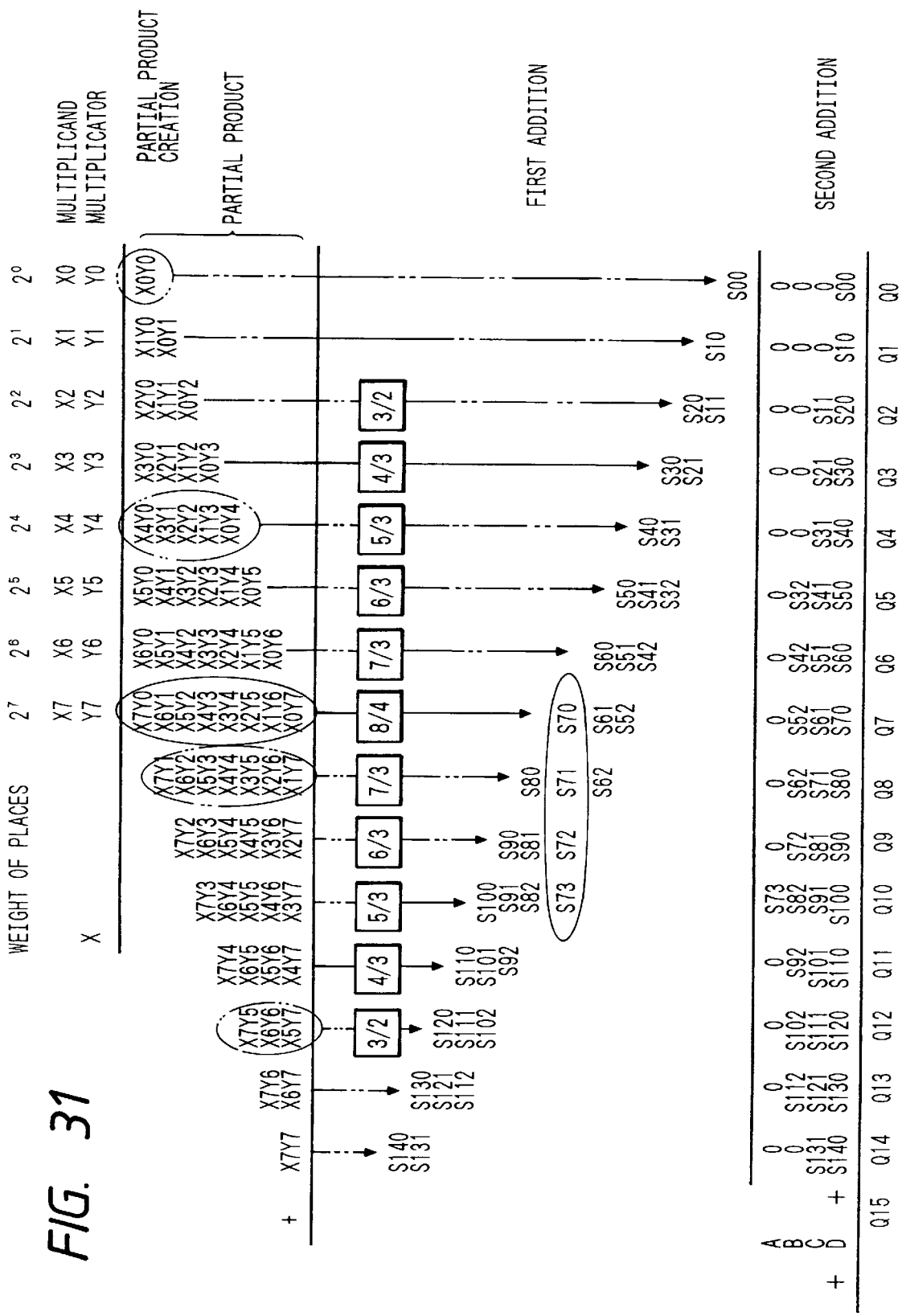
FIG. 31 is a drawing illustrating a multiplier of the 14th embodiment.

In this embodiment, a multiplication between multiple bit data is described by giving an example in FIG. 31. The description is made below by giving an example of an (8×8)-bit multiplier, and it can be expanded to a general (m×n)-bit multiplication.

Assume that X×Y=Q where X($X_7 X_6 X_5 X_4 X_3 X_2 X_1 X_0$) is a multiplicand and Y($Y_7 Y_6 Y_5 Y_4 Y_3 Y_2 Y_1 Y_0$) is a multiplicator. As described in FIGS. 3A and 3B, Q is expressed with maximum 16 bits. Q has the maximum m+n bits for m×n bits.

As shown in FIG. 31, a partial product X×$Y_j$ is created first. Although partial product is calculated by taking AND between each bit $X_i$ of a multiplicand X and a multiplicator $Y_j$ like a general CMOS multiplier, any of other methods, for example, the method described in the third embodiment can be also used.

Subsequently, the sums of the partial products on respective places in FIG. 31 are added for each place by NDs at a time. Since processing is performed in parallel in this addition step, it is suitable for a high speed operation. In an (m×n)-bit multiplication circuit, (m+n–1) units of NDs are used. The maximum number of the inputs to the NDs is equal to Min(m,n). In an example of an (8×8)-bit multiplier shown in FIG. 31, 15 NDs are used. Maximum eight inputs are made (for operation $X_7Y_0+X_6Y_1+X_5Y_2+X_4Y_3+X_3Y_4+X_2Y_5+X_1Y_6+X_0Y_7$).

The number of the NDs is applied when NDs are used for locations where NDs can be replaced by wiring in one-input one-output arrangement. If the replaceable NDs are omitted, (m+n–3) NDs are used. Further, if NDs are used only for three or greater inputs excluding the locations where NDs can be replaced by two-input two-output HAs (Although an HA is a kind of an ND, it is distinguished from an ND), (m+n−5) NDs can be used.

Generally, for three or greater inputs, an additive operation becomes complicated and the operation speed is lowered due to propagation of carries which may occur particularly in this state. Since this embodiment has a feature of performing an operation without carries by adding data together, a high speed operation is achieved.

By performing a second addition step for adding all of (m+n−1) addition results indicated in the binary mode after that, desired multiplication result Q is obtained at a high speed.

Further to reduce the number of the additions, data is rearranged according to the 13th embodiment. It is explained by using the example in FIG. 32. The sum of the partial products of the 8th place is equal to 4 (bits). Due to 3-bit outputs from other batch additions for an S73, there are no data satisfying the conditions. Accordingly, it is considered as single data (A). As for an S72, the partial products from the 4th to 12th places are 3-bit data and there is data with no common places to the S72. It corresponds to a 9-bit data (B) represented by Si2 ($3 \leq i \leq 11$). In the same manner, data can be integrated into one data sequence as Si1 and Si0, and the data can be rearranged to four pieces of data (A, B, C, D) finally. As mentioned above, no operation is performed in this processing with only wiring as processing in the circuit though it is treated as a step on its algorithm.

A delay time is so short that it can be ignored in comparison with other steps. In this step, (m+n−1) pieces of addition results can be converted to $[\text{Log}_2(\text{Min}(m,n))]$ pieces of data sequences. A final operation result can be obtained by adding $[\text{Log}_2(\text{Min}(m,n))]$ pieces of data sequences as the last processing.

Figure 32:
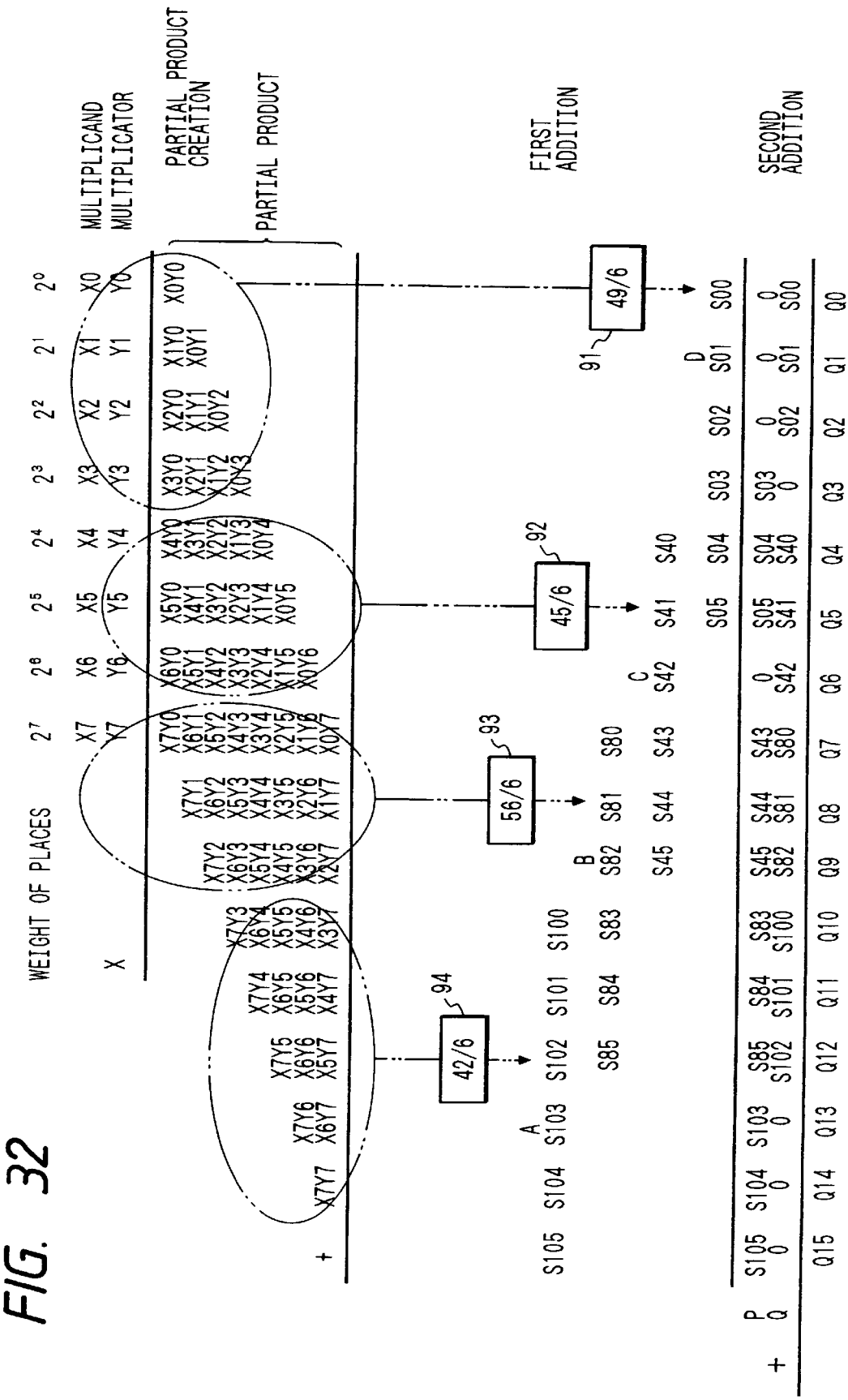
FIG. 32 is a drawing illustrating another multiplier of the 14th embodiment.

Since four pieces of data is used in the example of FIG. 32, a final product can be obtained by a passage of full adders in only two stages as shown in FIG. 9. In general, the number of full adder passage stages can be expressed by $\lfloor \log_2[\text{Log}_2(\text{Min}(m,n))] \rfloor$ by in the same manner, as for the third embodiment. Therefore, even if m and n are increased, the number of full adder passage stages can be kept to be low according to the graph in FIG. 10. In other words, even if multiple bits are increased, the high speed operation is achieved with less elements and less power consumption. In addition, for additions of the S73 and Si2, 4-bit (5-bit output including a carry) adders can be used since the addition is made for the 11th or higher places (S73+S112 S102 S92 S82). This operation method can be applied to a multiplication circuit having the same configuration shown in FIG. 12 which is the same as for the third embodiment.

According to this embodiment, NDs having the same configuration as for FIG. 13 can be used. With this circuit configuration, the number of the HIGH LEVEL inputs can be converted to a binary number with three places to be output out of a plurality of inputs as shown in Table 1 in FIG. 13. In this circuit, the values converted to binary numbers are output from MSBs, and respective MSBs are output at almost the same timing. If these NDs are used, MSBs output at almost the same timing can be integrated into single data, which is more effective for data compression in the above operation.

By using the above configuration of the multiplication circuit, a high speed multiplier can be formed due to parallel operations with less elements and lower power consumption.

[15th Embodiment]

In the same manner as for the fourth embodiment, the configuration in FIG. 17 can be applied to the ND sections for performing the parallel batch additions described in the above 13th and 14th embodiment. It makes it possible to convert the number of the inputs of high level signals out of a plurality of inputs to a binary number with three places to be output in an extremely small circuit with low power consumption as shown in Table 1 in FIG. 17. In this circuit, values converted to binary numbers are output from MSBs. Although other description is the same as for the 13th and 14th embodiments, this configuration makes it possible to form a high speed semiconductor device due to parallel operations with further less elements and lower power consumption because of the size reduced.

[16th Embodiment]

In this operation method, a plurality of NDs are integrated out of the 15 NDs in the 13th embodiment in the same manner as for the fifth embodiment. The NDs are assumed to have a configuration in FIG. 21.

Although the number of the inputs and that of the outputs are indicated by numerals for NDs in FIG. 21, any ND can be used only if it can count up to 56 inputs. For wiring, up to 21-inputs are applied. Respective NDs generate 6-bit outputs. Subsequently, data is integrated with rearrangement, and S105, S85, S45, and S05 corresponding to MSBs are treated according to the rules of the 13th embodiment. S104, S84, S44, and S43 on the subsequent place can be integrated into single data and it has no places common to the MSB data sequence, therefore, they can be also integrated into one data sequence. Accordingly, the data can be integrated into two data sequences finally. Other description is the same as for the 13th and 14th embodiments, but this configuration of the multiplication circuit makes it possible to reduce the elements further, to reduce power consumption in a small-sized circuit, and to form a higher speed multiplier due to parallel operations and less addition stages.

Although contiguous places are integrated in the example of general weighting in this embodiment, the invention is not limited to this method, and any of more efficient methods can be flexibly used such as discontinuous weighting (for example, when data on the $2^0$ place and on the $2^2$ place are integrated to be entered) or dividing data on one place to enter it with different weights for different NDs (for example, dividing data on $2^8$ places into two classes and entering them into different NDs).

[17th Embodiment]

Figure 33:
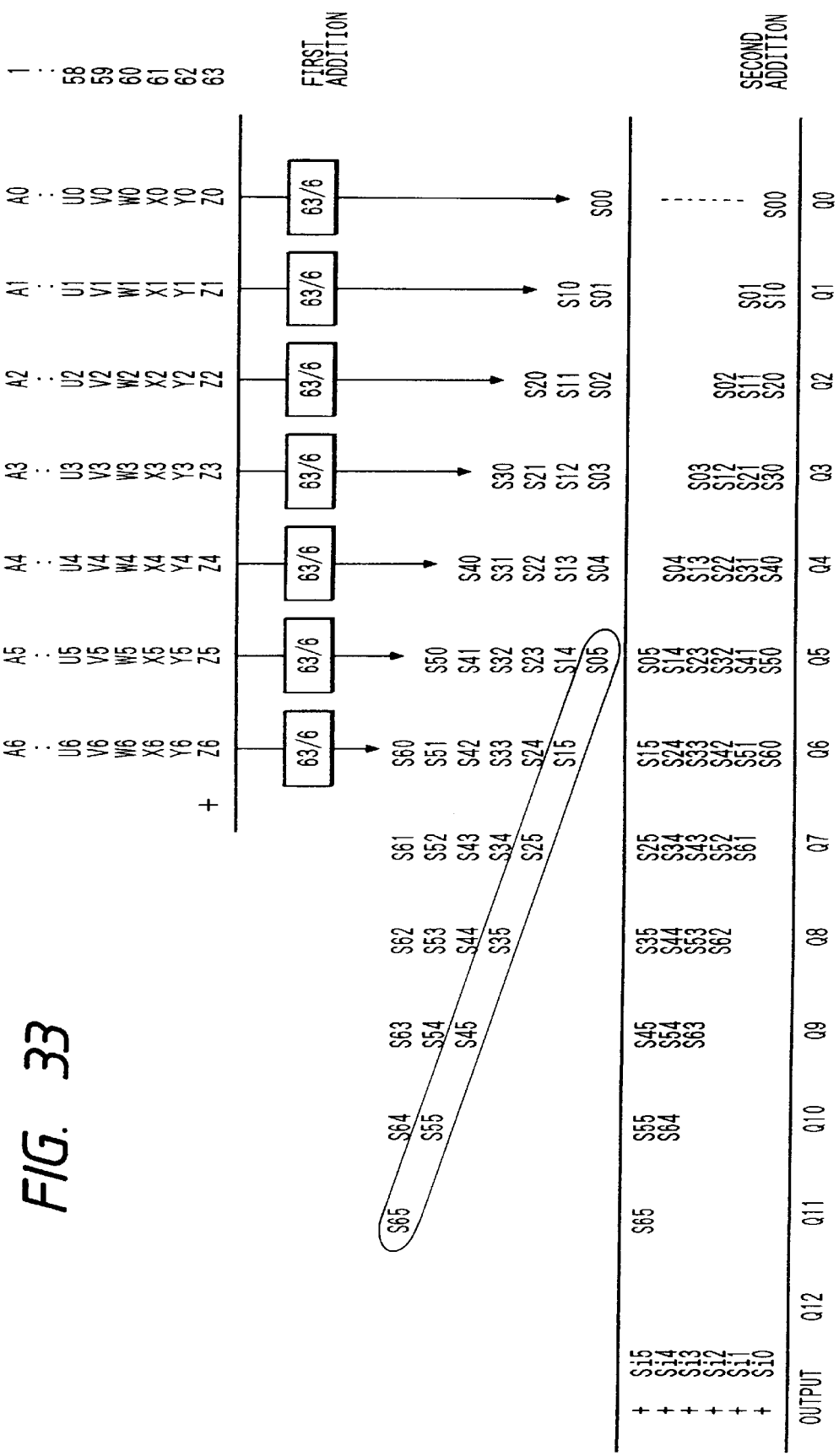
FIG. 33 is a drawing illustrating an adder of the 17th embodiment.

This embodiment is described below by giving an example in which 63 7-bit data sequences are added. FIG. 33 is an explanation diagram for this embodiment. First, data on respective places are added together to add 63 7-bit data sequences. This addition is performed in the same circuit as for the 14th to 16th embodiments. Since 7-bit data sequences are used, seven NDs are used in this embodiment. The operation speeds of respective NDs are identical, therefore, the entire operation speed is determined by an operation speed of a single ND. In addition, 63 7-bit data sequences are added in this operation, and therefore, the number of the inputs to the NDs is equal to 63. The NDs generates 6-bit output data from an MSB in order. By performing an addition with no carries in parallel with NDs, a high speed operation is achieved. Although the example is shown only with 63 7-bit data sequences for the addition in this embodiment, the invention is not limited to it, and there can be various numbers of the bits in a plurality of multiple bit data.

Subsequently, a desired addition result Q is obtained at a high speed by performing a second addition step for adding all of the eight addition results represented in the binary mode.

This addition step is described below. As mentioned above, the NDs outputs data from an MSB in order, and MSBs from all NDs and data on the subsequent places are output at the same timing. As for a description of an MSB, the MSB from an ND for the mth place (m≧1) is output at the (m+5)th place. In other words, the MSBs from an ND for the mth place under the condition of 1≦m≦7 do not have any common places, and they can be integrated into single data without any operation (areas enclosed by frames in FIG. 33). In the same manner, an output on a place one lower than an MSB can be combined with data on the (m+4)th place, data on the next place be combined with data on the (m+3)th place, and the subsequent data can be integrated like this in the output order sequentially. In FIG. 33, each MSB can be represented by $Si5(0 \leq i \leq 6)$ and the subsequent data be represented by $Sik(0 \leq i \leq 6)$, therefore, six pieces of data under the condition of $(0 \leq k \leq 5)$ are sequentially output. These data are added together. Due to the above data rearrangement, MSB data Si5 and data of the subsequent place Si4 are output, and then an operation of Si5+Si4 can be executed while each ND calculates Si3. In the same manner, after Si3 and Si2 are output, an operation of Si3+Si2 can be performed while an ND calculates Si1. Accordingly, a high speed operation can be achieved without awaiting all outputs of the results from the NDs by starting the second addition step.

Figure 34:
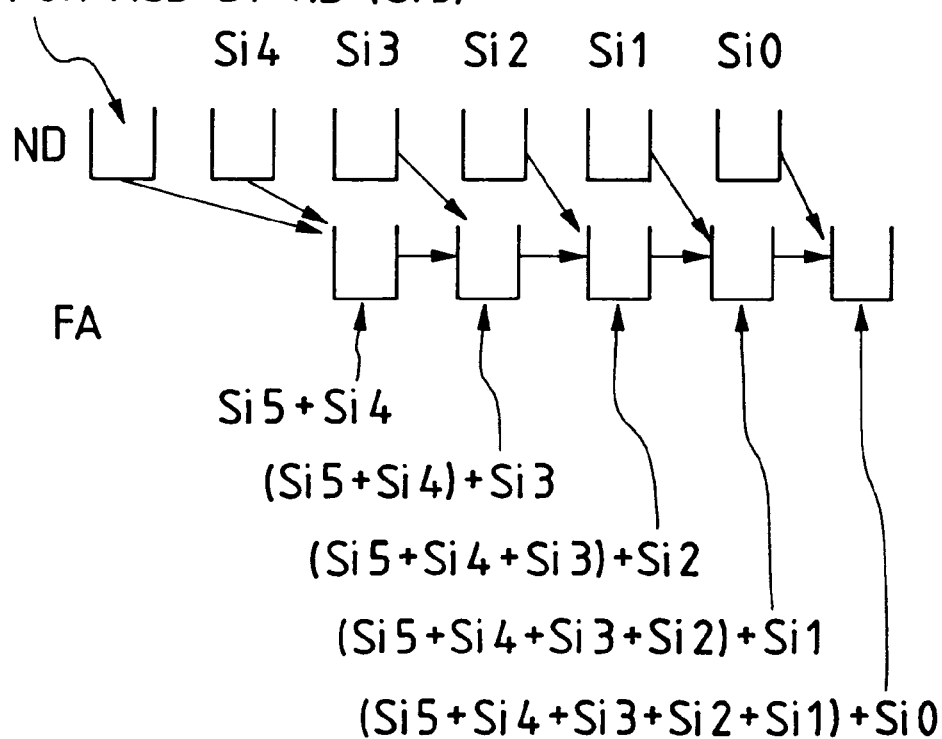
FIG. 34 is a drawing illustrating another adder of the 17th embodiment.

As an example of an extreme case, if an operation of Si5+Si4 is executed during calculation of Si3, Si3 is added to a result of the (Si5+Si4) during calculation of Si2, and then an addition is further executed sequentially as shown in FIG. 34, the entire operation speed can be increased and the elements can be reduced because only one adder is required. There is an optimum value between an ND operation time and the second addition time, but the second addition can be performed in parallel with the ND addition, or a batch addition of data on common places, which leads to less elements, therefore lower power consumption as well as a higher operation speed.

[18th Embodiment]

Figure 35:
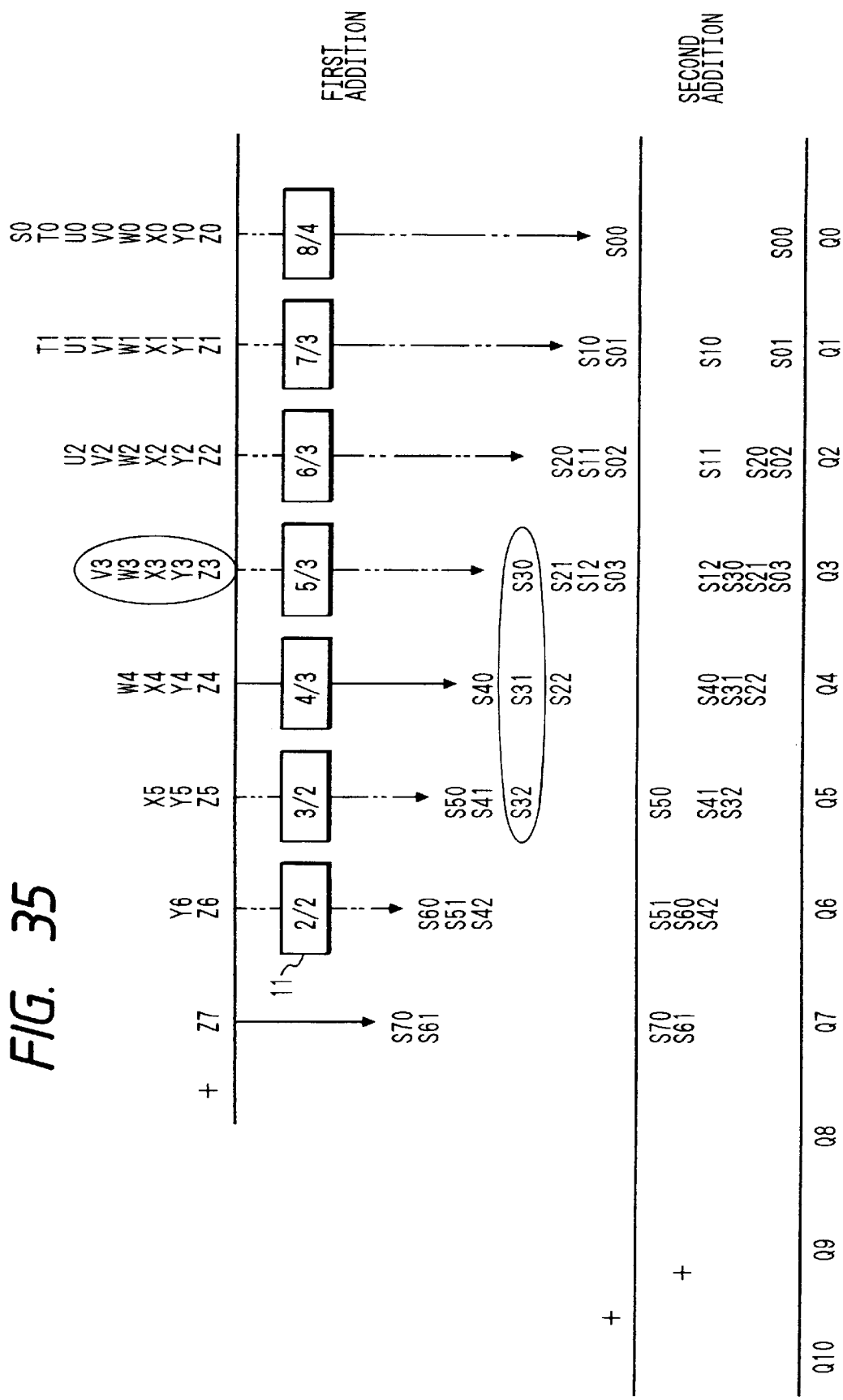
FIG. 35 is a drawing illustrating an adder of the 18th embodiment.

This embodiment is explained below by giving an example of adding a plurality of data sequences having various numbers of the bits. FIG. 35 is an explanation diagram of this embodiment. Eight n-bit (8≦n≦1) data sequences are added here. First, data on each place is added together for eight n-bit data sequences. The first addition is performed by NDs.

Maximum 8-bit data sequences are used in this embodiment, therefore, eight NDs are used (z7 indicates a number, and seven NDs are required. Y6+Z6 indicates two inputs and an HA can be used, but an ND is used here). Since processing is performed in parallel in this addition step according to this embodiment, the operation speed is determined by the slowest operation speed of an ND. Maximum eight inputs are entered into an ND since eight data sequences are added in this operation. The operation speed of respective NDs is not identical and it is regulated by an eight-input ND.

Since a carry occurs in a general additive operation, the operation speed is decreased by the carry propagation. This embodiment, however, has a feature of adding data in parallel without carries, so that higher operation speed is achieved. Although this embodiment shows an example of adding eight data sequences having various numbers of the bits from 1 to 8 bits different each other, it will be understood that the invention is not limited to this example.

A desired addition result Q is obtained at a high speed by performing a second addition step for adding all of the eight addition results represented in the binary mode subsequently.

Processing can be more efficient not by adding all data simply, but by integrating a plurality of data into single data in performing this addition step. Paying attention to the batch addition results in FIG. 35 from this viewpoint, for example, places of S70, S51, and S50 do not overlap at all and they can be integrated into single data without any operation. It is the same as for the second embodiment that no operation is performed in this processing with only wiring as processing in the circuit though it is treated as a step on its algorithm and that the delay time is so short that it can be ignored in comparison with other steps. With this efficiency method, two pieces of data can be integrated into single data in the example of FIG. 35. The operation, however, can be more efficient in the same manner only if there are two or more pieces of data.

For further increasing the operation speed, the first and the second addition steps are executed in parallel. In FIG. 35, data on the 8th place or S70(Z7) is output earliest as data from an ND, data on the 7th place S61 and S60 are output, and the subsequent data is output in the order of the 6th, the 5th, - - - places. Accordingly, in the example of FIG. 35, calculations for S70, S51, S50+S61, and S60 are executed, for example, without awaiting the completion of calculating data on the first place. After that, the subsequent output results S42, S41, S40, S12, S11, and S10 are added (Practically, S42 and S41 are added). The ND operation corresponding to the first addition step can be executed in parallel with the operation corresponding to the second addition step, which leads to a higher operation speed.

[19th Embodiment]

In this embodiment, a multiplication between multiple bit data is explained by giving an example in FIG. 31. The description is made below by giving an example of an (8×8)-bit multiplier, and it can be expanded to a general (m×n)-bit multiplication.

Assume that X×Y=Q where $X(X_7 X_6 X_5 X_4 X_3 X_2 X_1 X_0)$ is a multiplicand and $Y(Y_7 Y_6 Y_5 Y_4 Y_3 Y_2 Y_1 Y_0)$ is a multiplicator. As described in FIGS. 3A and 3B, Q is expressed with maximum 16 bits. Q has the maximum m+n bits for m×n bits.

As shown in FIG. 31, a partial product $X \times Y_j$ is created first. Although partial product is calculated by taking AND between each bit Xi of a multiplicand X and a multiplicator Yj like a general CMOS multiplier, any of other methods, for example, the method described in the third embodiment can be also used.

Subsequently, the sums of the partial products on respective places in FIG. 31 are added for each place by NDs at a time. Since processing is performed in parallel in this addition step, it is suitable for a high speed operation. In an (m×n)-bit multiplication circuit, (m+n−1) units of NDs are used. The maximum number of the inputs to the NDs is equal to Min(m,n). In an example of an (8×8)-bit multiplier shown in FIG. 31, 15 NDs are used. Maximum eight inputs are made (for operation $X_7Y_0+X_6Y_1+X_5Y_2+X_4Y_3+X_{3y4}+X_2Y_5+X_1Y_6+X_0Y_7$).

The number of the NDs is applied when NDs are used for locations where NDs can be replaced by wiring in one-input one-output arrangement. If the replaceable NDs are omitted, (m+n−3) NDs are used. Further, if NDs are used only for three or greater inputs excluding the locations where NDs can be replaced by two-input two-output HAs (Although an HA is a kind of an ND, it is distinguished from an ND), (m+n−5) NDs can be used.

Generally, for three or greater inputs, an additive operation becomes complicated and the operation speed is lowered due to propagation of carries which may occur particularly in this state. Since this embodiment has a feature of performing an operation without carries by adding data together, a high speed operation is achieved.

By performing a second addition step for adding all of (m+n−1) addition results indicated in the binary mode after that, desired multiplication result Q is obtained at a high speed.

Further to reduce the number of the additions, data is integrated in the same manner as for the 18th embodiment, which results in rearrangement of four pieces of data (A, B, C, D). As mentioned above, no operation is performed in this processing with only wiring as processing in the circuit though it is treated as a step on its algorithm.

A delay time is so short that it can be ignored in comparison with other steps. The configurations in FIGS. 13 and 12 can be applied to NDs and a multiplication circuit, respectively. Pipeline processing can be performed in FIG. 13 as described in the third embodiment.

The number of the majority logic circuit blocks required by the NDs is expressed by $[Log_2 n]$, where n is the number of the inputs to the NDs. As for the number of the inputs to the NDs, a value is applied from 1 to Min(m,n) in an m×n-bit multiplier, and apparently its operation time becomes the longest at an ND whose input count is Min(m,n) which is the maximum number of the inputs. It is because the number of the majority logic circuit stages is increased for the number of the inputs n with $[Log_2 n]$. It is apparent, however, that the number of the stages is not increased significantly when the number of the bits is increased since it increases with a log function.

Since the operation is performed in parallel, it terminates with a plurality of NDs 74 at an operation speed of the NDs with the maximum number of the inputs Min(m,n). In this configuration, S73(A) is output first. Subsequently, it is added to B which terminates the operation earlier, but other outputs are not completed at this time. In the same manner, C is added before D is completely output. The operation can be performed at a high speed due to a parallel processing like this.

This ND configuration leads to a higher operation speed due to a parallel operation and to NDs with lower power consumption due to less elements required, so that the characteristics of the operation methods in the above embodiments can be significantly improved.

There is a step for integrating data output from a plurality of NDs into one data sequence on an algorithm, but no processing is performed in circuits as mentioned above, and therefore, there are no circuits corresponding to this step in FIG. 12.

The above multiplier configuration makes it possible to form a high speed multiplier due to a small number of elements, low power consumption, and a parallel operation. Additionally, the configuration in FIG. 17 can be applied to NDs as described in the fourth embodiment.

[20th Embodiment]

According to this embodiment, a plurality of NDs are integrated out of the 15 NDs in FIG. 31 described in the 19th embodiment for an operation. Although the operation method is explained by giving an example of adding two (8×8) multiplication results, the invention is not limited to this example.

Its example is shown in FIG. 20 on the basis of a 2×2 majority logic circuit applied to a 2×2 multiplier. In other words, it is a majority logic circuit in the first stage in FIG. 13 in the 19th embodiment. Data on the first place ($x_0 y_0$ in a place of $2^0$) is entered into a unit capacitor C. Two pieces of data on the second place ($x_1 y_0$ and $x_0 y_1$ in a place of $2^1$) are entered into terminals each having two-fold capacity 2C, and therefore, one input is counted two. Further, data on the third place ($x_1 y_1$ in a place of $2^2$) is weighted 22 and one input is counted four.

Other description is the same as for the 19th embodiment and up to seven inputs are output in the binary mode with four inputs in each ND. By using this weighting method, the parallel batch addition function can be used more efficiently.

Figure 36:
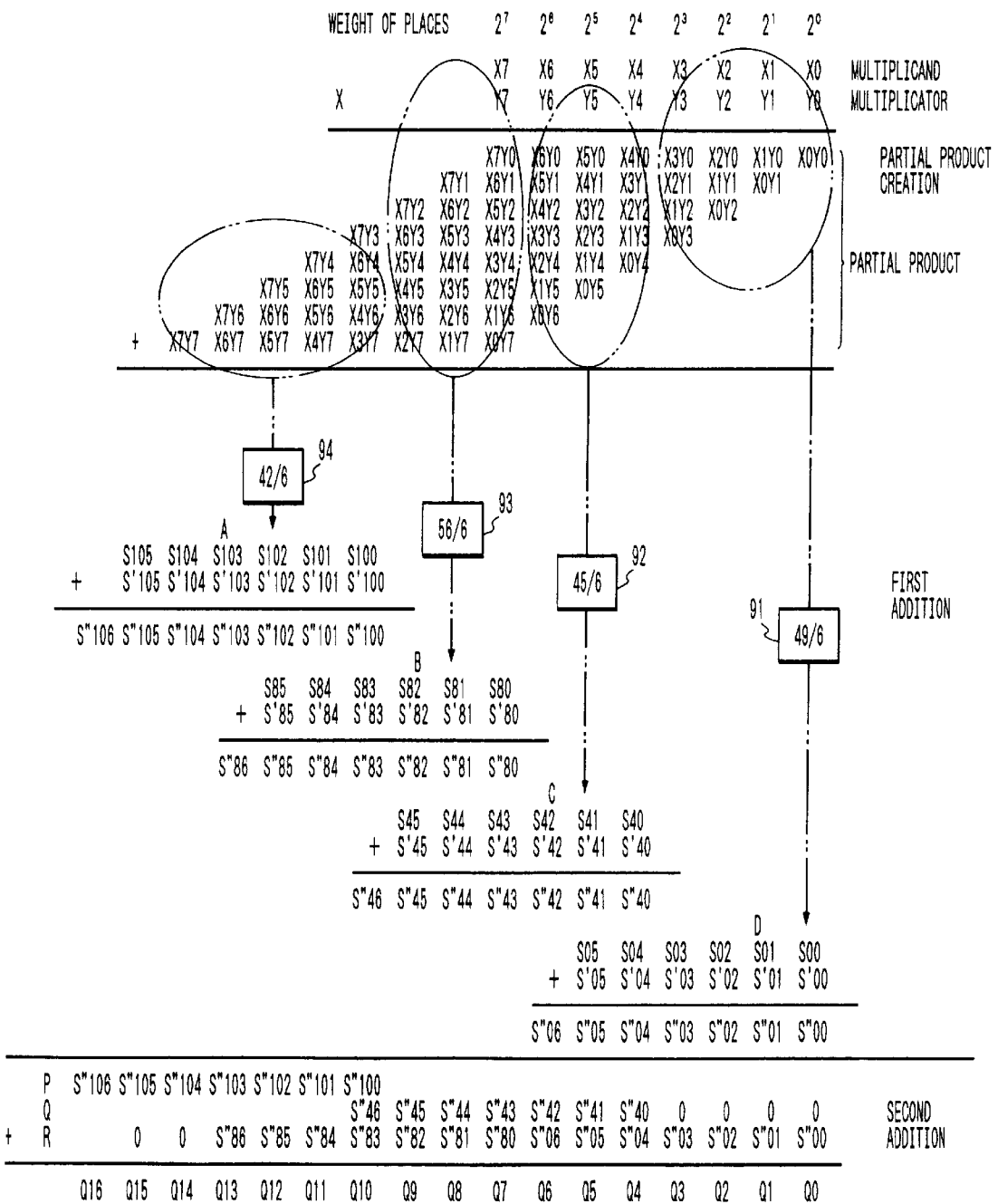
FIG. 36 is a drawing illustrating a multiplier of the 20th embodiment.

For example, in the 8×8 bit multiplier in the 19th embodiment, the NDs for adding data on places whose weights are 0, 1, 2, and 3 are integrated into an ND91 as shown in FIG. 36, and the areas on places whose weights are (4, 5, 6), (7, 8, 9), (10, 11, 12, 13, 14) are integrated into each area (ND92 to ND94 in FIG. 21).

Although the number of the inputs and that of the outputs are indicated by numbers for NDs in FIG. 36, any ND can be used only if it can count up to 56 inputs. For wiring, up to 21-inputs are applied. Respective NDs generate 6-bit outputs. Therefore, less NDs are required and the elements can be significantly reduced. In an addition of result Q' of other (8×8) multiplication, S105 is output, and S105' for S105 can be added while an ND94 calculates S104. It can be also applied to other data S85 and S45, and S104 and S104' can be added to their sum subsequently. The same calculation can be applied to S103 and S103' and a partial sum S" can be generated by an ND operation and a parallel operation.

In this embodiment, only three pieces of data P, Q, and R should be added finally. Furthermore, if S"46 from the ND92 is added to P separately, P and Q can be integrated into one data sequence, therefore, only two pieces of data should be added.

Accordingly, a high speed operation is achieved and the elements can be significantly reduced because an adder can be used repeatedly. Particularly, a use of NDs having the above majority logic circuit is effective due to its clock operation. This configuration of the multiplication circuit makes it possible to reduce the elements further, to reduce power consumption in a small-sized circuit, and to form a higher speed multiplier due to parallel operations and less addition stages.

Although contiguous places are integrated in the example of general weighting in this embodiment, the invention is not limited to this method, and any of more efficient methods can be flexibly used such as discontinuous weighting (for example, when data on the $2^0$ place and on the $2^2$ place are integrated to be entered) or dividing data on one place to enter it with different weights for different NDs (for example, dividing data on $2^8$ places into two classes and entering them into different NDs).

[21st Embodiment]

In this embodiment, the above operation methods used for a DSP are described by giving an example of a data processor having a semiconductor device for performing the operation.

Although a DSP for a fixed-point operation which is a typical DSP is explained in this embodiment, it will be understood that the invention is not limited to this and it can be applied to other types of DSPs and CPUs.

The processor in the above embodiments is extremely compatible since it can be formed by using a general semiconductor MOS transistor. Accordingly, a previous semiconductor device can be used as its substitute with an attachment of an input-output buffer.

Figure 37:
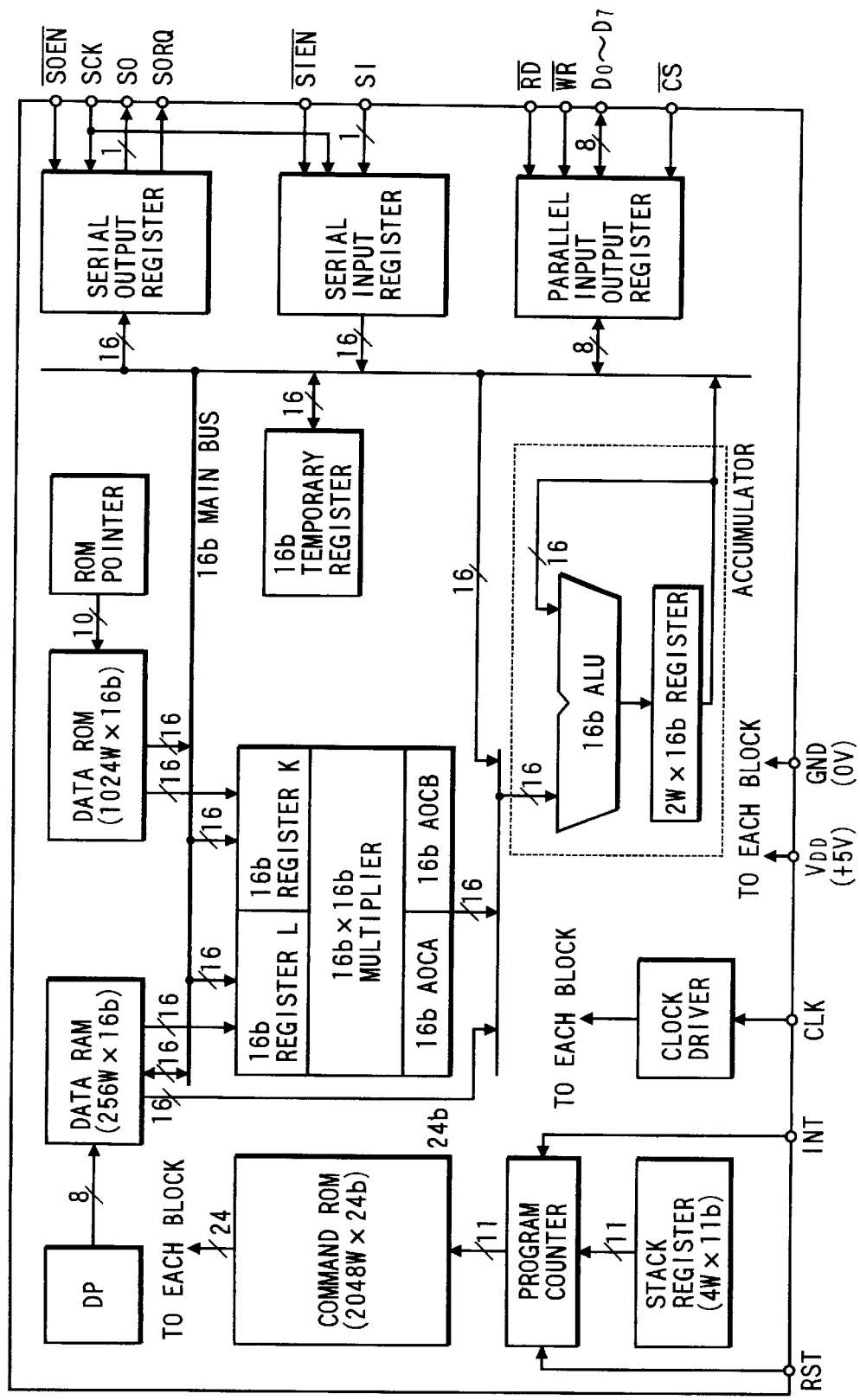
FIG. 37 is a drawing illustrating a DSP of the 21st embodiment.

The configuration of the DSP according to this embodiment is illustrated in FIG. 37. A multiplier and an accumulator are mounted on the DSP as operation units. The multiplier is used to multiply two pieces of 16-bit data to obtain 31-bit outputs. The accumulator comprises a 16-bit arithmetic and logic unit (ALU) and a register for storing output signals from the ALU.

There are four types of on-chip memories described below. A data RAM is used to store input signals, whose address is specified by an 8-bit data pointer (DP). Lower four bits of the DP are treated by a 4-bit up-down counter, and upper four bits are treated by a 4-bit register. A data ROM is used for storing weighting factors. Its address is specified by a ROM pointer (RP) of the 10-bit down counter. A 16-bit temporary register (TR) is used for storing data temporarily. A command ROM is used for storing instructions, and its address is specified by an instruction counter (PC).

The signal reception or transmission with an external area of the DSP is performed via a 1-bit serial output register, a 1-bit serial input register, and an 8-bit parallel input-output register. A serial output or a serial input is executed in synchronization with serial input-output clocks (SCK) when an output control signal (SOEN) or an input control signal (SIEN) is 0 V, respectively. An 8-bit parallel output is performed after setting a write control signal (WR) or a read control signal (RD) to 0 V when a read/write control signal (CS) is 0 V. When data for eight bits to be output from an S0 is stored in the serial output register, an output ready signal (SORQ) is set to 5 V.

Respective instructions are read out from the ROM every clock cycle by a specification of the program counter (PC). An operation unit or a memory operates according to each decoding result of each read instruction.

If a reset pulse (RST) is applied, the pointer position of the PC is set to address 0 and the DSP starts its operation. If an interrupt pulse (INT) is applied subsequently, the PC pointer position is jumped to address 256. Selections of an input-output mode (8-bit or 16-bit) and those of whether or not an interrupt should be accepted are determined by a 16-bit status register (SR) in the 8-bit parallel input-output register. A clock driver generates 2-phase clocks T0 and T2 based on clock pulses (CLK) from an external area and supplies them to operation units or memories. Data is transmitted among the input-output register, the operation units, and memories via 16-bit buses.

In this embodiment, the above 16-bit×16-bit high speed multiplier is formed on the same circuit board and in the same process as for other logical circuits and memories.

Figure 38:
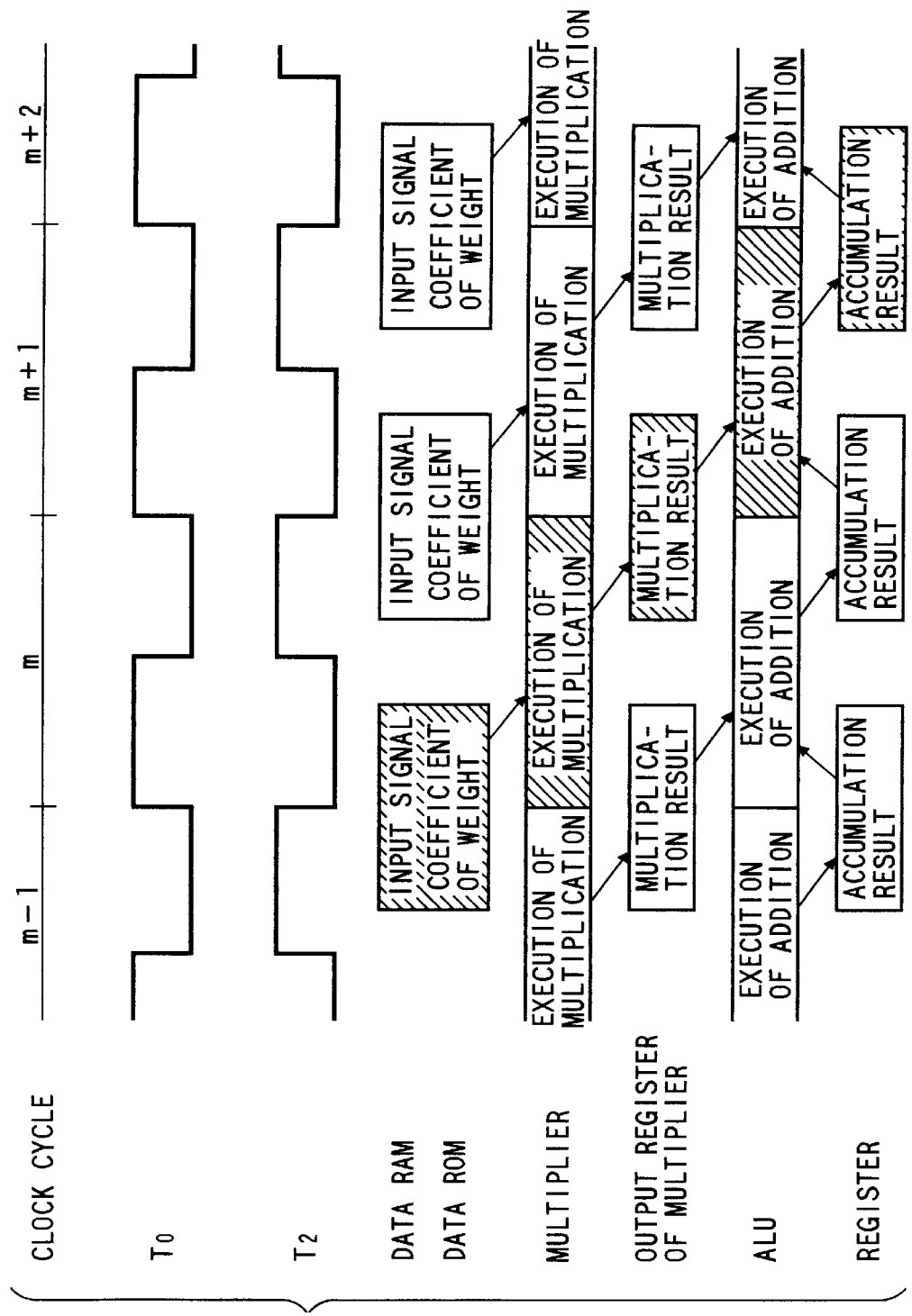
FIG. 38 is an operation timing diagram of the 21th embodiment.

The actual operation timing of this DSP is described below by giving an example of a 12-stage pipeline product and sum operations. FIG. 38 shows 2-phase clock pulses during operation. Reading input signals or weighting factors stored in the data ROM or data RAM are read out, in other words, supplying data to the multiplier is performed when $T_0$ of clock cycle m becomes high (5 V) (hereinafter, $T_0$ timing) and a multiplication is executed subsequently. The multiplication result is latched to a register at the $T_0$ timing of the next clock cycle (m+1). Simultaneously, a multiplication of subsequent data is processed in parallel in the multiplier.

Generally, an operation speed is decreased with an increase of the number of the bits and particularly a multiplication speed contributes to it. By using a high speed multiplier according to this embodiment, however, the operation speed can be increased, which leads to a remarkable improvement of the DSP performance. In addition, it has a merit that a general CMOS process can be formed. Although the operation method is applied to the DSP as a multiplier in this embodiment, the invention is not limited to this naturally, and it is apparent that it can be also applied to a variety of operation circuits containing an addition or multiplication process for a plurality of multiple bits as examples of other applications, taking into consideration its versatility that inputs and outputs or processes are the same as for general CMOS processes. This invention has a lot of effects such as reducing chip areas and lower power consumption as well as increasing the operation speed.

[22nd Embodiment]

Figure 39:
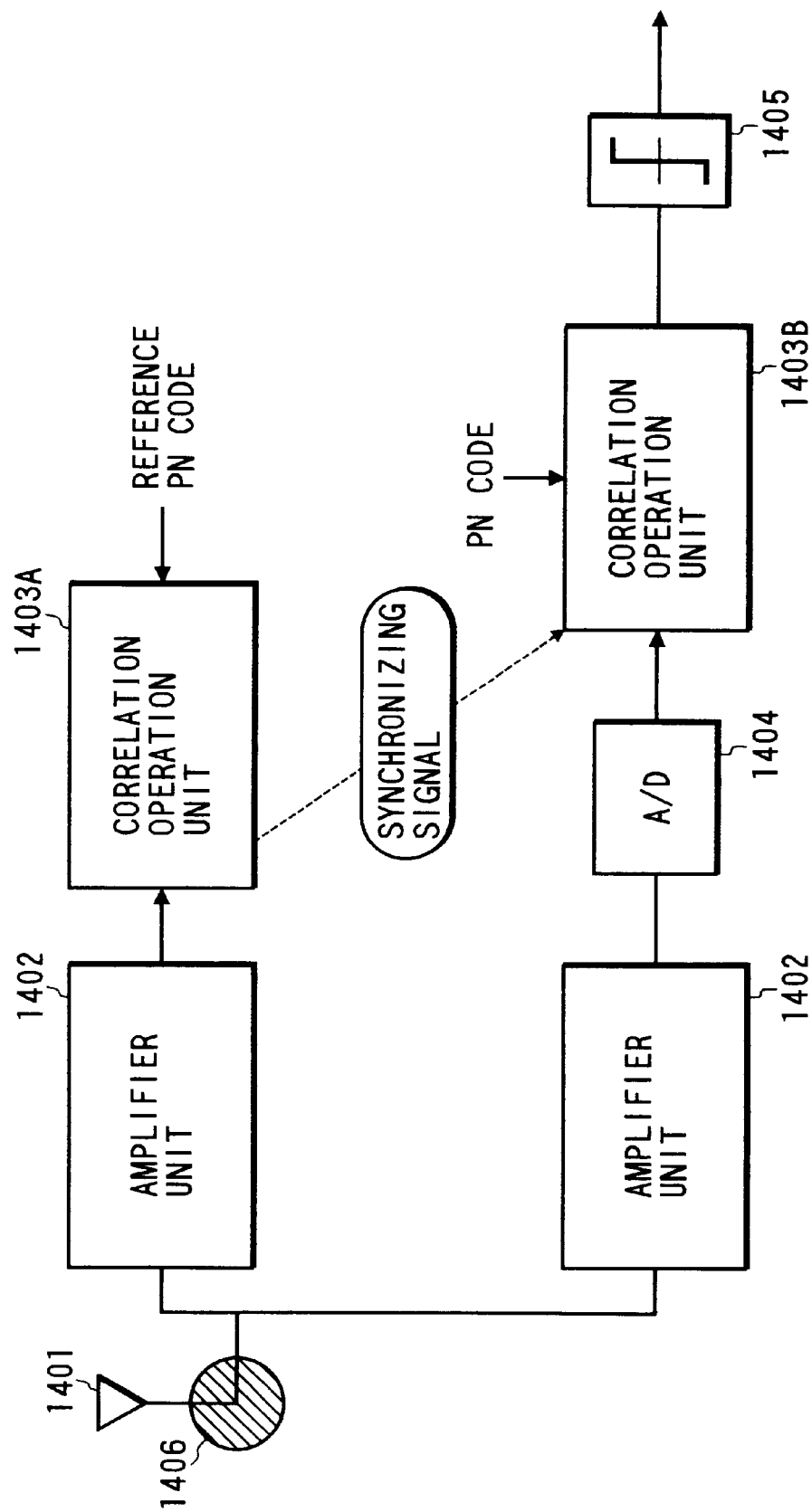
FIG. 39 is a drawing illustrating a reception circuit of the 22nd embodiment.

In this embodiment, the above processor is applied to a correlation operation unit in a reception circuit for a spread spectrum communication (SS communication). The configuration of this reception circuit is shown in FIG. 39. As shown in FIG. 39, the reception circuit comprises a reception antenna 1401, amplifier units 1402 for amplifying signals, correlation operation units 1403A and 1403B, an A/D conversion unit 1404, a selector 1405, and a detector 1406.

In the SS communication, signals are converted to multiple bit codes called PN codes and the PN codes are transmitted. In the reception circuit, similar PN codes previously stored are compared with the received signals and states of the highest correlation are detected to demodulate the transmitted signals.

Referring to FIG. 39, a signal received by the antenna 1401 is demodulated primarily by the detector 1406, and one is transmitted to the correlation operation unit 1403A and the other is converted to a digital signal in the A/D conversion unit and then entered to the correlation operation unit 1403B. The entered signal is compared with a PN code previously stored in the reception circuit, the correlation operation unit 1403A generates a synchronizing signal from the correlation degree between two signals, and the correlation operation unit 1403B calculates a correlation score in synchronization with the synchronizing signal. Then, the signal is demodulated based on the correlation score output from the correlation operation unit 1403B by the selector 1405.

Figure 45:
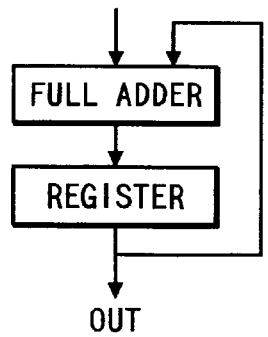
FIG. 45 is a drawing illustrating an example of a configuration of a conventional adder.
Figure 46:
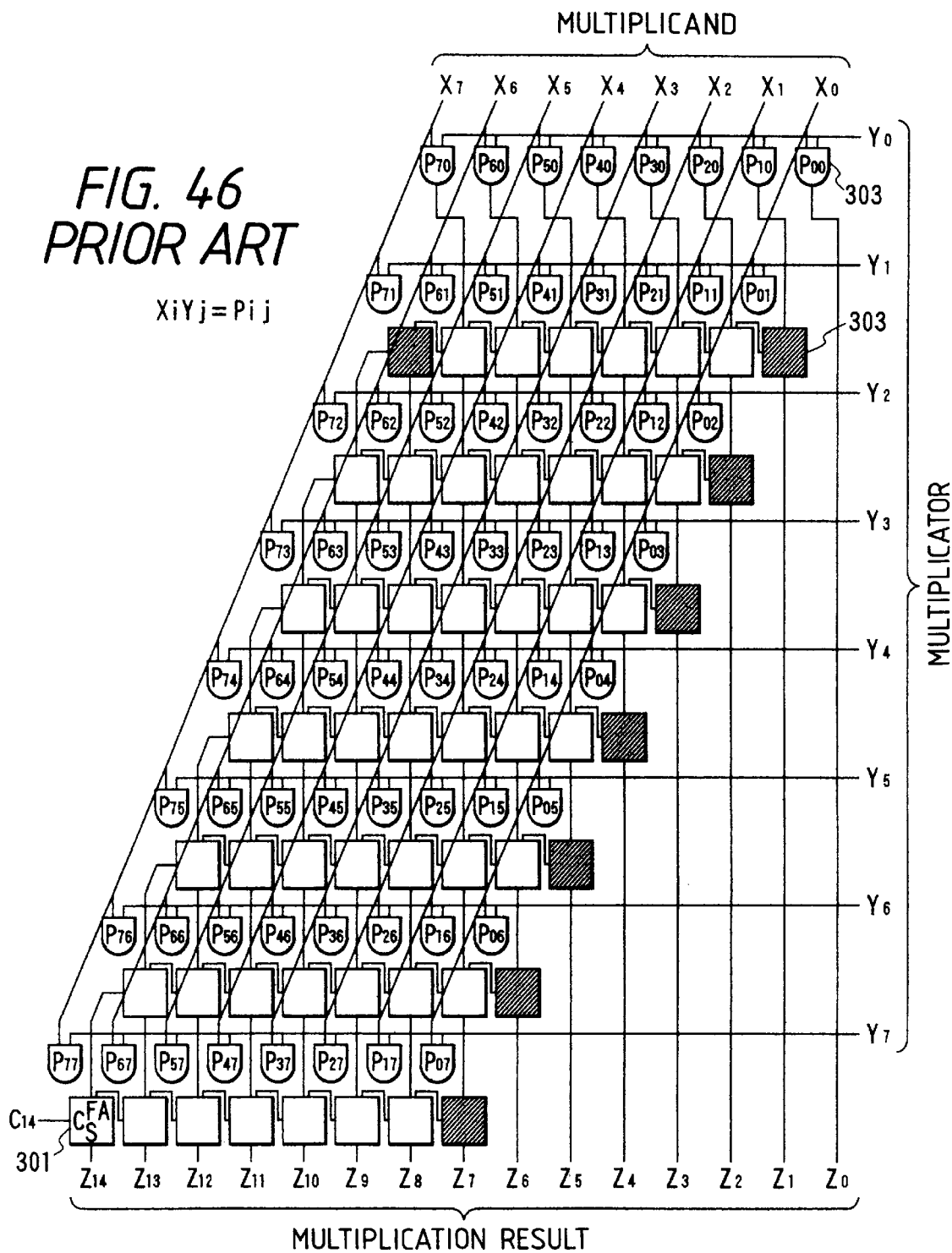
FIG. 46 is a drawing illustrating an example of a configuration of a conventional multiplier.

Although the SS communication has excellent features of high performance of call privacy and noise protection because signals are converted to multiple bit codes before they are transmitted, it has a problem that tremendous loads are imposed on actual signal processing since it requires repetition of additions in an addition circuit as shown in FIG. 45 to detect highly correlative states by comparing the received signals with PN codes due to an increase of the amount of transmitted information.

By performing these additions in the processors according to the above embodiment, however, it is possible to form an SS communication reception circuit with less elements and low power consumption as well as high operation speed. Accordingly, it is possible to generate a portable information device for radio communication in the SS communication system.

Figure 40:
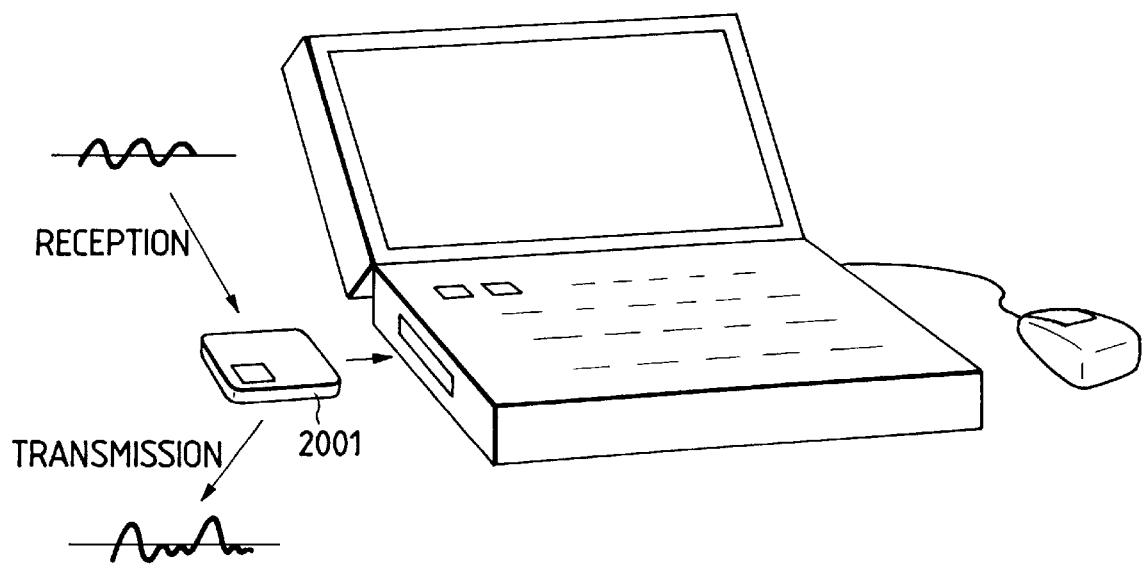
FIG. 40 is a drawing illustrating a card-typed transmission/reception unit of the 22nd embodiment.
Figure 42A:
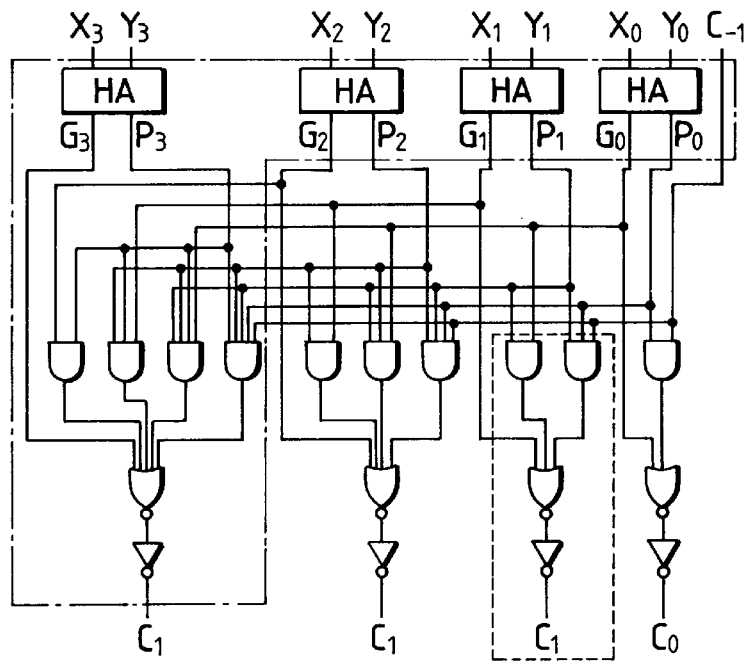
FIGS. 42A to 42C are drawings for explanation of a conventional CLA circuit.
Figure 42B:
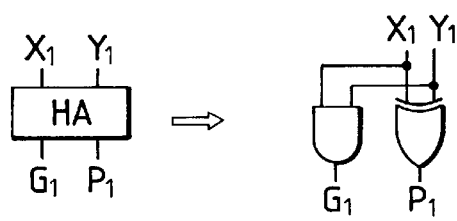
Figure 42C:
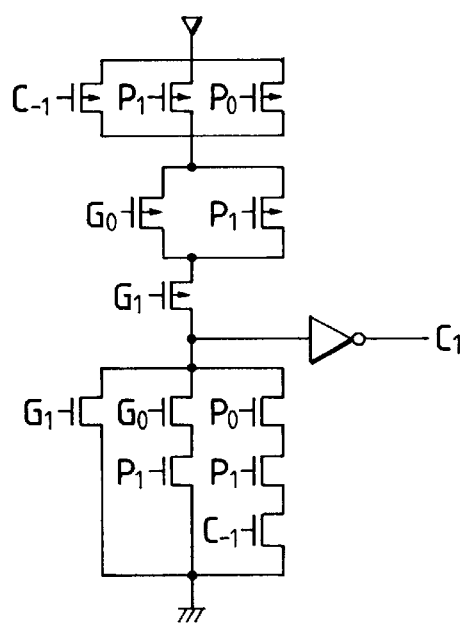
Figure 43:
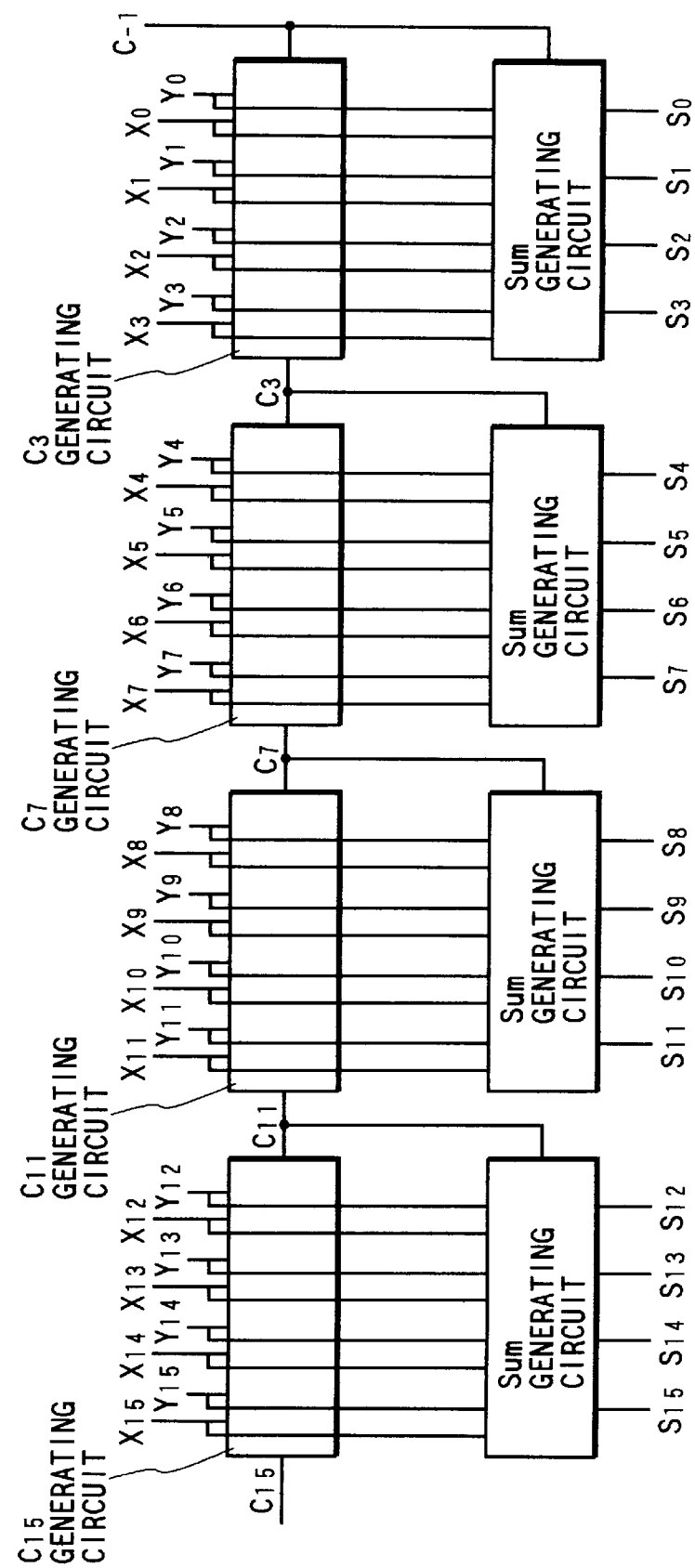
FIG. 43 is a drawing illustrating an example of a configuration of a conventional adder to which block CLA is applied.
Figure 44:
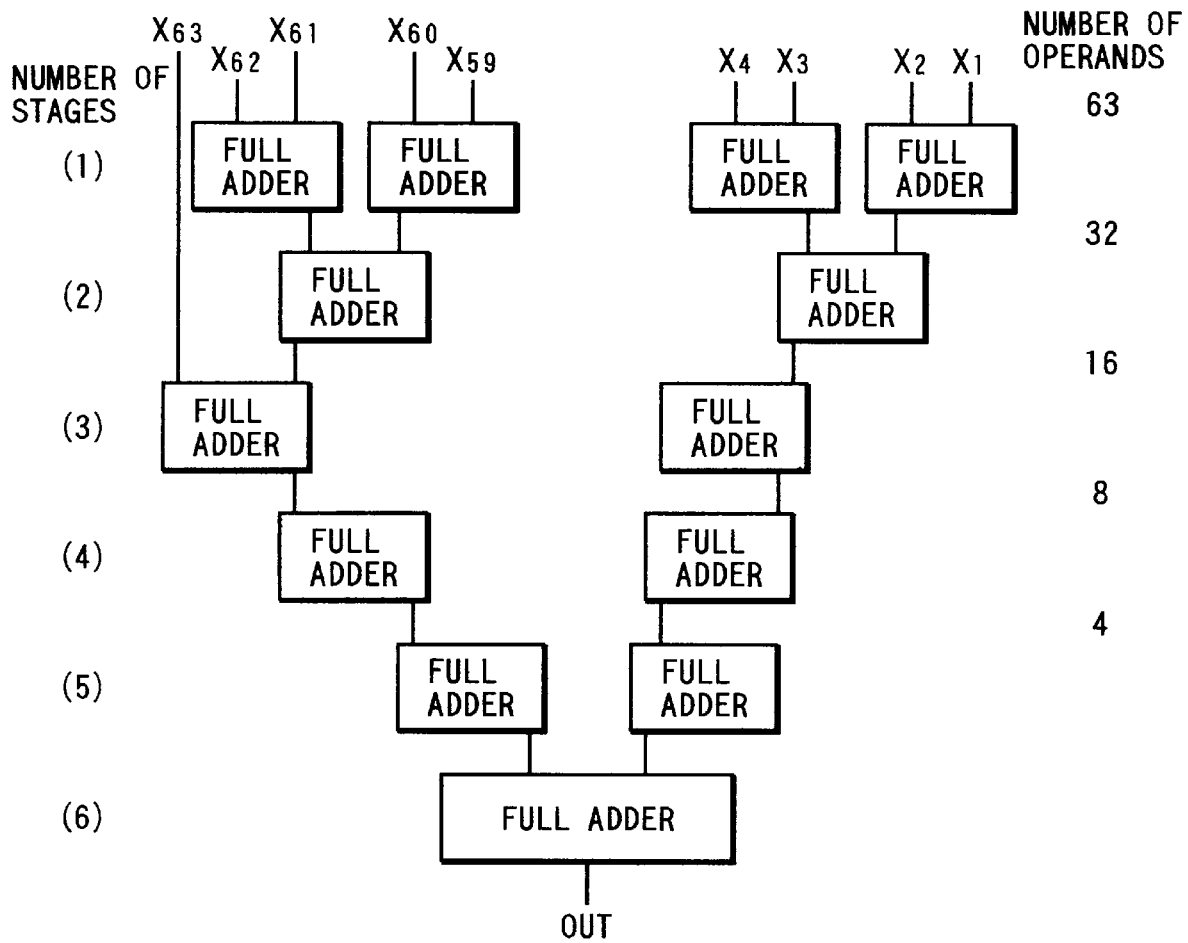
FIG. 44 is a drawing illustrating an example of a configuration of a conventional adder.

Furthermore, a compact card-typed reception/transmission unit 2001 as shown in FIG. 40 can be generated since the higher operation speed makes it possible to have communication with a large amount of information with less elements and low power consumption. Therefore, it becomes easier to apply the SS communication to a PCMCIA card having an interface of a conventional personal computer. Although a PCMCIA card is used in this example, this invention can be easily applied to other interfaces. The inputs and outputs are CMOS-compatible as usual, therefore, downsizing and lower power consumption can be easily achieved by the above processor.

Although the description is made by giving an example of a data processor for the SS communication, the input-output interface is CMOS-compatible as mentioned above, and this invention can be applied to other data processors for adding plurality of multiple bit data, particularly including a negative value, for example, DSPs or CPUs mentioned above or a parallel operation processing unit for processing images or voices. In addition, it can be also used for a statistical processing for obtaining averages or standard deviation and a numeric operation such as a least squares method.

Furthermore, it is effective to improve various systems such as a wireless LAN, an I/O management system, an accounting system, and a video conference system significantly due to the merits of the higher operation speed, downsizing, and lower power consumption.

According to the embodiment mentioned above, a plurality of multiple bit data can be added at a high speed.

In addition, a plurality of multiple bit data including a negative value can be added at a high speed.

Further, a plurality of multiple bit data can be multiplied at a high speed.

Still further, a processor for operating a plurality of multiple bit data at a high speed can be formed in a small chip area by using a semiconductor device with low power consumption.

The processor can be applied to various data processors since it can be generated in a general semiconductor process, and therefore, it is possible to generate data processors such as DSPs, CPUs, and reception/transmission units for the SS communication as devices with high operation speed and low power consumption having small chip areas.

Although the present invention has been described in its preferred form with a certain degree of particularity, many apparently widely different embodiments of the invention can be made without departing from the spirit and the scope thereof. It is to be understood that the invention is not limited to the specific embodiments hereof except as defined in the appended claims.

What is claimed is:

1. A processor for adding together a plurality of binary values each having multiple bits comprising:
    number detection means for detecting the number of bits having value 1 from the plurality of binary values with respect to each bit place in multiple bits by determining whether or not the number is less than each of a plurality of predetermined values, respectively and outputting the detected number in binary representation as an addition result for each bit place; and
    addition means for calculating a sum of the addition result output from said number detection means.

2. A processor according to claim 1, wherein said number detection means detects the number of bits having value 1 on respective places in multiple bits individually for the plurality of binary values.

3. A processor according to claim 1, wherein said number detection means detects the number of bits having value 1 on a plurality of places in multiple bits for the plurality of binary values.

4. A processor according to claim 1, wherein said addition means combines a plurality of addition results with no common places out of the addition results of said first addition means into a single value to be added in an additive operation by said addition means.

5. A processor according to claim 1, wherein said number detection means detects the number of bits having value 1 on respective places in multiple bits of the plurality of binary values in parallel.

6. A processor according to claim 5, further comprising second number detection means for detecting the number of bits having value 1 from the number in binary representation detected by said detection means.

7. A processor according to claim 1, wherein the plurality of binary values include a flag bit representing a sign and said number detection means detects the number of bits having value 1 on respective places in multiple bits including the flag bit individually.

8. A processor according to claim 7, wherein the plurality of binary values include a negative value represented by a 1's complement.

9. A processor according to claim 7, wherein said plurality of multiple bit data include a negative value represented by a 1's complement.

10. A processor according to claim 1, wherein said addition means integrates data on nth ($n \geq 0$) place counted from each place in the addition results of different places output from said number detection means into single value in an additive operation by said addition means.

11. A processor according to claim 10, wherein said nth place corresponds to the most significant place of the addition results of respective places.

12. a processor according to claim 11, wherein said number detection means outputs addition results from the most significant place sequentially.

13. A processor according to claim 1, wherein said addition means integrates data on the nth ($n \geq 0$) place counted from each place in the addition results for each place output from said number detection means.

14. A processor according to claim 1, wherein said addition means executes an addition by using addition results for partial places already obtained by said number detection means in parallel with an addition for other partial places to be executed by said number detection means.

15. A processor according to claim 14, wherein said addition means adds addition results each other obtained by said number detection means.

16. A processor according to claim 14, wherein said addition means adds addition results obtained by said first addition means to results of addition already executed by said addition means.

17. A processor according to claim 1, wherein said number detection means detects whether or not the number accords to each of a plurality of predetermined values, respectively.

18. A processor for adding together a plurality of binary values each having multiple bits comprising:
    number detection means for detecting the number of bits having value 1 from the plurality of binary values with respect to each bit place in multiple bits by determining whether or not the number accords to a predetermined value and outputting the detected number in binary representation as an addition result for each bit place; and
    addition means for calculating a sum of the addition result output from said number detection means,
    wherein said number detection means detects the number of bits having value 1 on respective places in multiple bits of the plurality of binary values in parallel, and
    wherein said number detection means includes a plurality of majority logic operation means.

19. A processor according to claim 18, wherein at least one of said plurality of majority logic operation means includes a plurality of input terminals for receiving respective bits of the plurality of binary values, a plurality of capacitor means connected via said plurality of input terminals and switch means, and a sense amplifier to which said plurality of capacitor means are connected in common, said sense amplifier providing an output of said at least one of said majority logic means.

20. A processor according to claim 19, wherein at least one of said capacitor means has a capacitance that equals an integer times a predetermined capacitance.

21. A processor according to claim 19, wherein outputs from said sense amplifier are entered into at least one said plurality of input terminals with a feedback.

22. A processor according to claim 19, wherein outputs from said sense amplifier are connected to at least one said plurality of input terminals via latch means.

23. A processor according to claim 18, wherein at least one of said plurality of majority logic operation means receives values of bits in a specific place of the plurality of binary values and a constant value as inputs.

24. A processor according to claim 18, wherein at least one of said plurality of majority logic operation means receives output of another one of said plurality of majority logic operation means and a constant value as inputs.

25. A processor for multiplying by each other a plurality of binary values each having multiple bits, comprising:

partial product generation means for generating partial products of the plurality of binary values;

number detection means for detecting the number of bits having value 1 from a plurality of partial products generated by said partial product generation means, with respect to each bit place in multiple bits of the partial products by determining whether or not the number is less than each of a plurality of predetermined values, respectively and outputting the detected number in binary representation as an addition result for each bit place to add the partial products on respective places individually; and addition means for calculating a sum of the addition results output from said number detection means.

26. A processor according to claim 25, wherein said partial product generation means generates partial products of respective bits of first binary value and a specific bit of second binary value simultaneously.

27. A processor according to claim 25, wherein said partial product generation means comprises input means for entering respective bits of the first binary value in parallel; and switch means for setting on or off for inputs from said input means according to a value of each bit of the second binary value.

28. A processor according to claim 25, wherein said partial product generation means includes a plurality of transistors whose gate electrodes are connected in common.

29. A processor according to claim 25, wherein said partial product generation means includes a plurality of AND circuits.

30. A processor according to claim 25, wherein said addition means integrates data on the nth ($n \geq 0$) place counted from each place int he addition results of different places output from said first addition means into single value in an additive operation by said addition means.

31. A processor according to claim 25, wherein said addition means executes an addition by using addition results for partial places already obtained by said number detection means in parallel with an addition for other partial places to be executed by said number detection means.

32. An operation method of adding together a plurality of binary values each having multiple bits comprising the steps of:

detecting the number of bits having value 1 from the plurality of binary values with respect to each bit place in multiple bits by determining whether or not the number is less than each of a plurality of predetermined values, respectively;

outputting the detected number in binary representation as an addition result for each bit place; and calculating a sum of the addition results output in said outputting step.

33. An operation method according to claim 32, wherein a plurality of addition results with no common places are integrated out of the addition results outputting step, in said calculating step before being added.

34. An operation method according to claim 32, wherein the plurality of binary values include a flag bit representing a sign and, in said detecting step, the number of bits having value 1 is detected on respective places in multiple bits including the flag bit individually.

35. An operation method according to claim 32, wherein, in said calculating step, data is integrated on the nth ($n \geq 0$) place counted form each place in the addition results of different places output in said outputting step into single data before being added.

36. An operation according to claim 32, wherein an addition in said calculating step is executed by using addition results for partial places already output in said outputting step in parallel with an addition for other partial places to be executed in said detecting step.

37. An operation method of multiplying by each other a plurality of binary values each having multiple bits, comprising the steps of:

generating partial products of the plurality of binary values;

detecting the number of bits having value 1 from a plurality of partial products generated in said generating step, with respect to each bit place in multiple bit of the partial products by determining whether or not the number is less than each of a plurality of predetermined values, respectively;

outputting the detected number in binary representation as an addition result for each bit place; and calculating a sum of the addition results output in said outputting step.

38. an operation method according to claim 37, wherein, in said calculating step, a plurality of addition results with no common places are integrated into single data out of the addition results generated output in said detecting step before being added.

39. An operation method according to claim 37, wherein, in said calculating step, data is integrated on the nth ($n \geq 0$) place counted from each place in the addition results of different places output in said outputting step into single data before being added.

40. An operation method according to claim 37, wherein an addition in said calculating step is executed by using addition results for partial places already obtained in said detecting step in parallel with an addition for other partial places to be executed ins aid detecting step.

41. A data processor comprising:

input means for entering data;

storing means for storing data;

processing means for processing data stored by said storing means and data entered from said input means in a given processing procedure; and output means for outputting processing results form said processing means, wherein said processing means comprises number detection means for detecting the number of bits having value 1 from a plurality of binary value data with respect to each bit place in multiple bits by determining whether or not the number is less than each of a plurality of predetermined values, respectively at a time and outputting the detected number in binary representation as an addition result for each bit place, and addition means for calculating a sum of the addition results output from said number detection means.

42. A data processor according to claim 41, said processing means further comprising partial product generation means for generating partial products of a plurality of binary values, wherein partial products generated by said partial product generation means are added by using said number detection means and said addition means.

43. A data processor according to claim 41, wherein said input means enters signals, said storing means stores weighting factors, and said processing means multiplies the entered signals by respective weighting factors for accumulation.

44. A data processor according to claim 41, wherein said input means enters multiple bit signs, said storing means previously stores multiple bit signs, and said processing means calculates a correlation amount between the entered multiple bit signs and the stored multiple bit signs and demodulates multiple bit signs entered on the basis of the calculated correlation amount.

* * * * *

UNITED STATES PATENT AND TRADEMARK OFFICE
CERTIFICATE OF CORRECTION

PATENT NO. : 5,978,827

DATED : November 2, 1999

INVENTOR(S) : TAKESHI ICHIKAWA

It is certified that error appears in the above-identified patent and that said Letters Patent is hereby corrected as shown below:

ON THE TITLE PAGE [30]:

Foreign Application Priority Data, insert

--[30] Foreign Application Priority Data
          April 11, 1995 [JP] Japan 7-85255
          April 11, 1996 [JP] Japan 8-089541--.

ON THE TITLE PAGE [56] References Cited:

OTHER PUBLICATIONS, "Loss" should read --Los--.

COLUMN 1:

Line 16, "More" should read --The more--;
    Line 17, "this" should read --the more this--;
    Line 57, "adders." should read --adder.--; and
    Line 59, "circuitry" should read --types of circuitry--.

COLUMN 2:

Line 58, "each" should read --to each--.

COLUMN 4:

Line 11, "multiply" should read --multiplying--; and
    Line 29, "execute" should read --executing--.

UNITED STATES PATENT AND TRADEMARK OFFICE
CERTIFICATE OF CORRECTION

PATENT NO.  : 5,978,827

DATED       : November 2, 1999

INVENTOR(S) : TAKESHI ICHIKAWA

It is certified that error appears in the above-identified patent and that said Letters Patent is hereby corrected as shown below:

COLUMN 5:

Line 54, "21th" should read --21st--.

COLUMN 7:

Line 65, "having a" should read --having--.

COLUMN 9:

Line 20, "takes log twice" should read --runs slowly--.

COLUMN 12:

Line 3, "typed" should read --type--.

COLUMN 13:

Line 35, "Other" should read --Otherwise, its--.

COLUMN 14:

Line 12, "bath" should read --batch--; and
    Line 14, "Other" should read --Otherwise, the--.

COLUMN 16:

Line 43, "is" should read --1s--.

UNITED STATES PATENT AND TRADEMARK OFFICE
CERTIFICATE OF CORRECTION

PATENT NO.   :   5,978,827

DATED        :   November 2, 1999

INVENTOR(S)  :   TAKESHI ICHIKAWA

It is certified that error appears in the above-identified patent and that said Letters Patent is hereby corrected as shown below:

COLUMN 18:

Line 5, "●" should read --L--.
Line 57, "$Y_0$" should read --$Y_0$).--.

COLUMN 21:

Line 34, "is" should read --are--; and
Line 38, "by" should be deleted.

COLUMN 23:

Line 2, "outputs" should read --output--; and
Line 62, "each" should read --from each--.

COLUMN 24:

Line 55, "$X_{zy4}$" should read --$X_3Y_4$--.

COLUMN 29:

Line 42, "a" should be deleted; and
Line 43 should read --possible values for the number, respectively, detecting the maximum value from among numbers determined not to be more than the detected number, and--.

COLUMN 30:

Line 34, "adds addition results each other obtained" should read --adds to each other addition results obtained--.

UNITED STATES PATENT AND TRADEMARK OFFICE
CERTIFICATE OF CORRECTION

PATENT NO. : 5,978,827

DATED : November 2, 1999

INVENTOR(S) : TAKESHI ICHIKAWA

It is certified that error appears in the above-identified patent and that said Letters Patent is hereby corrected as shown below:

COLUMN 31:

Line 28, "a plurality of predetermined" should be deleted;
    Line 29, "values, respectively" should read --possible values for the number, respectively, detecting the maximum value from among values determined not to be more than the detected number,--; and
    Line 54, "int he" should read --in the--.

COLUMN 32:

Line 2, "a plurality of predetermined" should be deleted;
    Line 3, "values, respectively;" should read --possible values for the number, respectively, detecting the maximum value from among values determined not to be more than the detected number;--;
    Line 19, "form" should read --from--;
    Line 36, "a plurality of predeter-" should be deleted;
    Line 37, "mined values, respectively;" should read --possible values for the number, respectively, and detecting the maximum value from among values determined not to be more than the detected number;--
    Line 46, "generated" should be deleted;
    Line 57, "ins aid" should read --in said--; and
    Line 64, "form" should read --from--.

UNITED STATES PATENT AND TRADEMARK OFFICE
CERTIFICATE OF CORRECTION

PATENT NO.    : 5,978,827
DATED         : November 2, 1999
INVENTOR(S)   : TAKESHI ICHIKAWA It is certified that error appears in the above-identified patent and that said Letters Patent is hereby corrected as shown below:

COLUMN 33:

Line 5, "a plurality of predetermined values, respec-" should be deleted.

Line 6, "tively at a time" should read --possible values for the number, respectively, at a time, detecting the maximum value from among values determined not to be more than the detected number,--.

Signed and Sealed this

Twelfth Day of December, 2000

Attest:

Q. TODD DICKINSON

Attesting Officer

Director of Patents and Trademarks